(12) United States Patent
Kawashima et al.

(10) Patent No.: US 12,166,103 B2
(45) Date of Patent: Dec. 10, 2024

(54) SEMICONDUCTOR DEVICE FOR POWER AMPLIFICATION

(71) Applicant: Nuvoton Technology Corporation Japan, Kyoto (JP)

(72) Inventors: Katsuhiko Kawashima, Hyogo (JP); Yusuke Kanda, Toyama (JP); Kenichi Miyajima, Toyama (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 0 days.

(21) Appl. No.: 17/924,642

(22) PCT Filed: May 12, 2021

(86) PCT No.: PCT/JP2021/018033
§ 371 (c)(1),
(2) Date: Nov. 10, 2022

(87) PCT Pub. No.: WO2021/230283
PCT Pub. Date: Nov. 18, 2021

(65) Prior Publication Data
US 2023/0187529 A1 Jun. 15, 2023

(30) Foreign Application Priority Data
May 13, 2020 (JP) ................. 2020-084418

(51) Int. Cl.
*H01L 29/778* (2006.01)
*H01L 29/20* (2006.01)
(Continued)

(52) U.S. Cl.
CPC .... *H01L 29/66462* (2013.01); *H01L 29/2003* (2013.01); *H01L 29/404* (2013.01);
(Continued)

(58) Field of Classification Search
None
See application file for complete search history.

(56) References Cited

U.S. PATENT DOCUMENTS

2006/0043415 A1  3/2006  Okamoto et al.
2006/0060895 A1* 3/2006  Hikita ................. H01L 29/7787
                                                              257/280
(Continued)

FOREIGN PATENT DOCUMENTS

JP  2004-200248 A  7/2004
JP  2004-214471 A  7/2004
(Continued)

OTHER PUBLICATIONS

International Search Report issued in International Patent Application No. PCT/JP2021/018033, dated Aug. 3, 2021, with English translation.

(Continued)

*Primary Examiner* — Grant S Withers
(74) *Attorney, Agent, or Firm* — Rimon P.C.

(57) ABSTRACT

A semiconductor device for power amplification includes: a source electrode, a drain electrode, and a gate electrode disposed above a semiconductor stack structure including a first nitride semiconductor layer and a second nitride semiconductor layer; and a source field plate that is disposed above the semiconductor stack structure between the gate electrode and the drain electrode, and has a same potential as a potential of the source electrode. The source field plate has a staircase shape, and even when length LF2 of an upper section is increased for electric field relaxation, an increase in parasitic capacitance Cds generated between the source field plate and a 2DEG surface is inhibited.

15 Claims, 92 Drawing Sheets

(51) Int. Cl.
*H01L 29/40* (2006.01)
*H01L 29/417* (2006.01)
*H01L 29/423* (2006.01)
*H01L 29/66* (2006.01)

(52) U.S. Cl.
CPC .... *H01L 29/41725* (2013.01); *H01L 29/4232* (2013.01); *H01L 29/7786* (2013.01); *H01L 29/7787* (2013.01)

(56) References Cited

U.S. PATENT DOCUMENTS

| | | |
|---|---|---|
| 2006/0102929 A1 | 5/2006 | Okamoto et al. |
| 2008/0023727 A1 | 1/2008 | Hoshi et al. |
| 2009/0108299 A1* | 4/2009 | Smorchkova ....... H01L 29/7783 257/E21.403 |
| 2010/0224910 A1 | 9/2010 | Ando et al. |
| 2012/0217547 A1 | 8/2012 | Ando et al. |
| 2014/0091424 A1 | 4/2014 | Makiyama |
| 2014/0353673 A1 | 12/2014 | Ito et al. |
| 2015/0060946 A1 | 3/2015 | Makiyama |
| 2015/0194483 A1 | 7/2015 | Kajitani et al. |
| 2015/0270355 A1 | 9/2015 | Kuraguchi et al. |
| 2015/0279722 A1 | 10/2015 | Kikuchi |
| 2017/0222032 A1* | 8/2017 | Liu .............. H01L 29/4966 |
| 2019/0123152 A1 | 4/2019 | Yamada |
| 2019/0280092 A1* | 9/2019 | Lin ............... H01L 29/408 |
| 2020/0052103 A1* | 2/2020 | Tao ................ H01L 29/7787 |
| 2020/0227530 A1* | 7/2020 | Kumazaki ......... H01L 29/205 |
| 2021/0043744 A1 | 2/2021 | Takeuchi |
| 2021/0175350 A1* | 6/2021 | Iucolano ........... H01L 29/7786 |

FOREIGN PATENT DOCUMENTS

| | | |
|---|---|---|
| JP | 2008-034522 A | 2/2008 |
| JP | 2009-105405 A | 5/2009 |
| JP | 2010-278150 A | 12/2010 |
| JP | 2011-249828 A | 12/2011 |
| JP | 2014-072391 A | 4/2014 |
| JP | 2014-236011 A | 12/2014 |
| JP | 2015-046445 A | 3/2015 |
| JP | 2015-170821 A | 9/2015 |
| JP | 2015-179786 A | 10/2015 |
| JP | 2015-195288 A | 11/2015 |
| WO | 2007/122800 A1 | 11/2007 |
| WO | 2014/050054 A1 | 4/2014 |
| WO | 2019/176434 A1 | 9/2019 |

OTHER PUBLICATIONS

International Preliminary Report On Patentability issued in International Patent Application No. PCT/JP2021/018033, dated Apr. 19, 2022, with English translation.
Japanese Office Action mailed on Nov. 1, 2022 issued for the corresponding Japanese Patent Application No. 2022-522175, with English translation.
Japanese Office Action mailed on Mar. 7, 2023 issued for the corresponding Japanese Patent Application No. 2022-522175, with English translation.
Extended European Search Report dated on Sep. 6, 2023 issued in corresponding European Patent Application No. 21803656.4.
Joachim Wurfl, "GaN High-Voltage Power Devices," In: "Gallium Nitride (GaN)," Oct. 16, 2015, CRC Press, XP055917858, pp. 1-44.
European Office Action dated Jun. 18, 2024 issued in the corresponding European Patent Application No. 21803656.4.

* cited by examiner

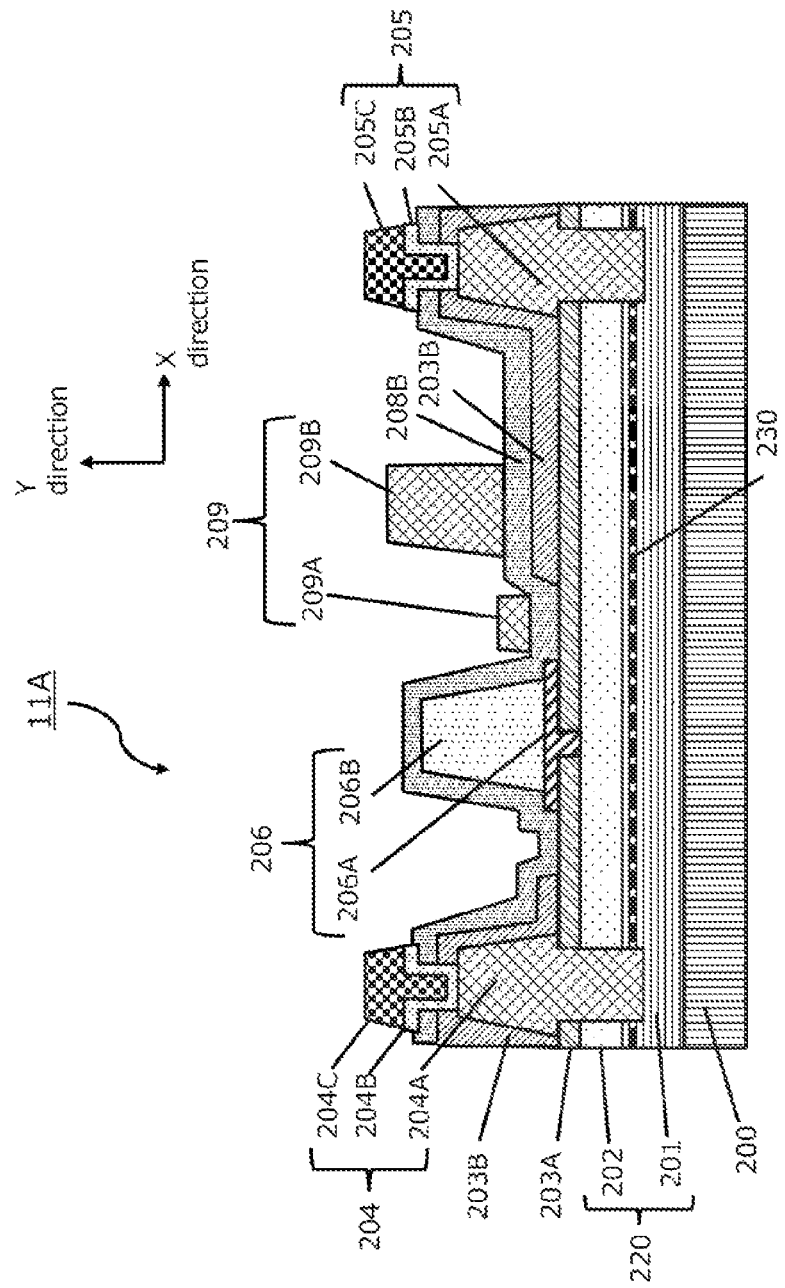

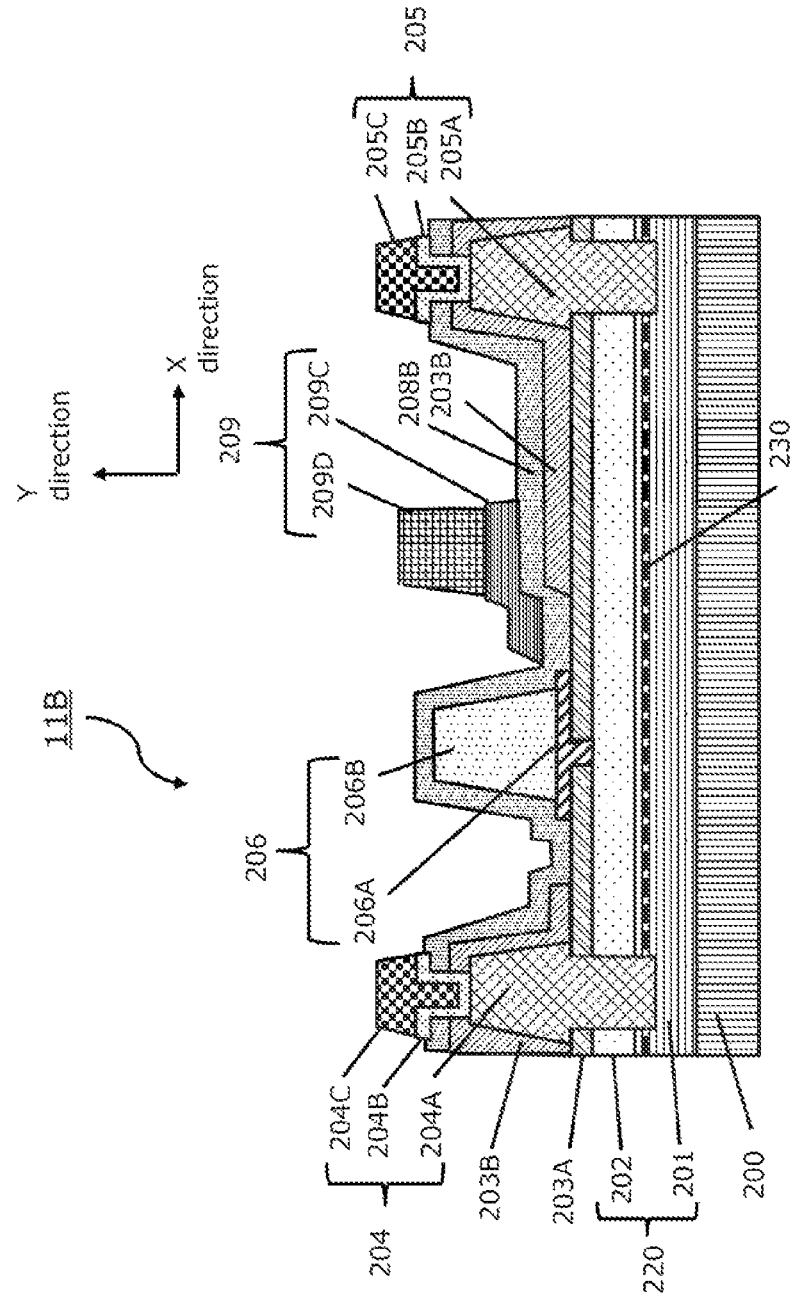

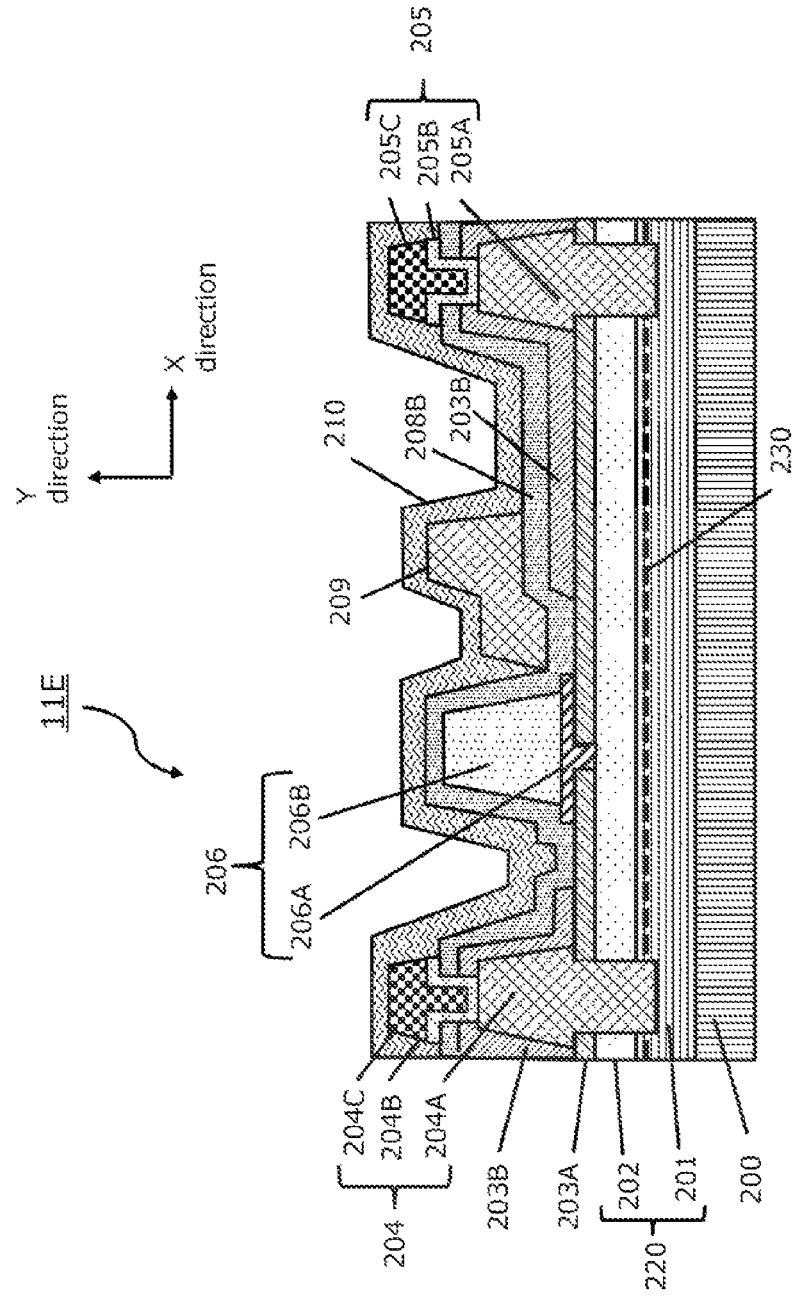

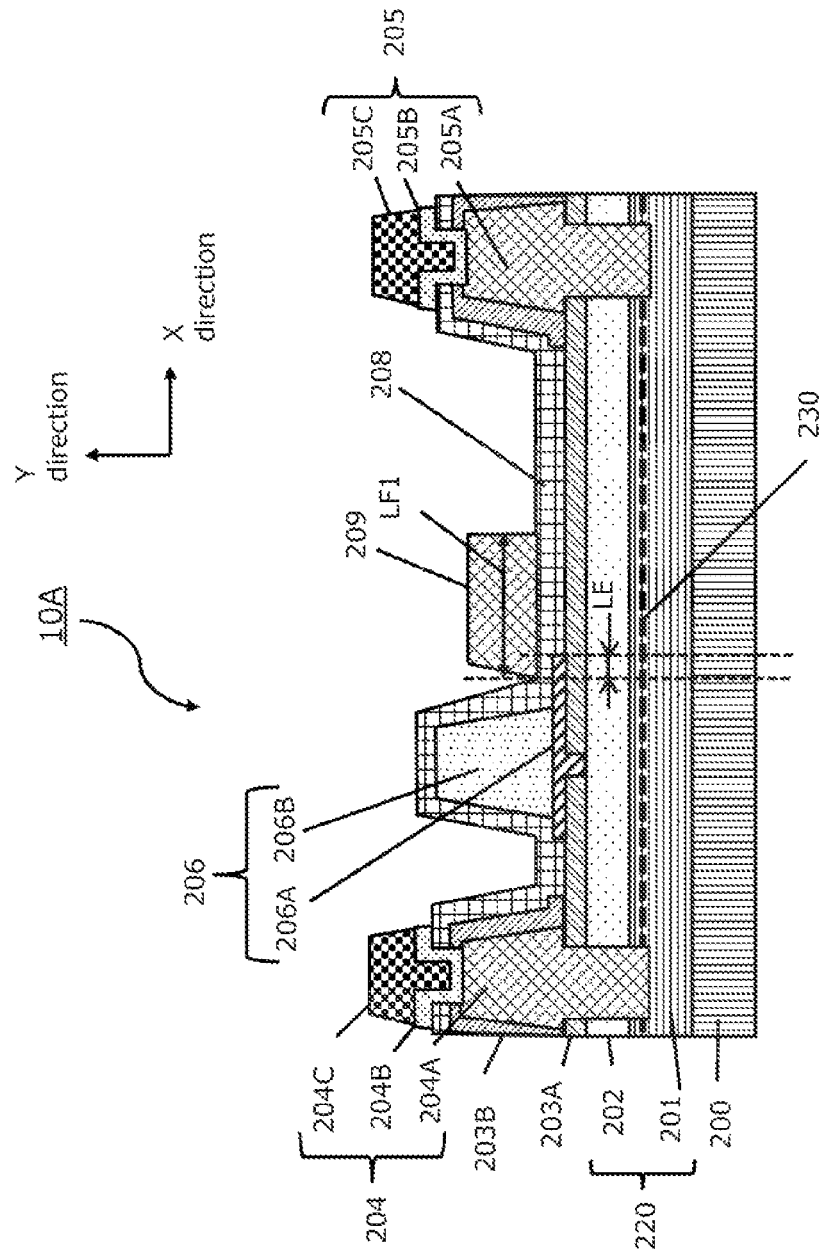

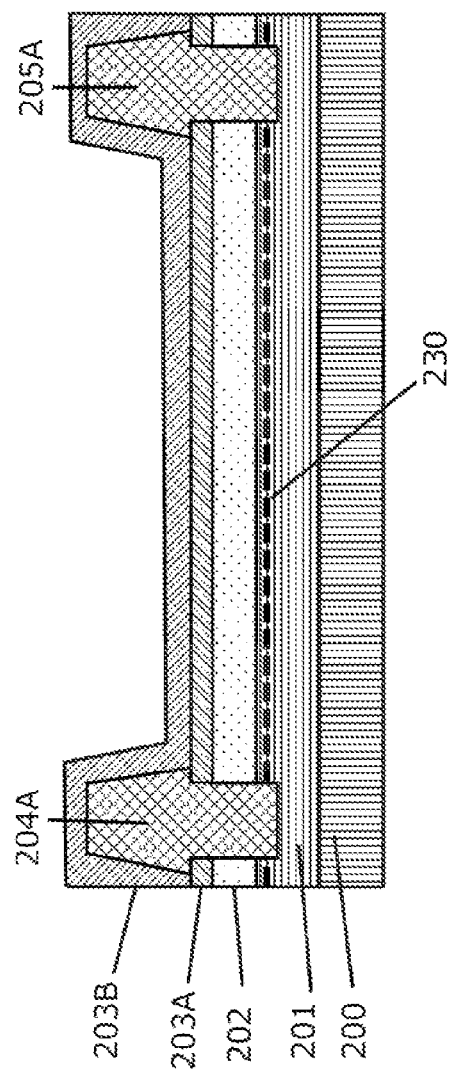

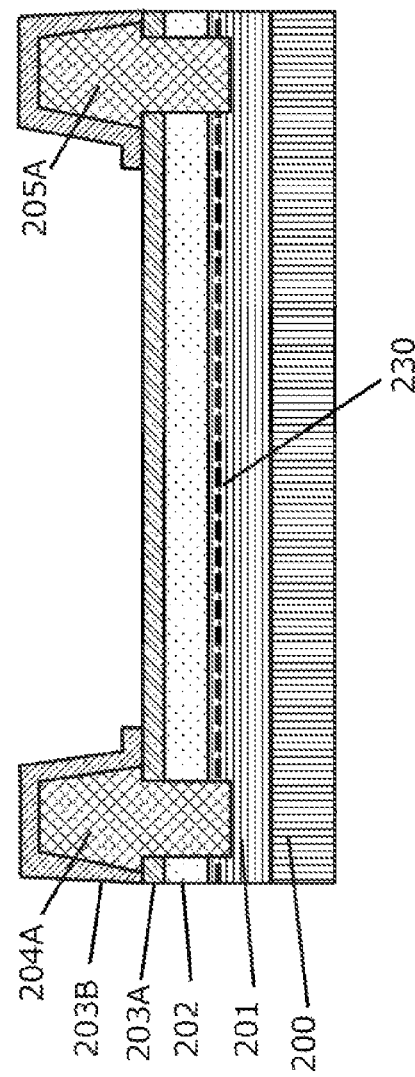

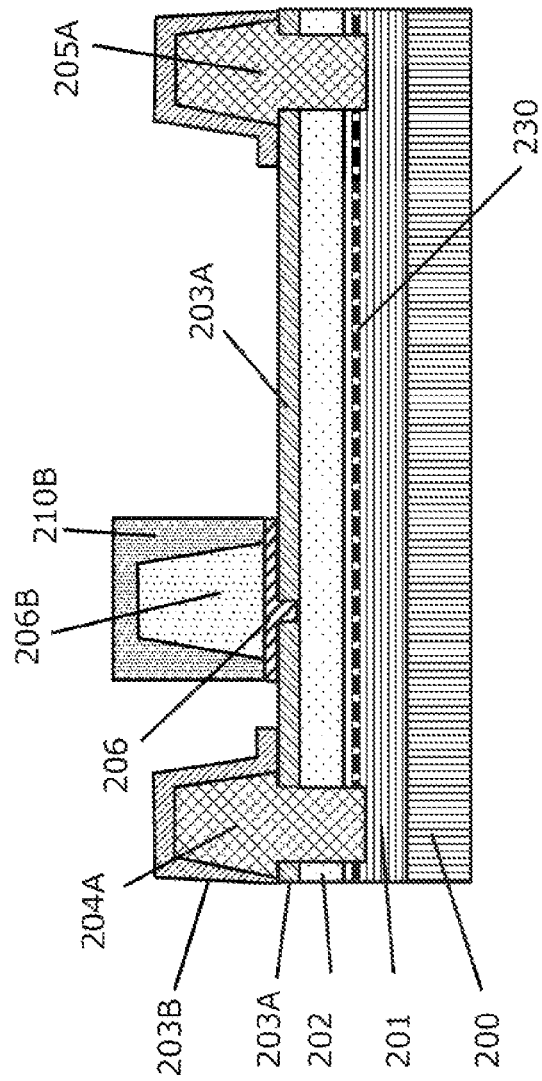

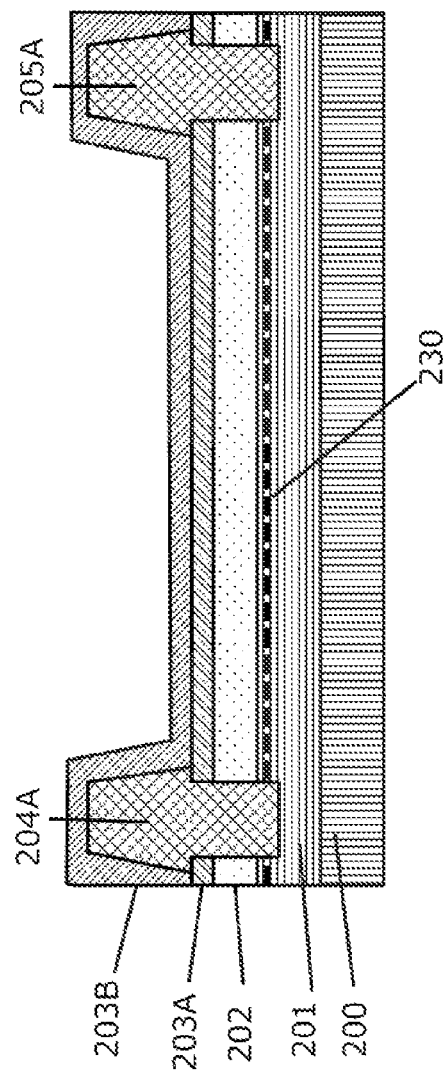

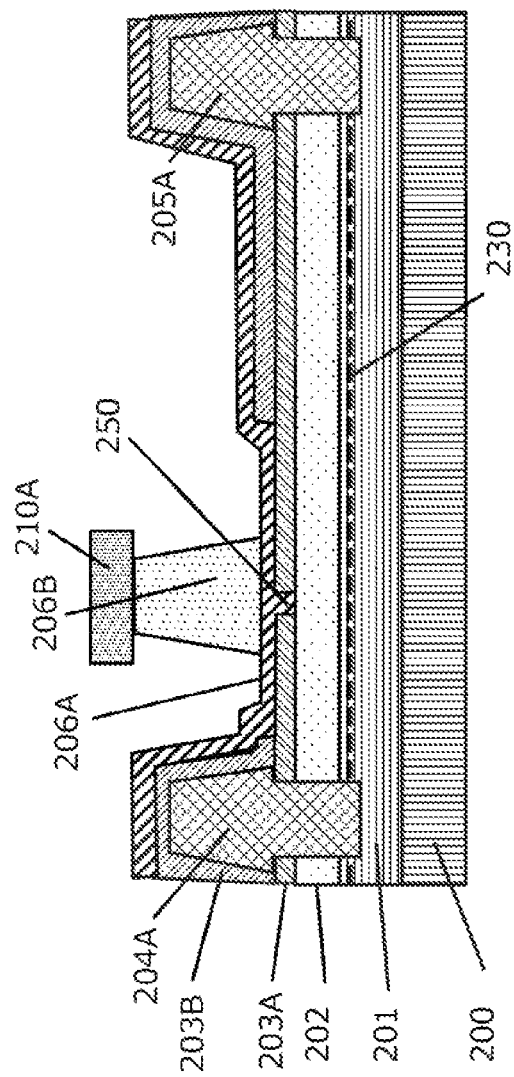

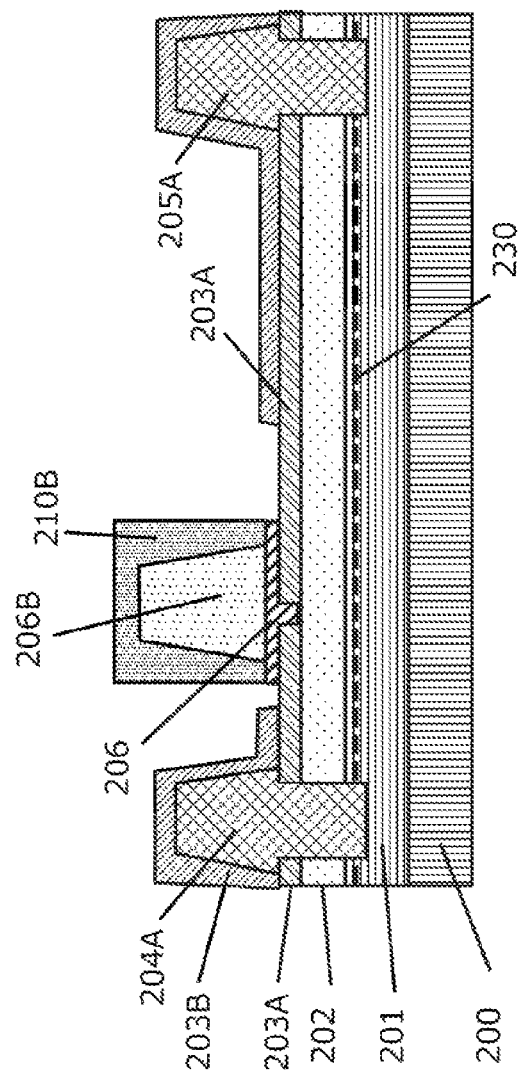

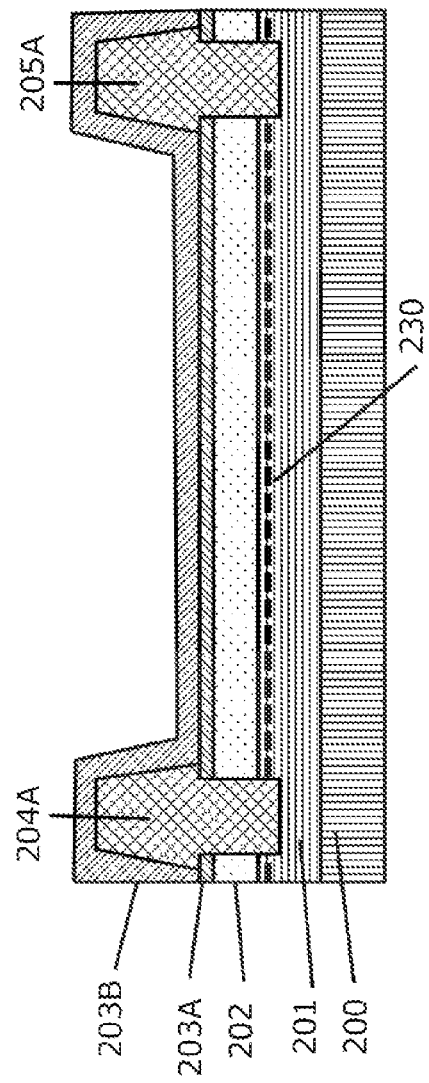

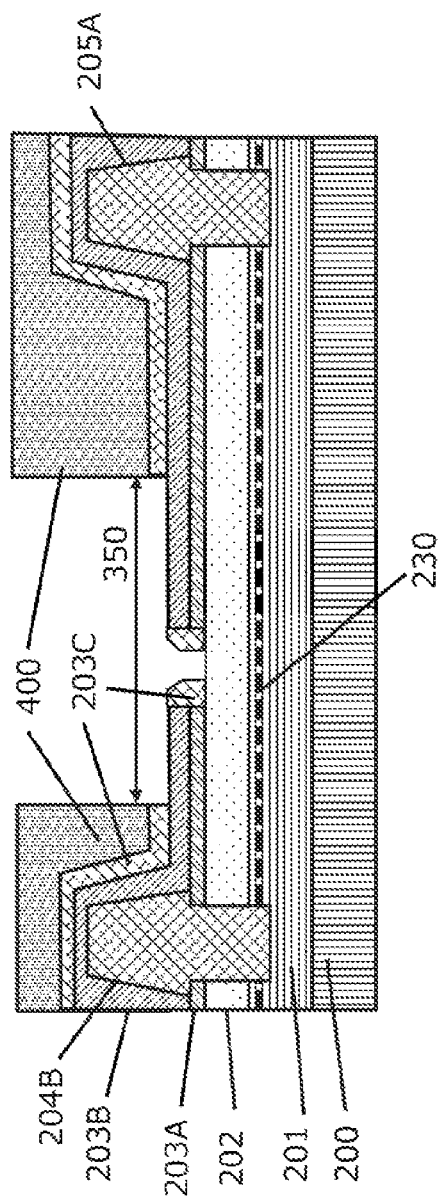

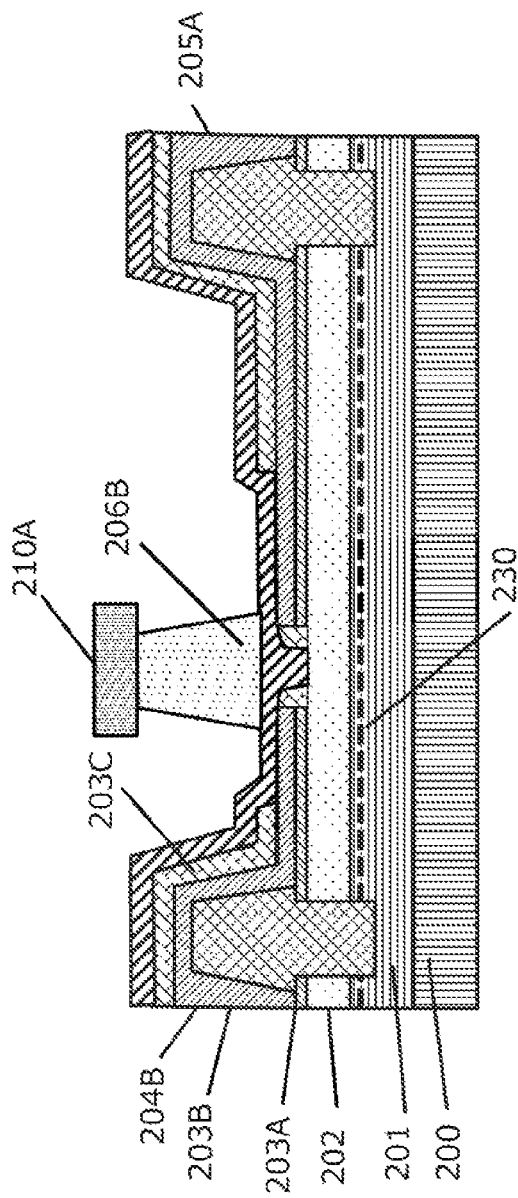

SEMICONDUCTOR DEVICE FOR POWER AMPLIFICATION

CROSS-REFERENCE OF RELATED APPLICATIONS

This application is the U.S. National Phase under 35 U.S.C. § 371 of International Patent Application No. PCT/JP2021/018033, filed on May 12, 2021, which in turn claims the benefit of Japanese Application No. 2020-084418, filed on May 13, 2020, the entire disclosures of which Applications are incorporated by reference herein.

TECHNICAL FIELD

The present disclosure relates to a semiconductor device for power amplification.

BACKGROUND ART

A field-effect transistor (hereafter also referred to as "HEMT: high electron mobility transistor") using heterojunction gallium nitride (GaN) has: high-speed operating characteristics due to the high mobility of the two-dimensional electron gas (hereafter also referred to as "2DEG: two dimensional electron gas") that is generated in proximity to a heterojunction interface by the piezoelectric effect; and the high breakdown voltage characteristics that utilize the feature of GaN having a relatively wide band gap, and thus is expected to be used as a semiconductor device for high power amplification for high frequency applications (power amplifier device).

One problem unique to the HEMT using GaN is the occurrence of a phenomenon, namely current collapses, in which the value of on-resistance increases after the application of high voltage compared to the value of on-resistance before the application of high voltage. The following is a brief description of the current collapses. Hot electrons generated by the high electric field between the drain electrode and the gate electrode are trapped in the trapping levels that are present inside the semiconductor, inside the insulating film disposed at an upper portion of the semiconductor, and at the interface between the semiconductor and the insulating film, which causes the trapping levels to be negatively charged. As a result, the negatively charged trapping levels are repulsive to the electrons that are the traveling carriers of the 2DEG because they have the same charge, which decreases the electron carrier concentration of the 2DEG and increases their on-resistance.

In order to inhibit current collapses in the HEMT that uses GaN, a configuration in which a field plate electrode (hereinafter referred to as a source field plate) having the same potential as a potential of the source electrode is provided between the gate electrode and the drain electrode is generally adopted. With this configuration, the electric field generated between the gate electrode and the drain electrode is dispersed by the source field plate, and the electric field generated between the gate electrode and the drain electrode is relaxed.

Patent Literature (PTL) 1 describes a configuration in which a second field plate electrode (corresponding to the source field plate of present disclosure) is disposed between the gate electrode and the drain electrode, and the first field plate electrode is disposed to be partially located under the gate electrode umbrella. According to this configuration, a drain-side edge portion of the gate electrode where the electric field becomes the highest is located closer to the drain electrode than a gate-electrode-side edge portion of the first field plate electrode that is located under the gate electrode umbrella is, and thus it is possible to cover the drain-side edge portion of the gate electrode with the first field plate electrode from below. According to the above-described configuration, it is possible to enhance the advantageous effect of electric field relaxation.

CITATION LIST

Patent Literature

[PTL 1] International Publication No. 2014/050054

SUMMARY OF INVENTION

Technical Problem

However, with the configuration described in PTL 1, the lower surface of the first field plate electrode is located at a lower height than the bottom surface of the umbrella portion of the gate electrode, and thus is in close proximity to the semiconductor layer. For this reason, there is a problem that the parasitic capacitance generated between the 2DEG surface of the semiconductor layer and the lower surface of the first field plate electrode becomes relatively large.

In other words, since one end of the 2DEG surface is connected to the drain electrode, the parasitic capacitance generated between the 2DEG surface and the first field plate electrode is the drain-source parasitic capacitance (hereinafter referred to as Cds).

The capacitance value is proportional to the electrode area, and inversely proportional to the spacing between electrodes. With the configuration described in PTL 1, the lower surface of the first field plate electrode is in close proximity to the semiconductor layer, resulting in a narrow spacing between the electrodes and an increase in the Cds.

On the other hand, since the Cds is a parasitic capacitance that affects the power consumption of the HEMT, an increase in Cds leads to an increase in power consumption.

In view of the above, an object of the present disclosure is to provide a semiconductor device for power amplification capable of achieving both electric field relaxation by a source field plate and inhibiting the Cds.

Solution to Problem

A semiconductor device for power amplification according to one aspect of the present disclosure includes: a substrate; a first nitride semiconductor layer disposed above the substrate; a second nitride semiconductor layer disposed above the first nitride semiconductor layer, the second nitride semiconductor layer having a band gap larger than a band gap of the first nitride semiconductor layer; a first insulating layer disposed above the second nitride semiconductor layer; a source electrode and a drain electrode each disposed above the second nitride semiconductor layer, the source electrode and the drain electrode being spaced apart from each other; a gate electrode disposed above and in contact with the first insulating layer between the source electrode and the drain electrode, the gate electrode forming a Schottky junction with an upper surface of the second nitride semiconductor layer through a first opening provided in the first insulating layer; and a first source field plate disposed above the second nitride semiconductor layer between the gate electrode and the drain electrode, the first source field plate having a same potential as a potential of the source electrode. In the semiconductor device for power amplification, in a first direction that is a direction perpendicular to an upper surface of the substrate, a position of a lowermost surface of the first source field plate is identical to or above a position of an upper surface of the first insulating layer that is in contact with the gate electrode, and an upper-edge position of a side surface of the first source field plate that is in closest proximity to the gate electrode is lower than a position of an uppermost surface of the gate electrode.

Advantageous Effects of Invention

A semiconductor device for power amplification capable of achieving both electric field relaxation between the gate electrode and the drain electrode by a source field plate and inhibiting the Cds is provided.

BRIEF DESCRIPTION OF DRAWINGS

FIG. 1C is a cross-sectional view illustrating a configuration of the semiconductor device for power amplification according to Embodiment 2.

FIG. 1D is a cross-sectional view illustrating a configuration of a semiconductor device for power amplification according to Embodiment 3.

FIG. 1G is a cross-sectional view illustrating a configuration of a semiconductor device for power amplification according to Embodiment 7.

FIG. 1H is a cross-sectional view illustrating a configuration of a semiconductor device for power amplification according to Embodiment 8.

FIG. 2E is a cross-sectional view illustrating a configuration of the semiconductor device for power amplification according to Embodiment 1 in the process of manufacturing.

FIG. 2F is a cross-sectional view illustrating a configuration of the semiconductor device for power amplification according to Embodiment 1 in the process of manufacturing.

FIG. 2M is a cross-sectional view illustrating a configuration of the semiconductor device for power amplification according to Embodiment 1 in the process of manufacturing.

FIG. 2O is a cross-sectional view illustrating a configuration of the semiconductor device for power amplification according to Embodiment 1 in the process of manufacturing.

FIG. 3E is a cross-sectional view illustrating a configuration of the semiconductor device for power amplification according to Embodiment 2 in the process of manufacturing.

FIG. 3J is a cross-sectional view illustrating a configuration of the semiconductor device for power amplification according to Embodiment 2 in the process of manufacturing.

FIG. 3M is a cross-sectional view illustrating a configuration of the semiconductor device for power amplification according to Embodiment 2 in the process of manufacturing.

FIG. 3O is a cross-sectional view illustrating a configuration of the semiconductor device for power amplification according to Embodiment 2 in the process of manufacturing.

FIG. 4E is a cross-sectional view illustrating a configuration of the semiconductor device for power amplification according to Embodiment 5 in the process of manufacturing.

FIG. 4I is a cross-sectional view illustrating a configuration of the semiconductor device for power amplification according to Embodiment 5 in the process of manufacturing.

FIG. 4M is a cross-sectional view illustrating a configuration of the semiconductor device for power amplification according to Embodiment 5 in the process of manufacturing.

FIG. 4O is a cross-sectional view illustrating a configuration of the semiconductor device for power amplification according to Embodiment 5 in the process of manufacturing.

FIG. 5O is a cross-sectional view illustrating a configuration of the semiconductor device for power amplification according to Embodiment 6 in the process of manufacturing.

DESCRIPTION OF EMBODIMENTS

Embodiment 1

Figure 1A:
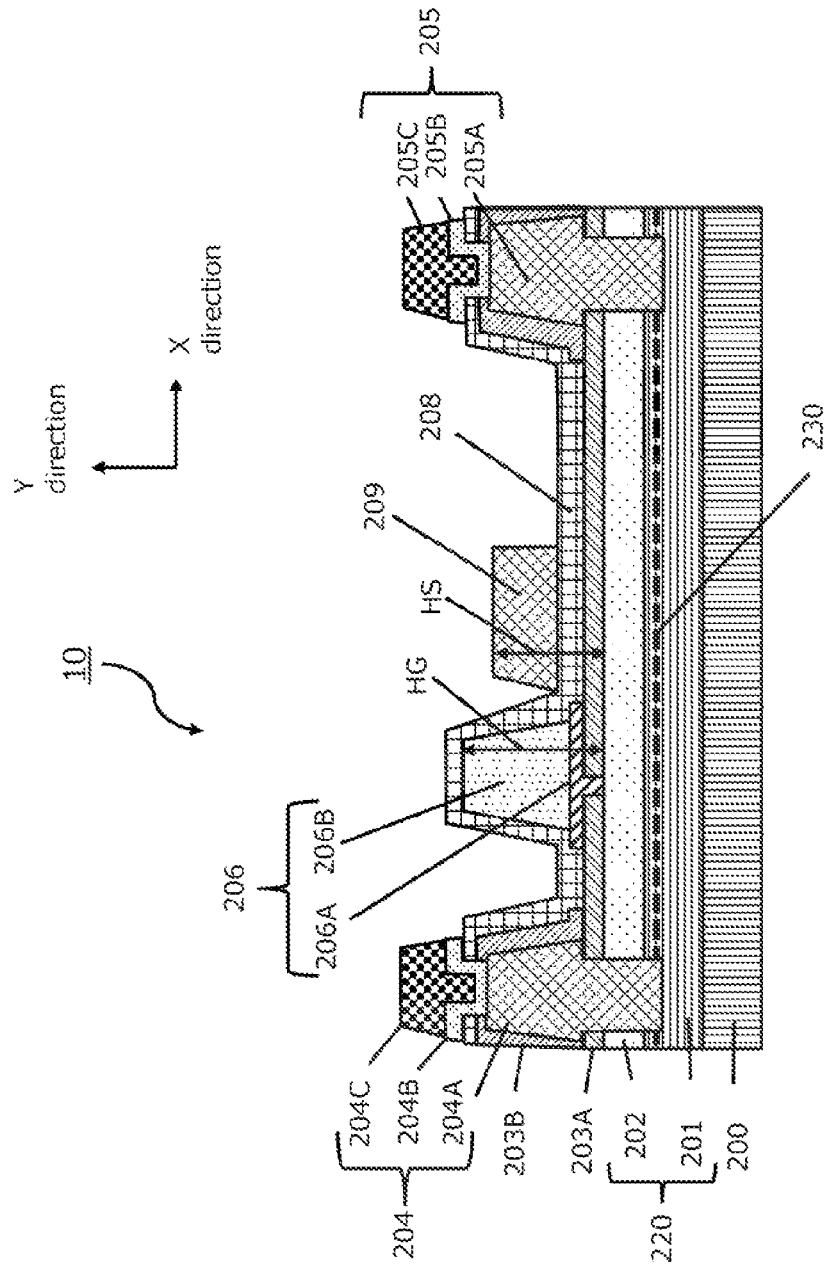
FIG. 1A is a cross-sectional view illustrating a configuration of a semiconductor device for power amplification according to Embodiment 1.

FIG. 1A is a cross-sectional view of semiconductor device for power amplification 10 illustrating a configuration of a semiconductor device for power amplification according to Embodiment 1.

As illustrated in FIG. 1A, the semiconductor device for power amplification includes: substrate 200; semiconductor stack structure 220; source electrode 204; drain electrode 205; gate electrode 206; source field plate 209; insulating film 203A; insulating film 203B; and insulating film 208.

Substrate 200 includes a buffer layer stacked on a Si substrate, for example. On the top of substrate 200, semiconductor stack structure 220 which will be described later is epitaxially grown. A SiC substrate, a sapphire substrate, or a diamond substrate may be used instead of the Si substrate. After epitaxial growth of semiconductor stack structure 220, the original Si substrate may be removed and replaced with another substrate. The buffer layer is, for example, a nitride semiconductor including a plurality of stacked structures of AlN and AlGaN. The buffer layer may also be composed of a single layer or a plurality of layers of other group III nitride semiconductors such as GaN, AlGaN, AlN, InGaN, AlInGaN, etc.

Semiconductor stack structure 220 includes: first nitride semiconductor layer 201 formed on substrate 200 and second nitride semiconductor layer 202 formed on first nitride semiconductor layer 201.

First nitride semiconductor layer 201 is a gallium nitride (GaN) channel layer that comprises GaN. First nitride semiconductor layer 201 can be configured by undoped (i-type) GaN having a thickness of 200 nm, for example. Undoped (i-type) means that an impurity is not intentionally doped during epitaxial growth. It should be noted that first nitride semiconductor layer 201 is not limited to being configured by GaN, but may be configured by a group III nitride semiconductor such as InGaN, AlGaN, AlInGaN, etc., and may also include an n-type impurity.

Second nitride semiconductor layer 202 is an aluminum gallium nitride ($Al_xGa_{1-x}N$ ($0 \leq x \leq 1$)) barrier layer that comprises $Al_xGa_{1-x}N$. Second nitride semiconductor layer 202, for example, comprises undoped (i-type) $Al_xGa_{1-x}N$ having a thickness of 20 nm and an Al composition ratio of 25%. It should be noted that second nitride semiconductor layer 202 is not limited to being configured by $Al_xGa_{1-x}N$, but may be configured by a group III nitride semiconductor such as AlN, InGaN, AlInGaN, etc., and may also comprise an n-type impurity.

In the present embodiment, the band gap of second nitride semiconductor layer 202 is larger than the band gap of first nitride semiconductor layer 201. In addition, second nitride semiconductor layer 202 that comprises undoped (i-type) $Al_xGa_{1-x}N$ and first nitride semiconductor layer 201 that comprises undoped (i-type) GaN are hetero structured. In other words, the interface between second nitride semiconductor layer 202 and first nitride semiconductor layer 201 is a heterojunction interface, and a hetero barrier is formed at the interface between second nitride semiconductor layer 202 and first nitride semiconductor layer 201.

As a result, a 2DEG is generated on the first nitride semiconductor layer 201 side of the hetero interface between second nitride semiconductor layer 202 and first nitride semiconductor layer 201, and 2DEG surface 230 is formed.

Source electrode 204 is disposed above semiconductor stack structure 220 and includes ohmic portion 204A, barrier metal portion 204B, and interconnection 204C.

Drain electrode 205 is disposed above semiconductor stack structure 220 and includes ohmic portion 205A, barrier metal portion 205B, and interconnection 205C.

Gate electrode 206 is disposed above semiconductor stack structure 220 between source electrode 204 and drain electrode 205, and includes lower layer 206A and upper layer 206B.

The above-described lower layer 206A disposed above first insulating layer 203A is referred to in general as a gate field plate.

Source field plate 209 is disposed above semiconductor stack structure 220 between gate electrode 206 and drain electrode 205 so as not to cover gate electrode 206. Source field plate 209 is provided with the same potential as the potential of source electrode 204.

In the following description, the lower surface, which is located at a lowest height, of source field plate 209 facing second nitride semiconductor layer 202 is referred to as the lowermost surface of the source field plate.

Description of Manufacturing Method

Next, the manufacturing method of semiconductor device for power amplification 10 will be described with reference to FIG. 2A to FIG. 2R.

Figure 2A:
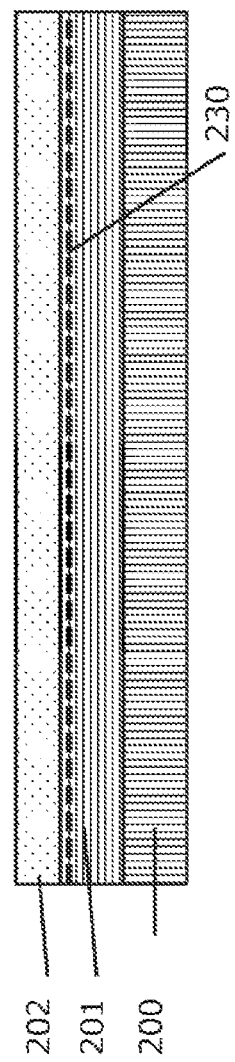
FIG. 2A is a cross-sectional view illustrating a configuration of the semiconductor device for power amplification according to Embodiment 1 in the process of manufacturing.
Figure 2B:
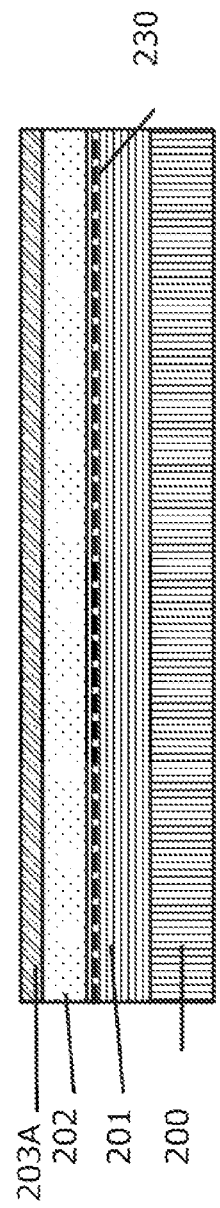
FIG. 2B is a cross-sectional view illustrating a configuration of the semiconductor device for power amplification according to Embodiment 1 in the process of manufacturing.
Figure 2C:
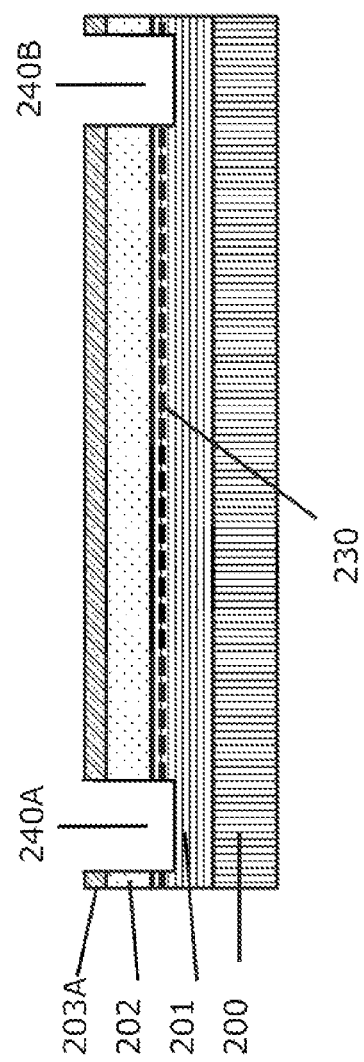
FIG. 2C is a cross-sectional view illustrating a configuration of the semiconductor device for power amplification according to Embodiment 1 in the process of manufacturing.
Figure 2D:
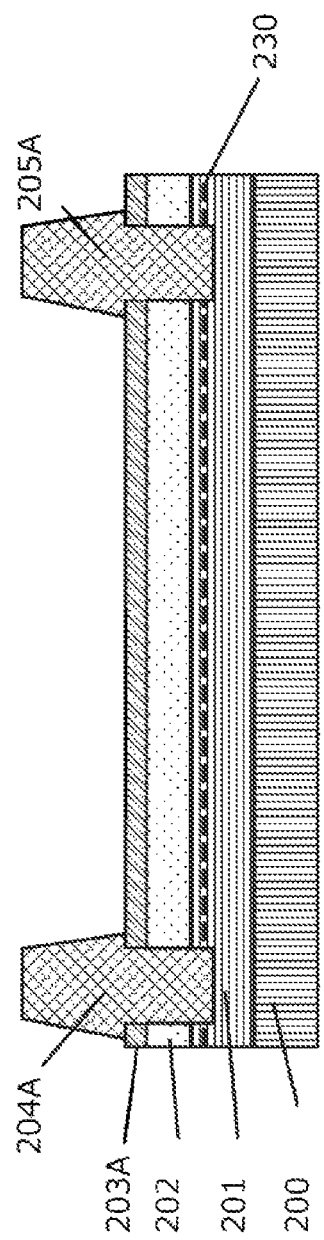
FIG. 2D is a cross-sectional view illustrating a configuration of the semiconductor device for power amplification according to Embodiment 1 in the process of manufacturing.
Figure 2G:
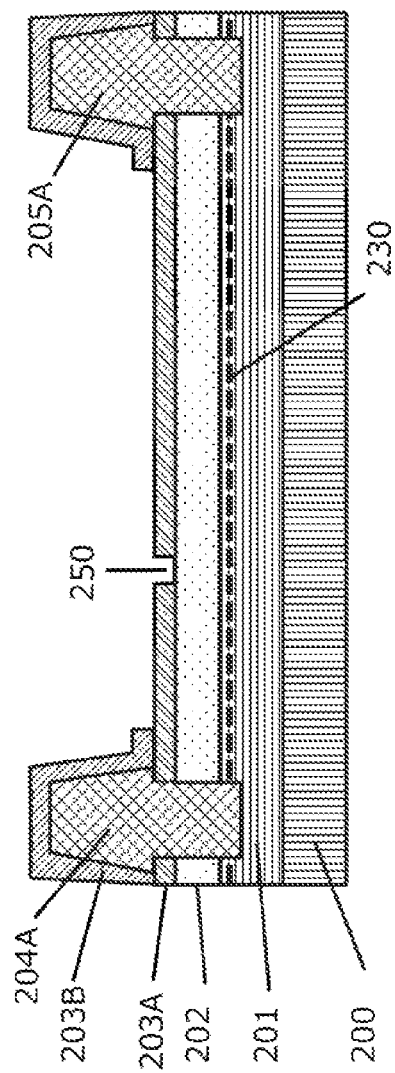
FIG. 2G is a cross-sectional view illustrating a configuration of the semiconductor device for power amplification according to Embodiment 1 in the process of manufacturing.
Figure 2H:
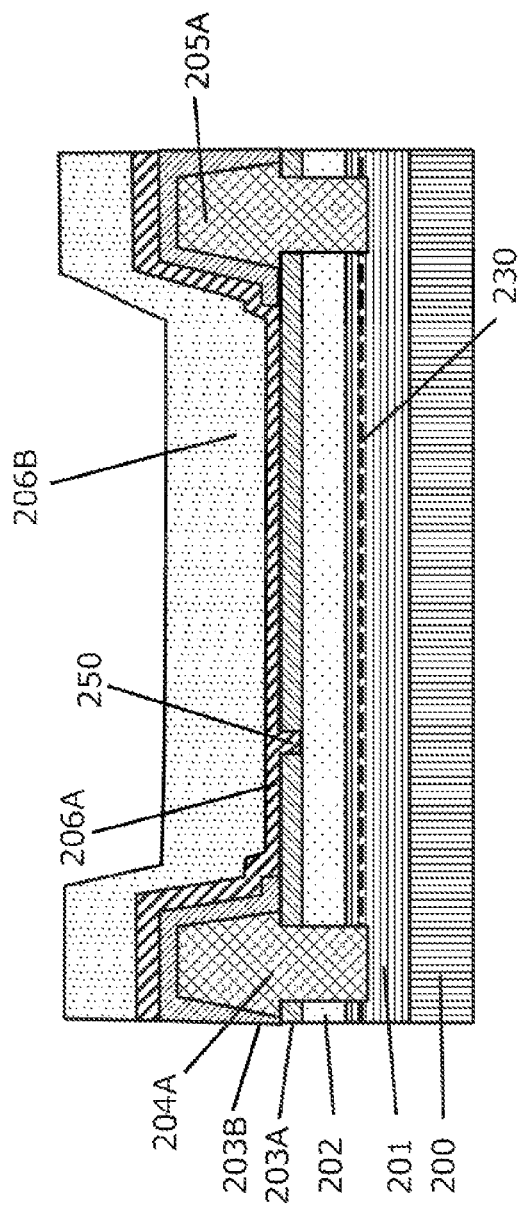
FIG. 2H is a cross-sectional view illustrating a configuration of the semiconductor device for power amplification according to Embodiment 1 in the process of manufacturing.
Figure 2I:
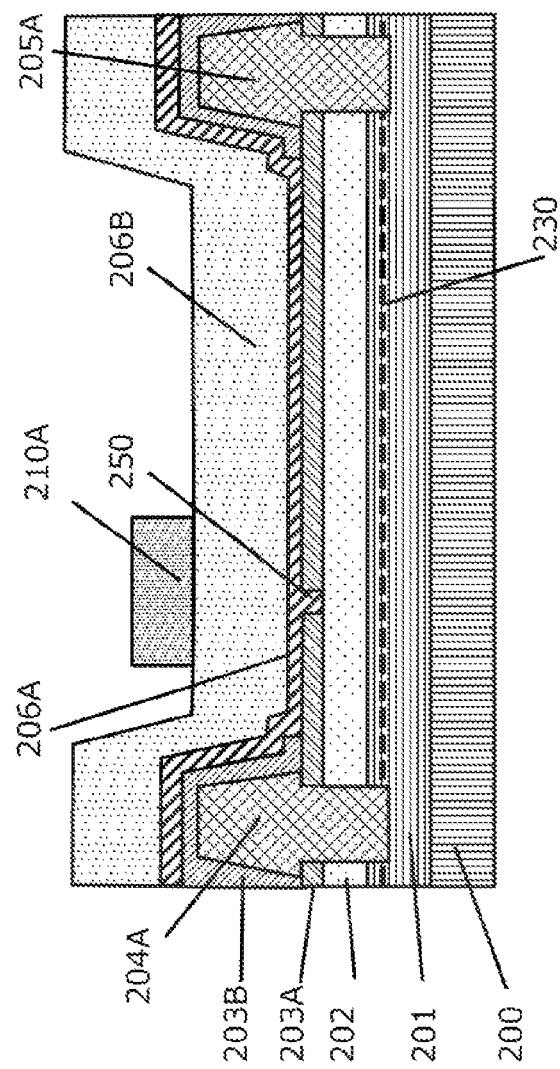
FIG. 2I is a cross-sectional view illustrating a configuration of the semiconductor device for power amplification according to Embodiment 1 in the process of manufacturing.
Figure 2J:
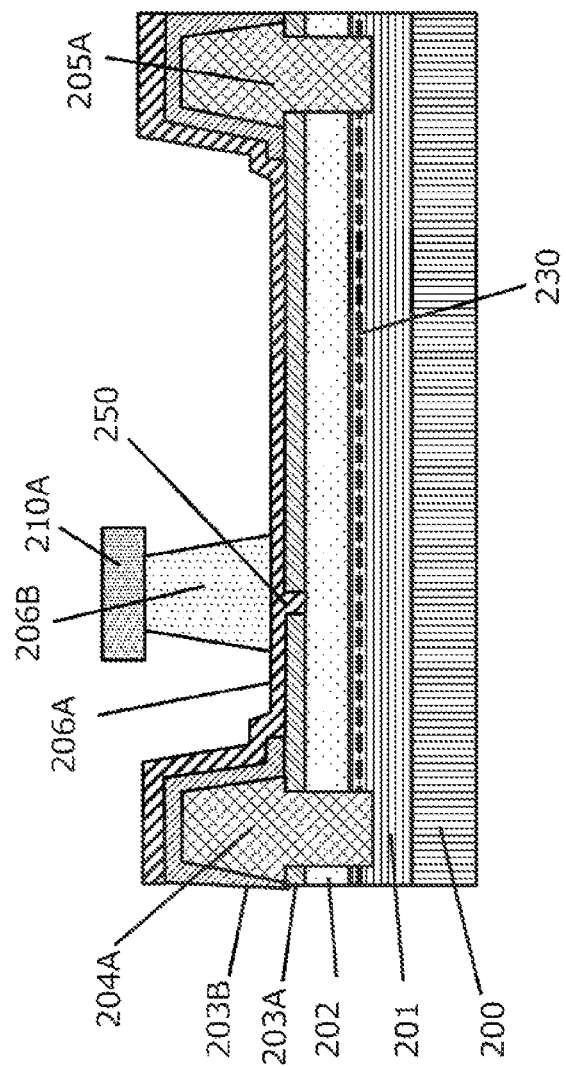
FIG. 2J is a cross-sectional view illustrating a configuration of the semiconductor device for power amplification according to Embodiment 1 in the process of manufacturing.
Figure 2K:
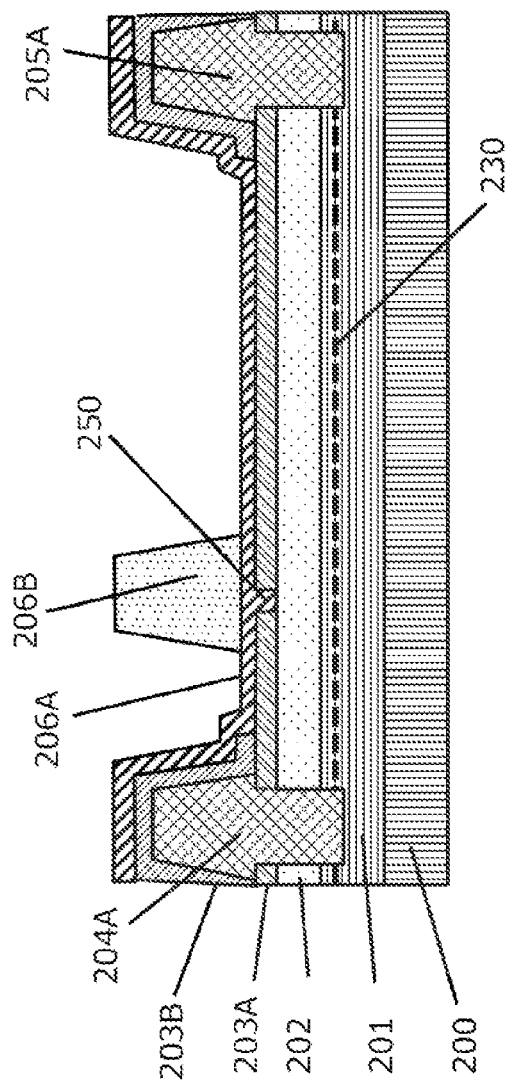
FIG. 2K is a cross-sectional view illustrating a configuration of the semiconductor device for power amplification according to Embodiment 1 in the process of manufacturing.
Figure 2L:
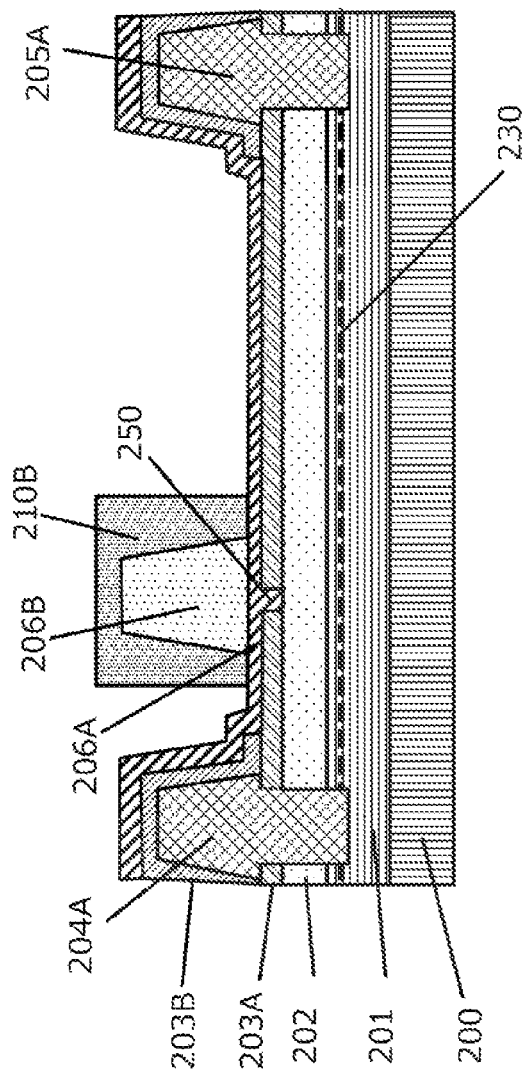
FIG. 2L is a cross-sectional view illustrating a configuration of the semiconductor device for power amplification according to Embodiment 1 in the process of manufacturing.
Figure 2N:
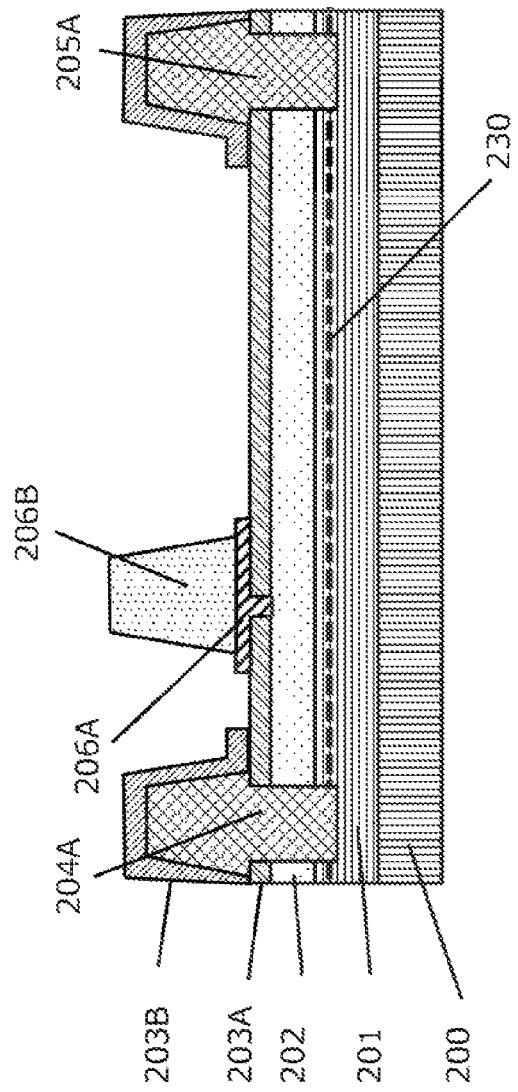
FIG. 2N is a cross-sectional view illustrating a configuration of the semiconductor device for power amplification according to Embodiment 1 in the process of manufacturing.
Figure 20:
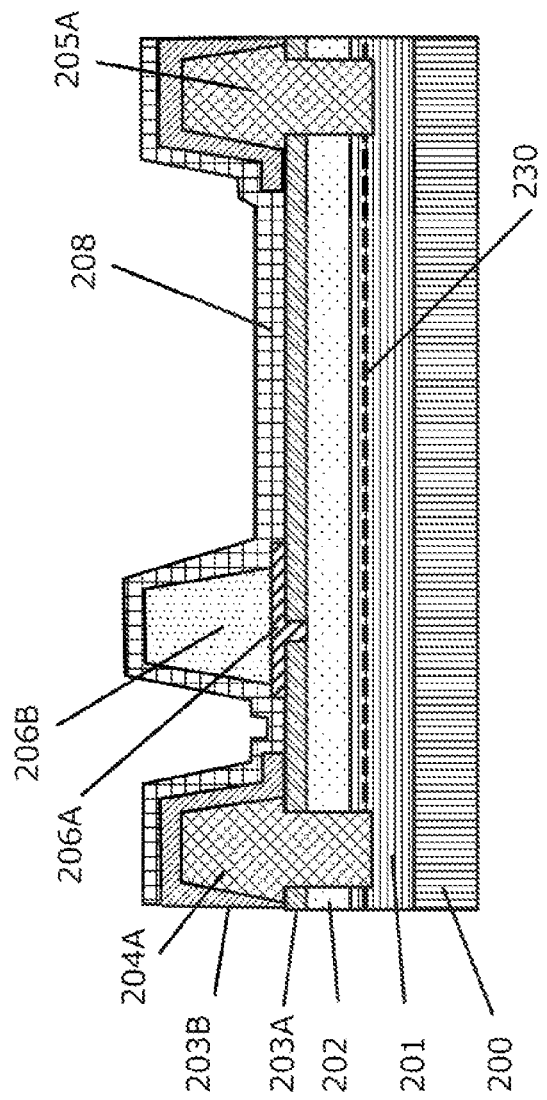
Figure 2P:
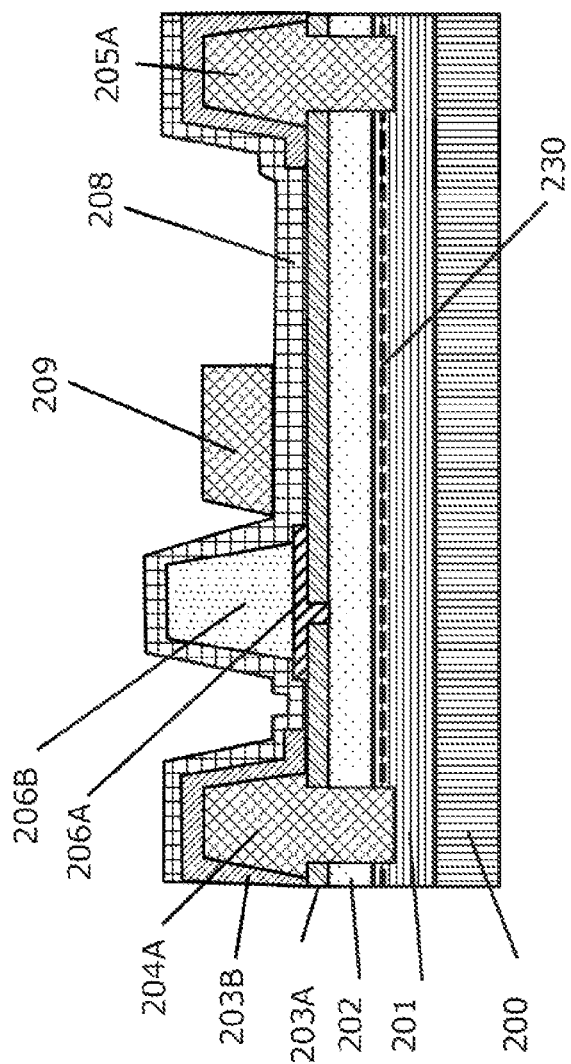
FIG. 2P is a cross-sectional view illustrating a configuration of the semiconductor device for power amplification according to Embodiment 1 in the process of manufacturing.
Figure 2Q:
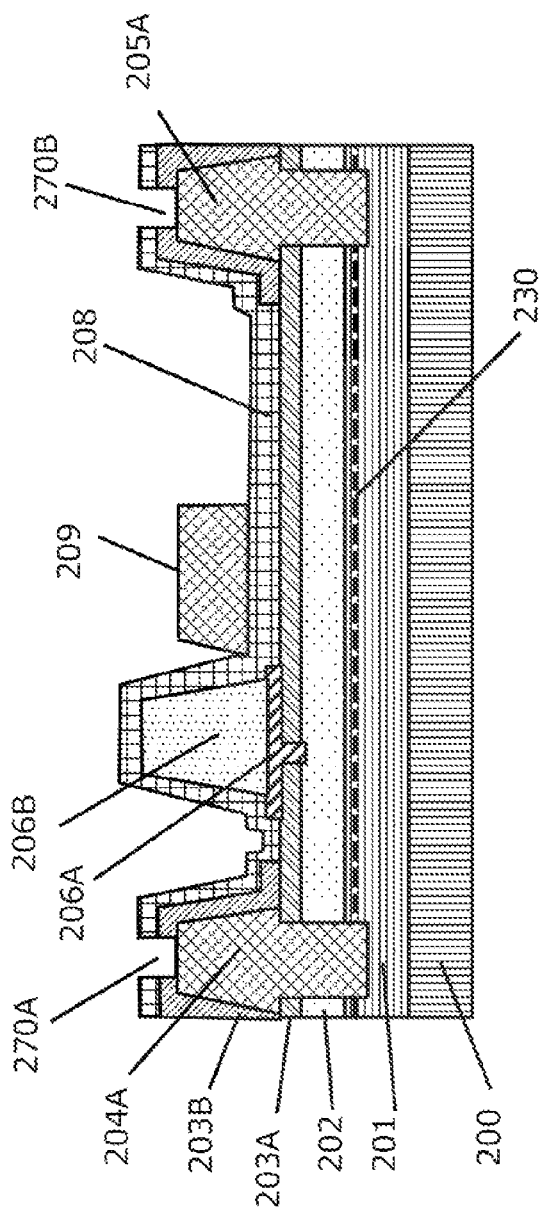
FIG. 2Q is a cross-sectional view illustrating a configuration of the semiconductor device for power amplification according to Embodiment 1 in the process of manufacturing.
Figure 2R:
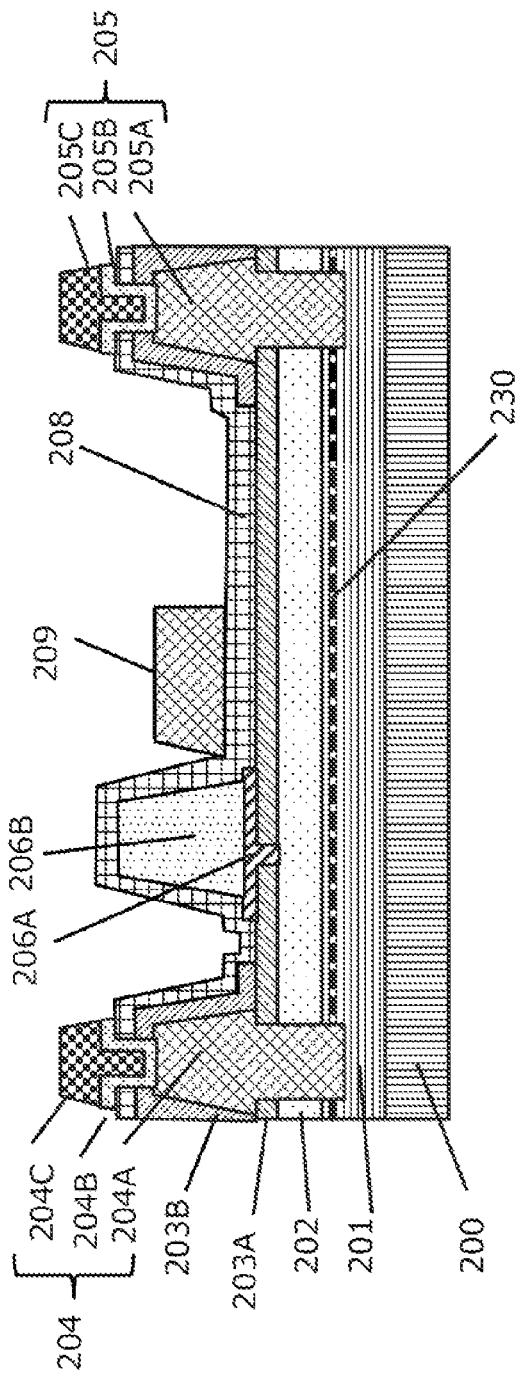
FIG. 2R is a cross-sectional view illustrating a configuration of the semiconductor device for power amplification according to Embodiment 1 in the process of manufacturing.

FIG. 2A to FIG. 2R are each a cross-sectional view illustrating the configuration of semiconductor device for power amplification 10 in the process of manufacturing.

First, as illustrated in FIG. 2A, first nitride semiconductor layer 201 is epitaxially grown on substrate 200, and then second nitride semiconductor layer 202 is epitaxially grown, thereby stacking first nitride semiconductor layer 201 and second nitride semiconductor layer 202 above substrate 200.

Next, as illustrated in FIG. 2B, insulating film 203A that comprises $Si_3N_4$ is deposited on the entire upper surface of second nitride semiconductor layer 202.

Next, as illustrated in FIG. 2C, dry etch opening is carried out to form ohmic electrode opening 240A for forming source electrode 204 that is ohmic bonded to semiconductor stack structure 220 and ohmic electrode opening 240B for forming drain electrode 205 that is ohmic bonded to semiconductor stack structure 220.

The above-described dry etching opening is carried out by etching insulating film 203A, then etching second nitride semiconductor layer 202, and then etching first nitride semiconductor layer 201 until 2DEG surface 230 appears.

Next, as illustrated in FIG. 2D, ohmic portion 204A is formed in ohmic electrode opening 240A and ohmic portion 205A is formed in ohmic electrode opening 240B.

Ohmic portion 204A and ohmic portion 205A comprise the same material, for example, a material containing Ti or Al. Ohmic portion 204A and ohmic portion 205A are formed by depositing Ti or Al metal on the entire upper surface of insulating film 203A including the regions of ohmic electrode opening 240A and ohmic electrode opening 240B, by a continuous sputtering method, followed by photolithography to form ohmic portion 204A and ohmic portion 205A, and then dry etching is carried out to remove the portion other than ohmic portion 204A and ohmic portion 205A.

In addition, ohmic portion 204A and ohmic portion 205A may be formed by depositing Ti or Al metal in ohmic electrode opening 240A and ohmic electrode opening 240B, respectively, by vapor deposition and lift-off methods.

After ohmic portion 204A and ohmic portion 205A are formed, semiconductor stack structure 220 and the Ti or Al metal are subjected to an alloy reaction at a high temperature exceeding 500° C. to form an ohmic junction between the metal and the semiconductor. It utilizes the property of Ti and GaN that when Ti reacts with N in GaN, it tends to be made N-type.

Next, as illustrated in FIG. 2E, insulating film 203B that comprises $Si_3N_4$ is deposited on the entire upper surface of insulating film 203A including ohmic portion 204A and ohmic portion 205A.

Next, as illustrated in FIG. 2F, ohmic portion 204A and ohmic portion 205A are covered with a photoresist mask, and insulating film 203B is etched away to expose insulating film 203A.

Next, as illustrated in FIG. 2G, gate opening 250 is formed in insulating film 203A for Schottky junction of lower layer 206A and second nitride semiconductor layer 202. Gate opening 250 is formed by etching away insulating film 203A until the upper surface of second nitride semiconductor layer 202 is exposed, after pattern opening by resist-applied photolithography. This etching is usually implemented by dry etching of $Si_3N_4$ with a gas containing $CF_4$, but may be implemented by wet etching with HF. Or, this etching may be implemented by a method that combines the above-described dry etching and the above-described wet etching.

Next, as illustrated in FIG. 2H, lower layer 206A and upper layer 206B are continuously deposited by the sputtering method above the entire upper surface of insulating film 203A including insulating film 203B and gate opening 250. The sputtering method is a method of depositing a desired metal material on the surface of a semiconductor substrate facing a target by causing accelerated ions to collide with the surface of the target of the metal type to be deposited on the semiconductor substrate.

Lower layer 206A need to form a Schottky junction with second nitride semiconductor layer 202. For this reason, lower layer 206A is, for example, a metal containing TiN.

Upper layer 206B is for reducing the overall resistance value of gate electrode 206. For this reason, upper layer 206B is, for example, a metal containing Al.

Here, TiN that is an example material of lower layer 206A is a high heat-resistant metal. For this reason, lower layer 206A also functions as a barrier metal at high temperature between upper layer 206B and second nitride semiconductor layer 202.

Next, as illustrated in FIG. 2I, resist mask 210A is formed by photolithography patterning in the region in which gate electrode 206 is formed. Resist mask 210A is formed to have a pattern of which only the desired region of upper layer 206B remains.

Next, as illustrated in FIG. 2J, upper layer 206B in the region in which resist mask 210A is not formed is removed by vertically performing dry etching, and dry etching is stopped when lower layer 206A is exposed.

Next, as illustrated in FIG. 2K, resist mask 210A is removed using, for example, an organic solvent.

Next, as illustrated in FIG. 2L, resist mask 210B is formed by photolithographic patterning to cover upper layer 206B and the desired region of lower layer 206A.

Next, as illustrated in FIG. 2M, lower layer 206A is removed by dry etching. The endpoint of this etching is where insulating film 203A is exposed.

Next, as illustrated in FIG. 2N, resist mask 210B is removed using, for example, an organic solvent. Here, as illustrated in FIG. 2L, resist mask 210B may be formed to be located closer to drain electrode 205 than to gate opening 250.

Next, as illustrated in FIG. 2O, insulating film 208 is deposited on the entire upper surface of insulating film 203A including insulating film 203B, lower layer 206A, and upper layer 206B.

Next, as illustrated in FIG. 2P, source field plate 209 is formed on the flat portion of insulating film 208 above gate electrode 206 including lower layer 206A and upper layer 206B. Source field plate 209 is formed, for example, by depositing Ti or Al on the entire upper surface of insulating film 208 by a continuous sputtering method, then forming a resist mask at the desired position by photolithography, and removing the portion not covered by the resist mask, by dry etching.

Next, as illustrated in FIG. 2Q, etch opening is performed on insulating film 203B and insulating film 208 above ohmic portion 204A and insulating film 203B and insulating film 208 above ohmic portion 205A to form contact portion 270A and contact portion 270B.

Next, as illustrated in FIG. 2R, barrier metal portion 204B and barrier metal portion 205B that comprises a high melting point metal such as, for example, W, TiN, etc., are formed above contact portion 270A and above contact portion 270B, respectively, by a sputtering and dry etching method, and then interconnection 204C and interconnection 205C are formed above barrier metal portion 204B and barrier metal portion 205B, respectively, by a plating method using a metal that comprises, for example, Au, Al, or Cu.

The formation of interconnection 204C and interconnection 205C completes semiconductor device for power amplification 10 illustrated in FIG. 1A.

Here, the configuration example of gate electrode 206 will be additionally described.

In Embodiment 1, gate electrode 206 has been described as including lower layer 206A and upper layer 206B. However, gate electrode 206 need not necessarily be limited to the configuration example including lower layer 206A and upper layer 206B. For example, gate electrode 206 may have a configuration that does not have a layer configuration (hereinafter also referred to as "integrated configuration").

The material of gate electrode 206 having the integrated configuration may be any metallic material that can form a Schottky junction between gate electrode 206 and second nitride semiconductor layer 202. More specifically, it is sufficient if the material of gate electrode 206 having the integrated configuration is, for example, Ni, TiN, Pt, Pd, Cu, Ta, TaN, W, WSi, or Al.

As described in Embodiment 1, when gate electrode 206 has a configuration including lower layer 206A and upper layer 206B, lower layer 206A and upper layer 206B can comprise different materials from each other.

The method of manufacturing semiconductor device for power amplification 10 in which gate electrode 206 and source field plate 209 are manufactured by the sputtering and dry etching method has been described above. However, semiconductor device for power amplification 10 can also be manufactured by a vapor deposition and lift-off method.

In the vapor deposition and lift-off method, a photoresist mask is first formed so as to open an electrode formation region, and metals that comprise Ni or Au are continuously vapor-deposited from the upper layer. In the deposition furnace, the metal to be deposited on the semiconductor substrate is heated and melted above its melting point in a vacuum, either by resistance heating or by an electron beam, thereby depositing the metal on the semiconductor substrate. Next, the above-described photoresist mask is removed using an organic solvent. At that time, the above-described electrode above the photoresist mask is also removed at the same time along with the above-described photoresist mask. Through this process, gate electrode 206 including Ni as lower layer 206A and Au as upper layer 206B is left in a portion of the opening corresponding to gate electrode 206 in the photoresist mask.

The vapor deposition and lift-off method has the advantages of simplicity in manufacturing and less damage to the semiconductor substrate, but the sputtering and dry etching method is superior in terms of dimensional accuracy.

Features and Advantageous Effect

In general, Cds which has a strong correlation with the low power consumption characteristics of a semiconductor device for power amplification for high frequency applications is the capacitance generated between the source field plate and the electrode formed of the opposing 2DEG surface 230. This capacitance is inversely proportional to the spacing between electrodes, and proportional to the electrode area.

According to the present invention, one feature is that the height position of the lowermost surface of the source field plate is higher than the lower surface position of the gate field plate, and thus the spacing is larger than the above-described electrode spacing in PTL 1. For this reason, the capacitance generated between the above-described electrodes in semiconductor device for power amplification 10 is reduced than the capacitance generated between the above-described electrodes of PTL 1.

As described above, with semiconductor device for power amplification 10 having above-described configuration, it is possible to achieve both electric field relaxation between the gate electrode and the drain electrode by the source field plate, and inhibiting Cds.

In semiconductor device for power amplification 10, height HG of the uppermost surface of gate electrode 206 can be higher than height HS of the upper-edge position of the side surface of source field plate 209 that is in closest proximity to the gate side, and thus it is possible to reduce gate resistance Rg. This is because gate resistance Rg is generally inversely proportional to the cross-sectional area of the gate electrode.

In addition, this configuration also facilitates the reduction of parasitic capacitance (hereinafter referred to as Cgs) that is generated between the side surface of gate electrode 206 and the side surface of source field plate 209 that is in closest proximity to the gate side.

With the commonly used semiconductor devices for power amplification using GaN which are currently widely used in the market, the upper surface portion of gate electrode 206 illustrated in FIG. 1A is generally protected by an insulating film that comprises $Si_3N_4$, and then source field plate 209 covers gate electrode 206.

At this time, the height of the uppermost surface of gate electrode 206 cannot be sufficiently high due to the problem of manufacturing stability of the step coverage of the coating portion that covers the upper surface of gate electrode 206. If the height is increased, cracks or other problems with the coatability of the source field plate will occur, resulting in a causal factor of variations in the resistance components of the source field plate.

Therefore, the configuration according to the present invention, which has a shape where source field plate 209 does not cover gate electrode 206, can reduce gate resistance Rg more than general semiconductor devices for power amplification.

Accordingly, with the semiconductor device for power amplification, it is possible to improve the gain characteristics of a high frequency band more than general semiconductor devices for power amplification.

It should be noted that, in FIG. 1A, there is a small gap between the drain-side edge portion of the gate field plate that comprises lower layer 206A and the gate-side edge portion of source field plate 209, and when this gap is too wide, the electric field relaxation effect of the source field plate is decreased and the increase in parasitic capacitance between the gate and the drain (hereinafter referred to as Cgd) cannot be ignored, leading to a decrease in the gain.

However, if the above-described gap is, for example, approximately the length of gate opening 250, the electric field dispersion can be corrected by adjusting the length of source field plate 209 in the X direction illustrated in FIG. 1A, and thus the problem does not arise. Here, the X direction is the direction from the source electrode to the drain electrode in cross-sectional view.

Embodiment 2

Figure 1B:
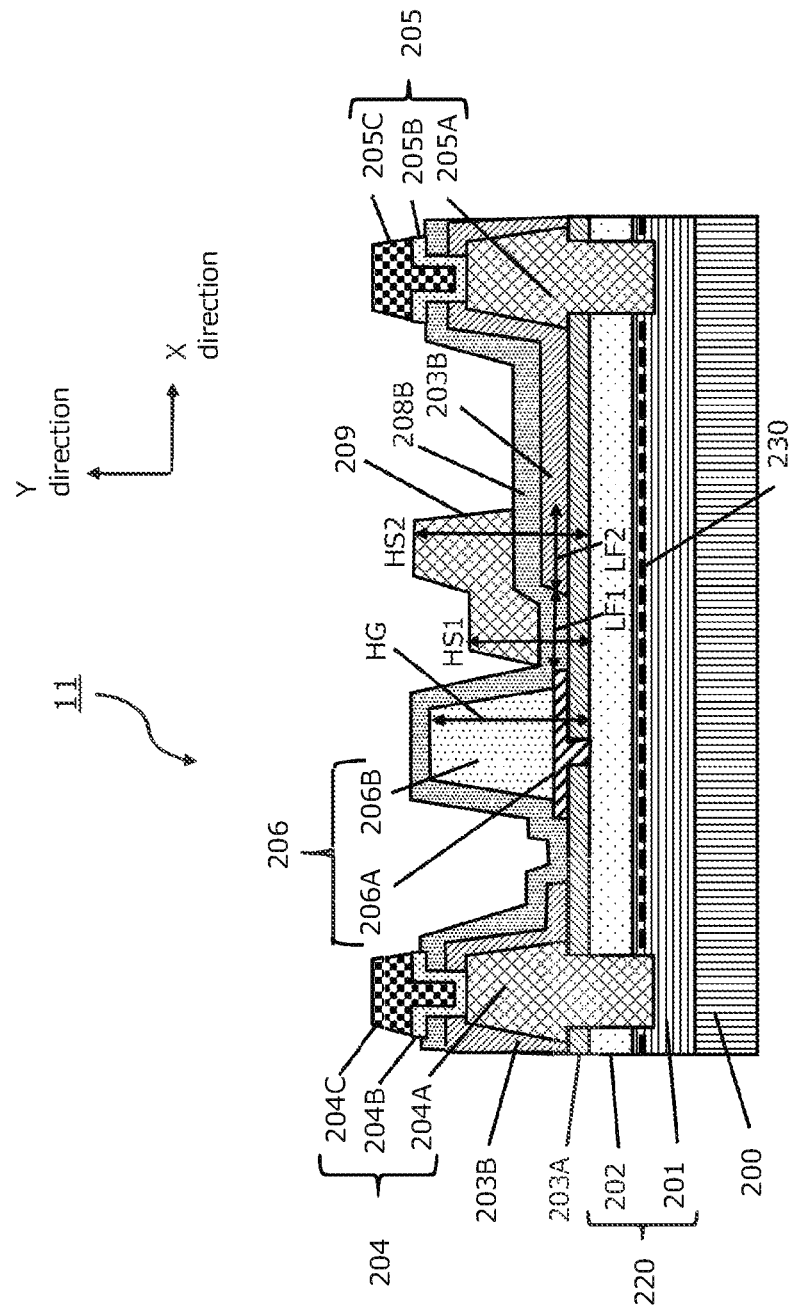
FIG. 1B is a cross-sectional view illustrating a configuration of a semiconductor device for power amplification according to Embodiments 2 and 4.

FIG. 1B is a cross-sectional view of semiconductor device for power amplification 11 illustrating a configuration of a semiconductor device for power amplification according to Embodiment 2.

As illustrated in FIG. 1B, semiconductor device for power amplification 11 includes: substrate 200; semiconductor stack structure 220; source electrode 204; drain electrode 205; gate electrode 206; source field plate 209; insulating film 203A; insulating film 203B; and insulating film 208B.

Semiconductor device for power amplification 11 differs from semiconductor device for power amplification 10 illustrated in FIG. 1A in that source field plate 209 has a staircase shape.

In the following description, in source field plate 209 having a staircase shape, the lower section is referred to as the first source field plate and the upper section is referred to as the second source field plate.

Manufacturing Method

Next, the manufacturing method of semiconductor device for power amplification 11 will be described with reference to FIG. 3A to FIG. 3R.

Figure 3A:
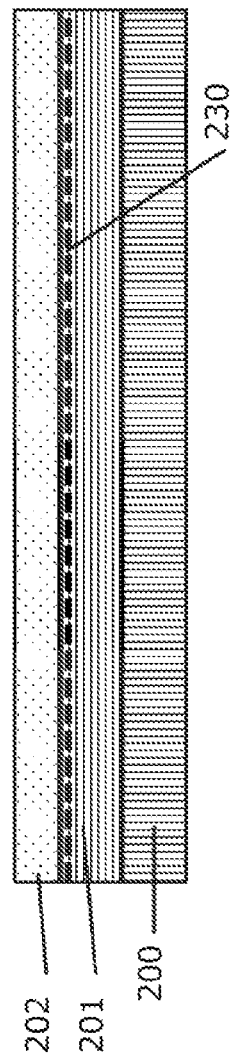
FIG. 3A is a cross-sectional view illustrating a configuration of the semiconductor device for power amplification according to Embodiment 2 in the process of manufacturing.
Figure 3B:
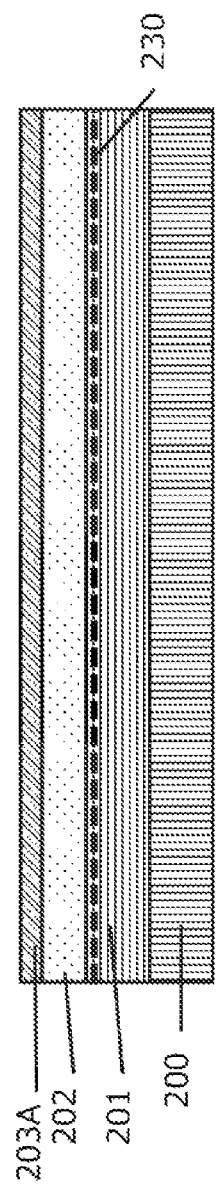
FIG. 3B is a cross-sectional view illustrating a configuration of the semiconductor device for power amplification according to Embodiment 2 in the process of manufacturing.
Figure 3C:
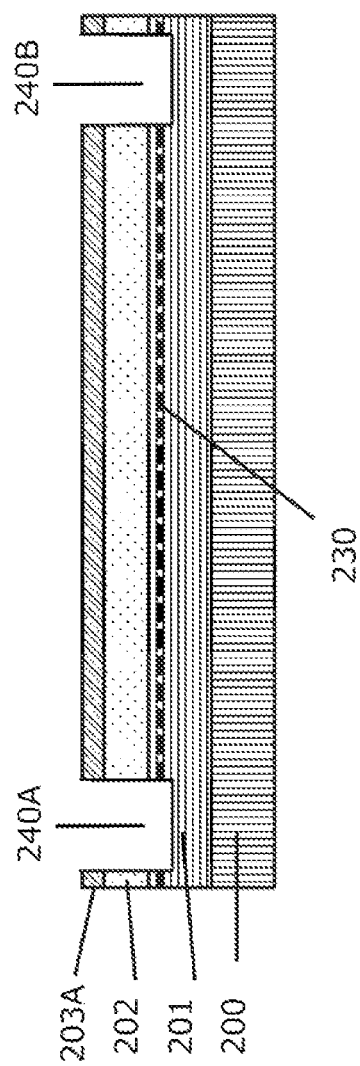
FIG. 3C is a cross-sectional view illustrating a configuration of the semiconductor device for power amplification according to Embodiment 2 in the process of manufacturing.
Figure 3D:
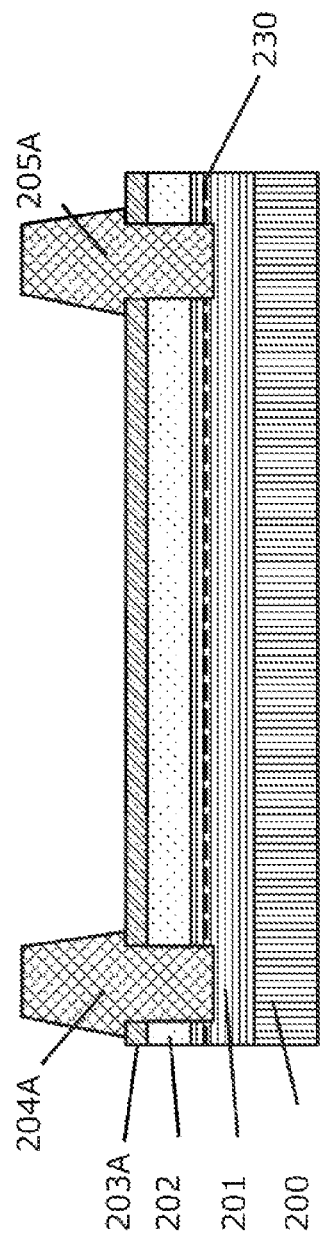
FIG. 3D is a cross-sectional view illustrating a configuration of the semiconductor device for power amplification according to Embodiment 2 in the process of manufacturing.
Figure 3F:
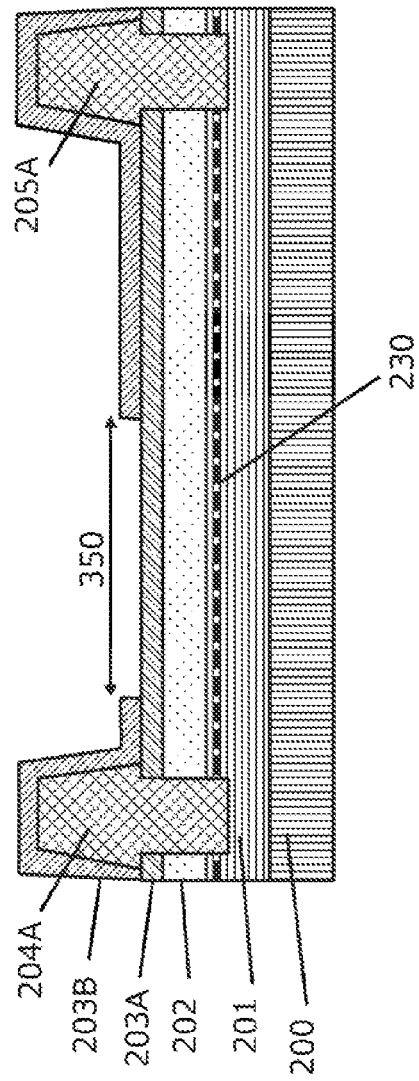
FIG. 3F is a cross-sectional view illustrating a configuration of the semiconductor device for power amplification according to Embodiment 2 in the process of manufacturing.
Figure 3G:
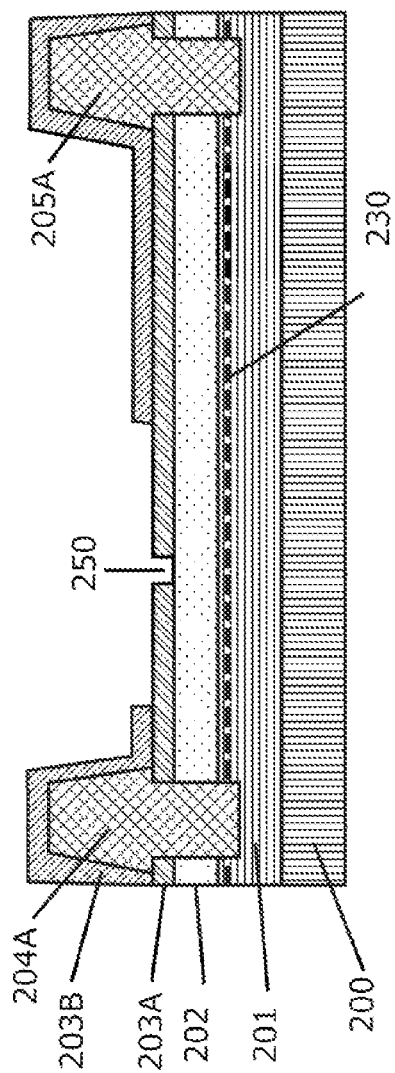
FIG. 3G is a cross-sectional view illustrating a configuration of the semiconductor device for power amplification according to Embodiment 2 in the process of manufacturing.
Figure 3H:
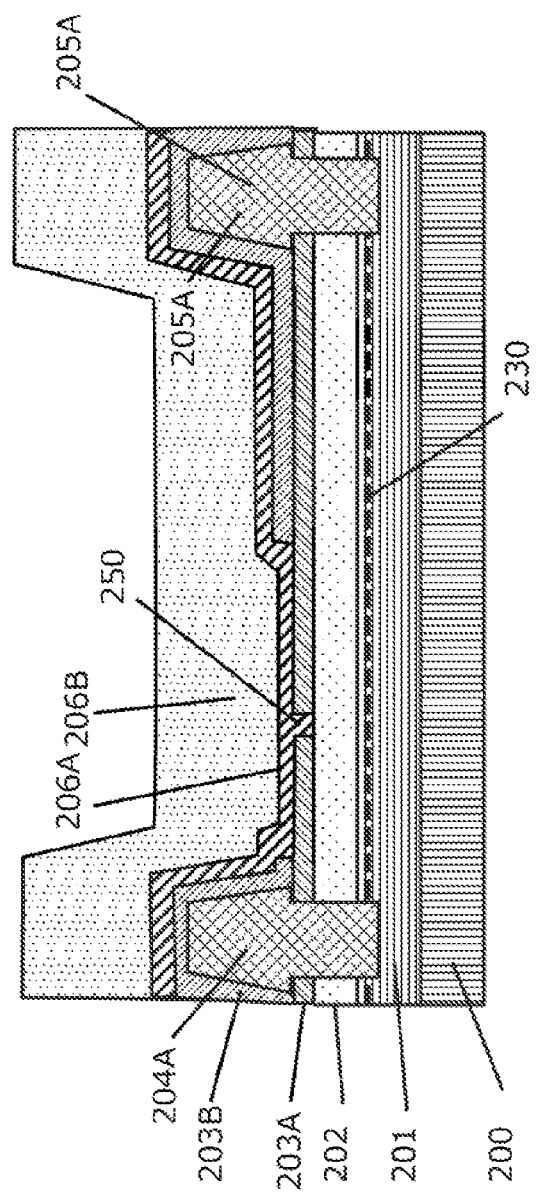
FIG. 3H is a cross-sectional view illustrating a configuration of the semiconductor device for power amplification according to Embodiment 2 in the process of manufacturing.
Figure 3I:
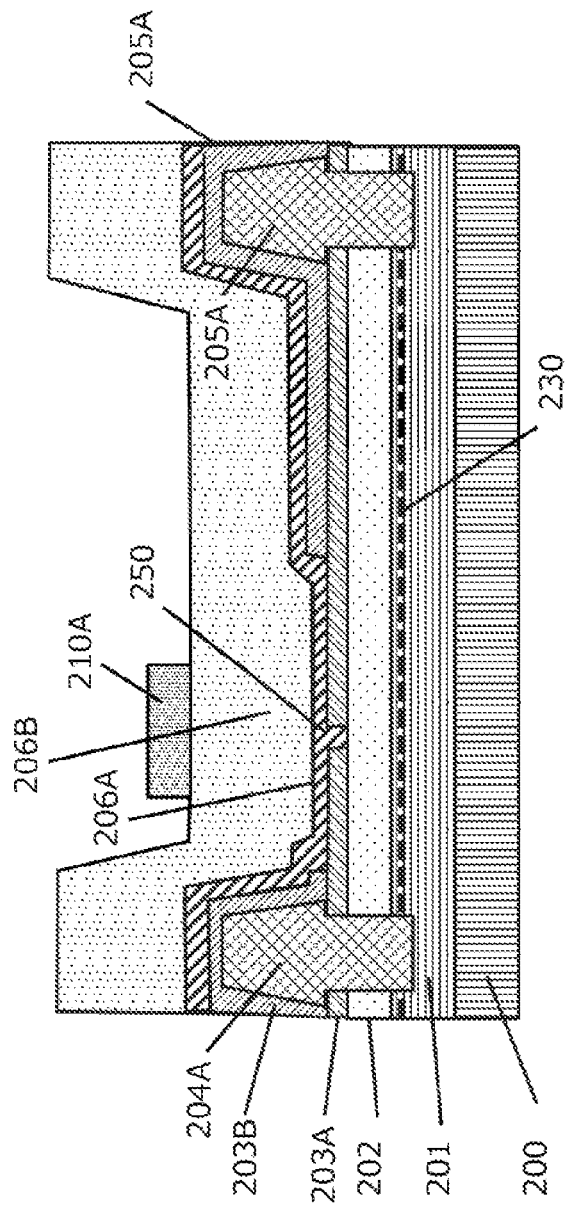
FIG. 3I is a cross-sectional view illustrating a configuration of the semiconductor device for power amplification according to Embodiment 2 in the process of manufacturing.
Figure 3K:
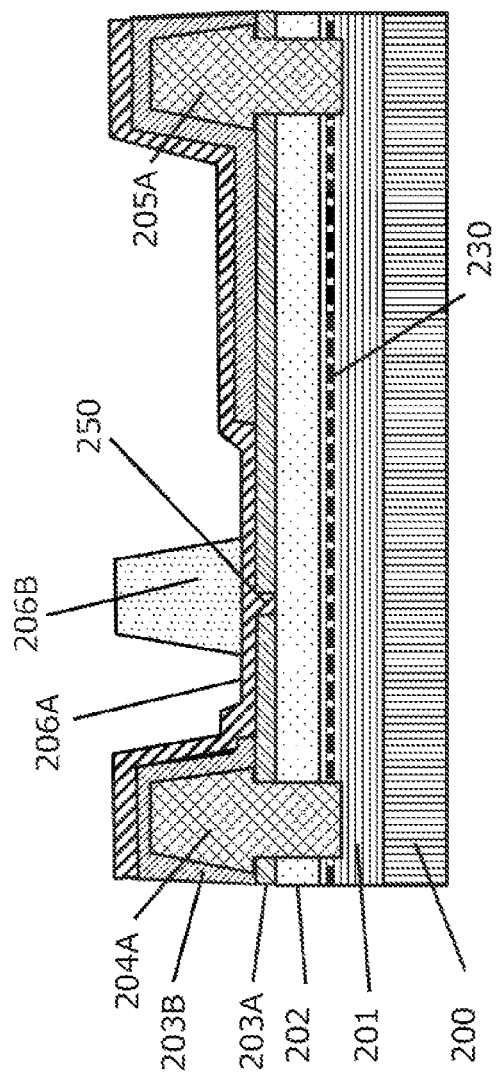
FIG. 3K is a cross-sectional view illustrating a configuration of the semiconductor device for power amplification according to Embodiment 2 in the process of manufacturing.
Figure 3L:
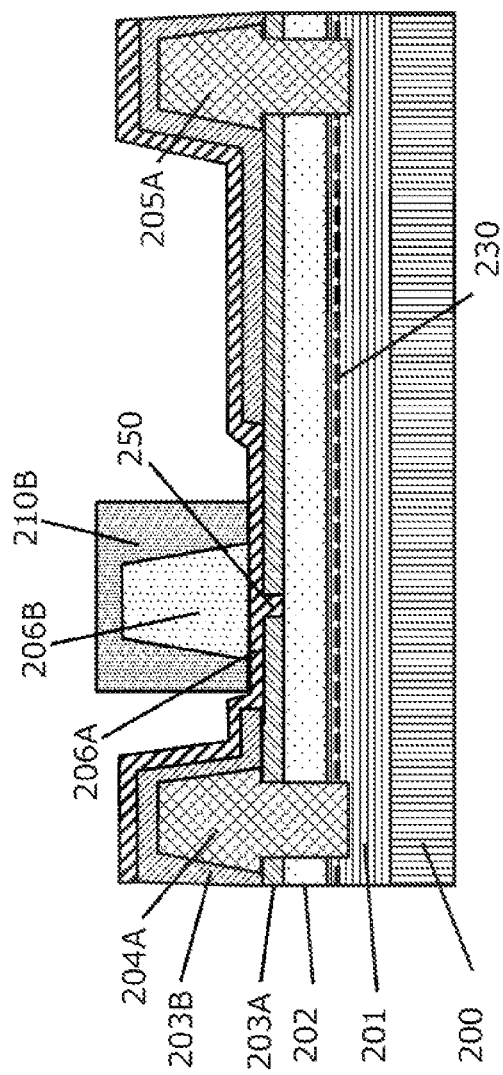
FIG. 3L is a cross-sectional view illustrating a configuration of the semiconductor device for power amplification according to Embodiment 2 in the process of manufacturing.
Figure 3N:
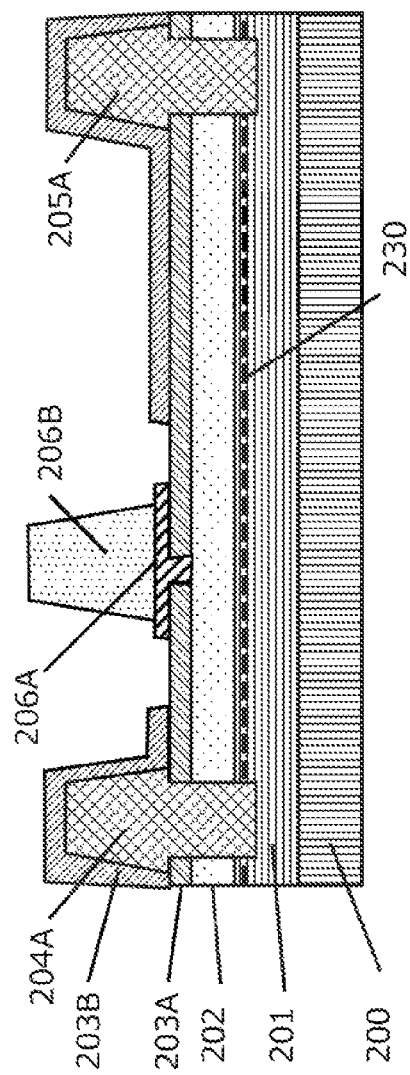
FIG. 3N is a cross-sectional view illustrating a configuration of the semiconductor device for power amplification according to Embodiment 2 in the process of manufacturing.
Figure 30:
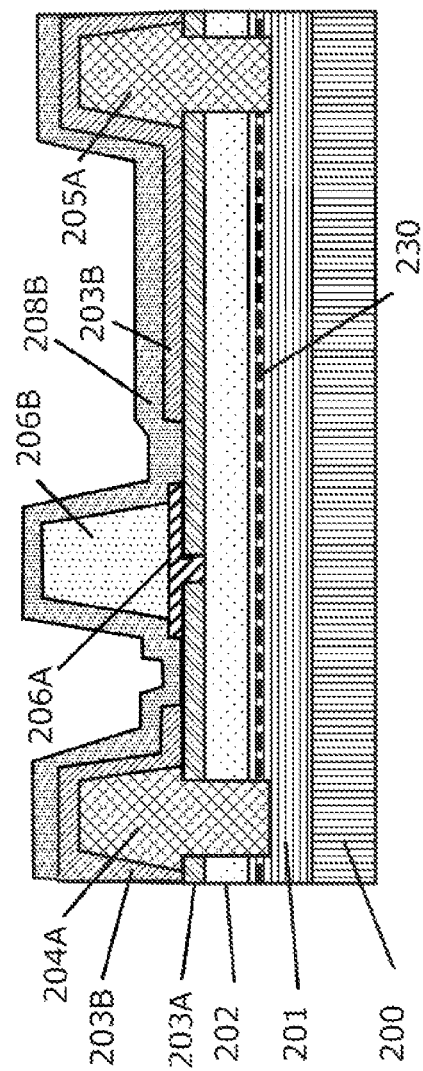
Figure 3P:
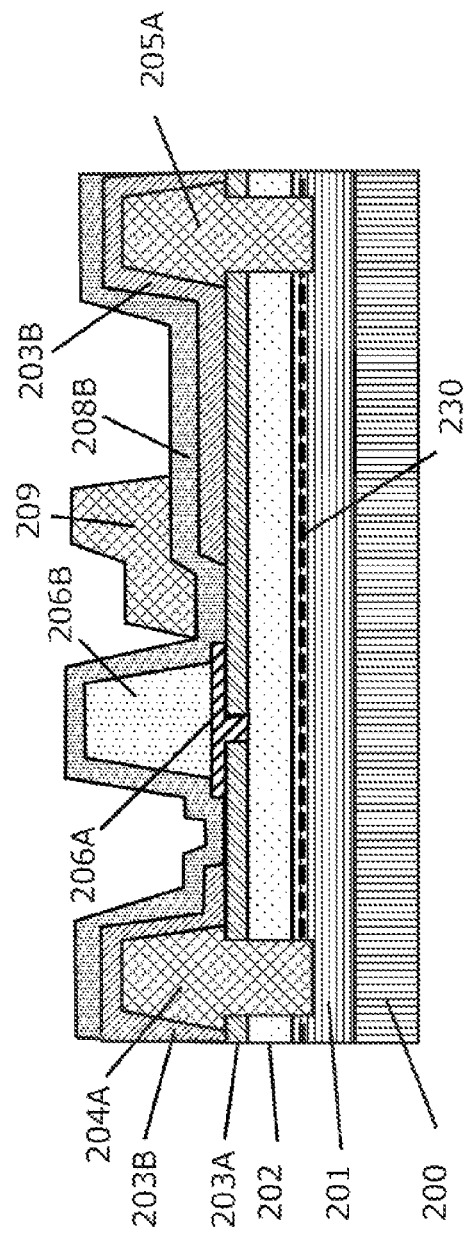
FIG. 3P is a cross-sectional view illustrating a configuration of the semiconductor device for power amplification according to Embodiment 2 in the process of manufacturing.
Figure 3Q:
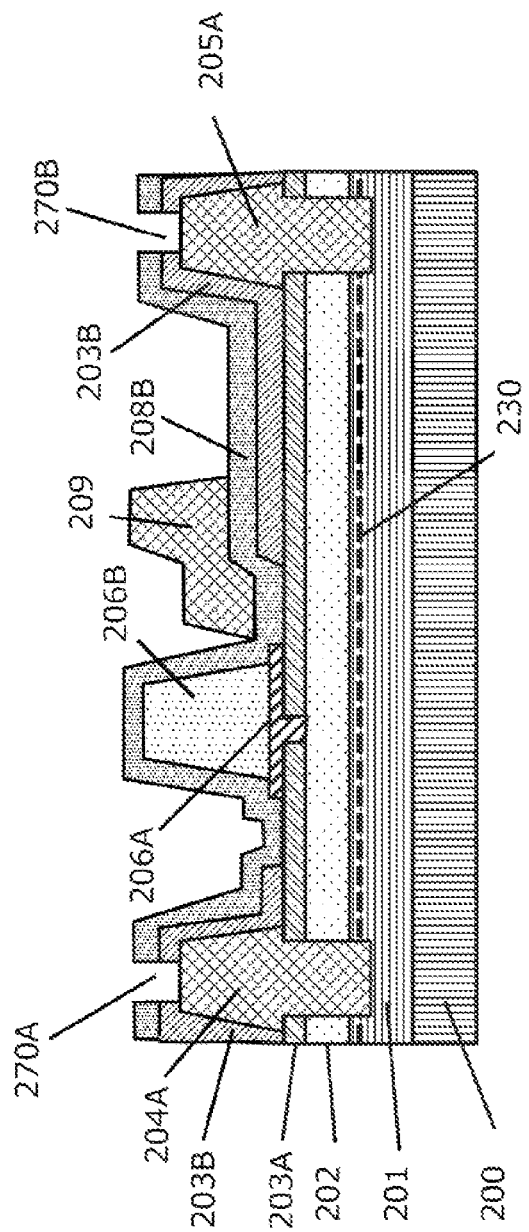
FIG. 3Q is a cross-sectional view illustrating a configuration of the semiconductor device for power amplification according to Embodiment 2 in the process of manufacturing.
Figure 3R:
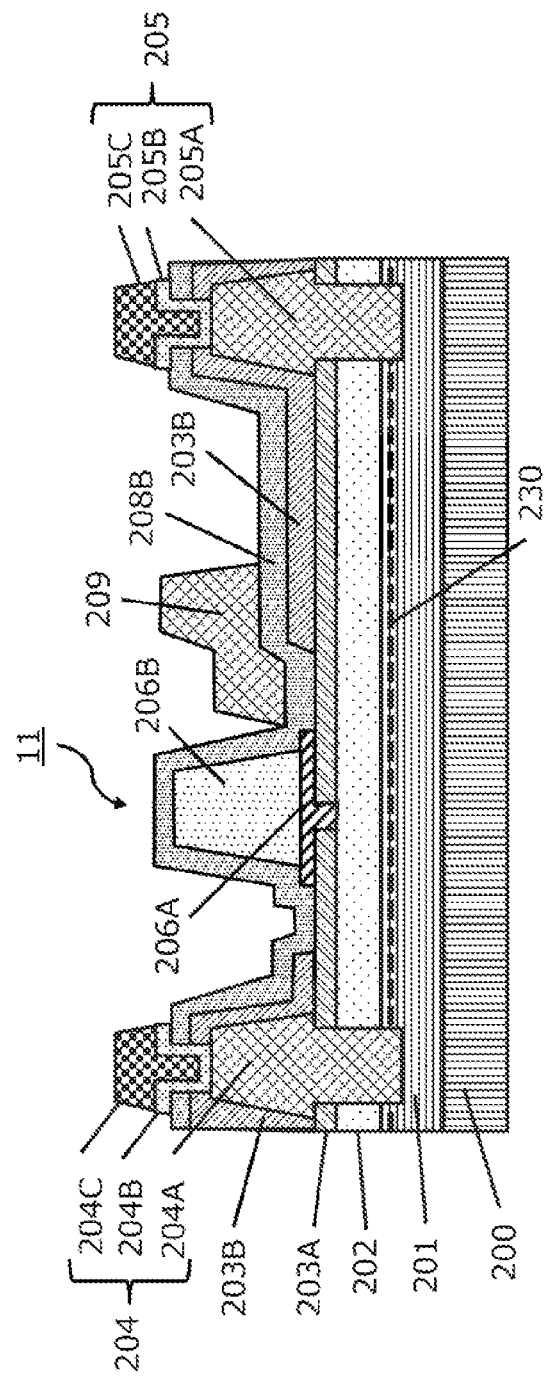
FIG. 3R is a cross-sectional view illustrating a configuration of the semiconductor device for power amplification according to Embodiment 2 in the process of manufacturing.

FIG. 3A to FIG. 3R are each a cross-sectional view illustrating the configuration of semiconductor device for power amplification 11 in the process of manufacturing.

The manufacturing method up to FIG. 3E is the same as the manufacturing method from FIG. 2A to FIG. 2E, and thus the description will be omitted.

In FIG. 3F, opening 350 that includes gate opening 250 and is wider than gate opening 250 is formed in insulating film 203B. At this time, the opening near ohmic portion 205A corresponds to the boundary between the lower section and the upper section of source field plate 209.

Next, as illustrated in FIG. 3G, gate opening 250 is formed for exposing second nitride semiconductor layer 202.

Next, as illustrated in FIG. 3H to FIG. 3N, gate electrode 206 (206A, 206B) is formed by the same manufacturing method described in FIG. 2H to FIG. 2N of Embodiment 1.

After that, insulating film 208B is deposited over the entire area, as in FIG. 3O.

Next, source field plate 209 is deposited as illustrated in FIG. 3P.

Then, as illustrated in FIG. 3Q to FIG. 3R, source electrode 204 and drain electrode 205 are formed by the same manufacturing method described in FIG. 2Q to FIG. 2R of Embodiment 1.

The formation of interconnection 204C and interconnection 205C completes semiconductor device for power amplification 11 illustrated in FIG. 1B.

Features and Advantageous Effect

The advantageous effect of the staircase shape of source field plate 209 will be described with reference to FIG. 1N.

Figure 1E:
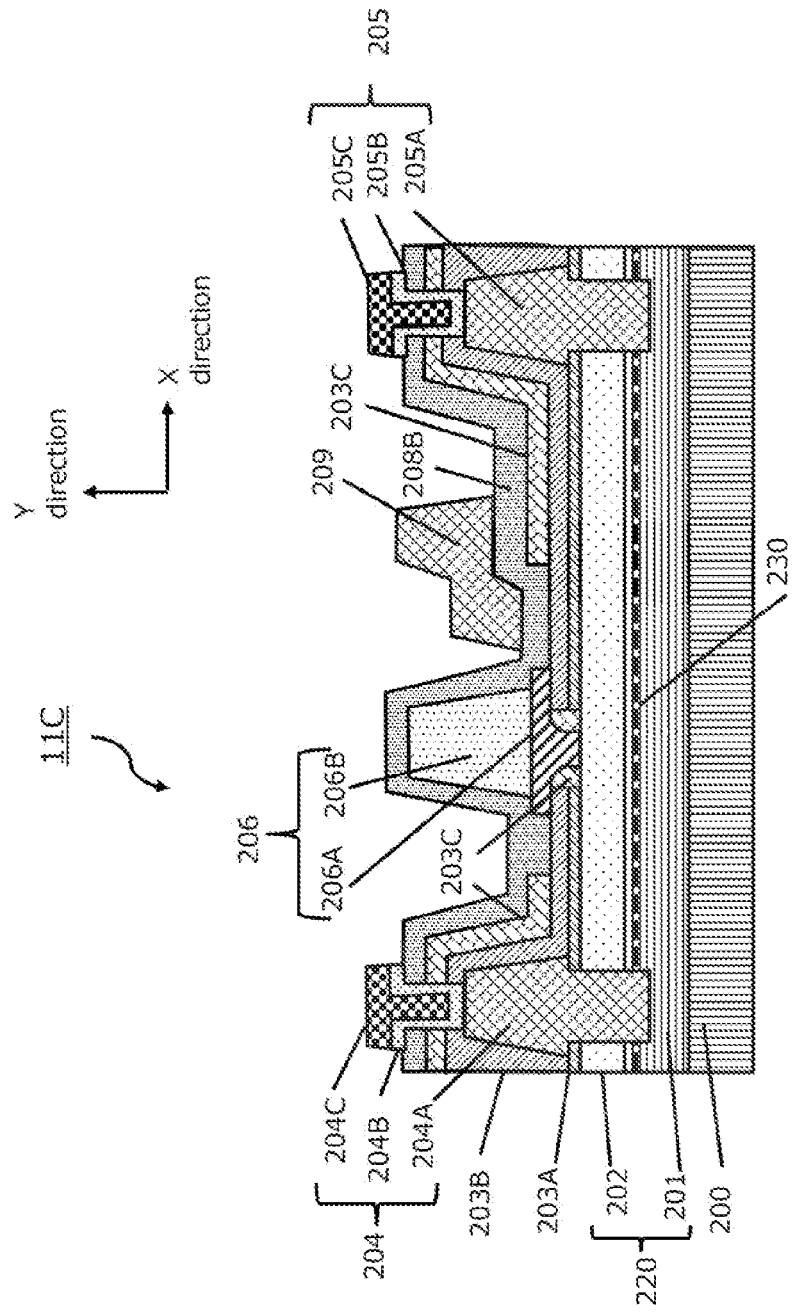
FIG. 1E is a cross-sectional view illustrating a configuration of a semiconductor device for power amplification according to Embodiment 5.
Figure 1F:
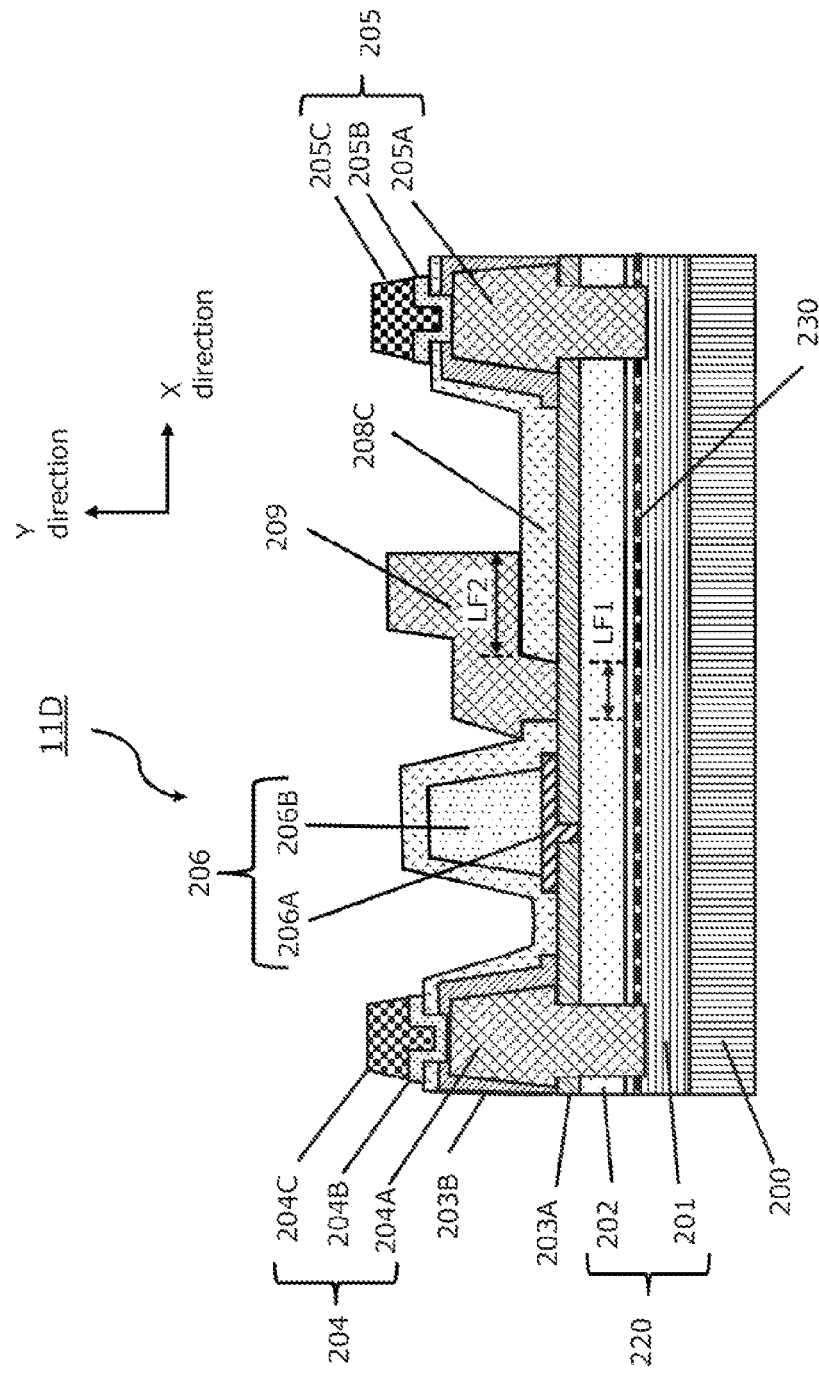
FIG. 1F is a cross-sectional view illustrating a configuration of a semiconductor device for power amplification according to Embodiment 6.
Figure 1I:
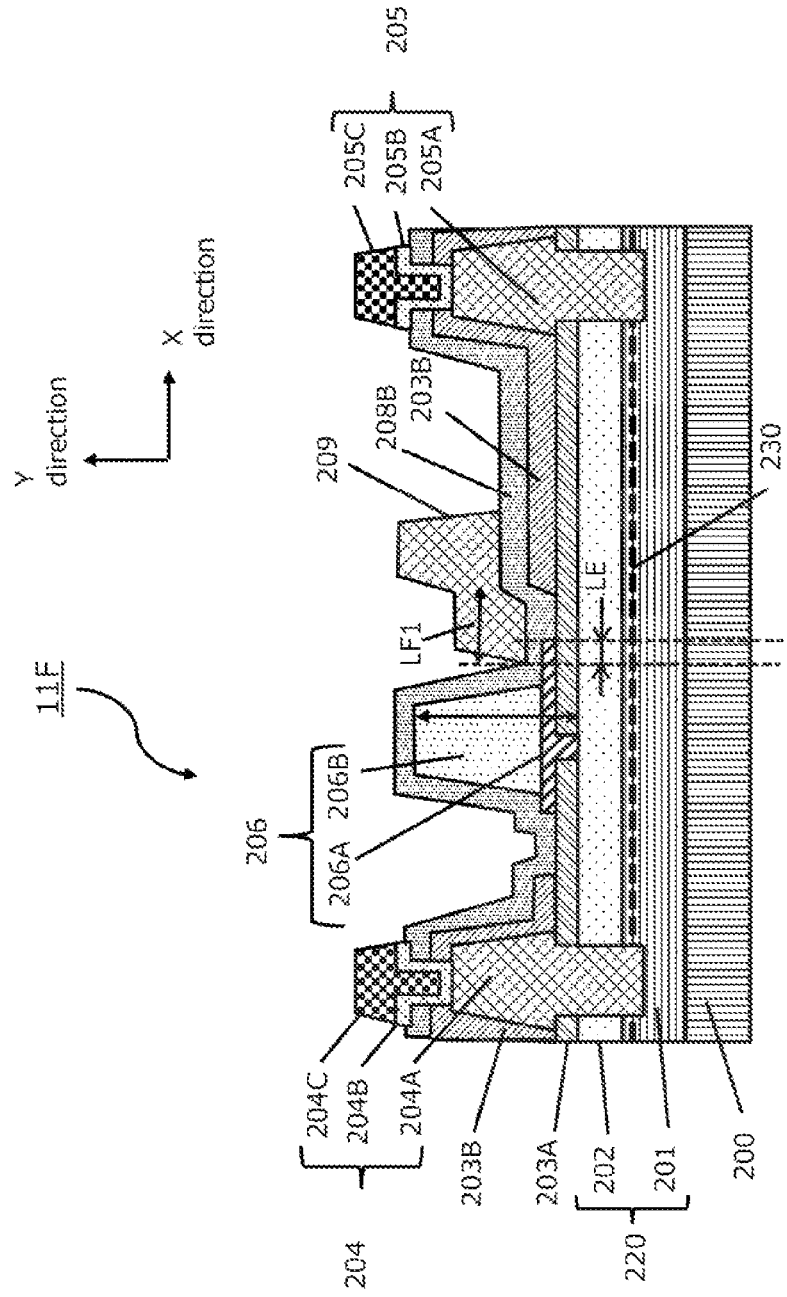
FIG. 1I is a cross-sectional view illustrating a configuration of the semiconductor device for power amplification according to Embodiment 8.
Figure 1J:
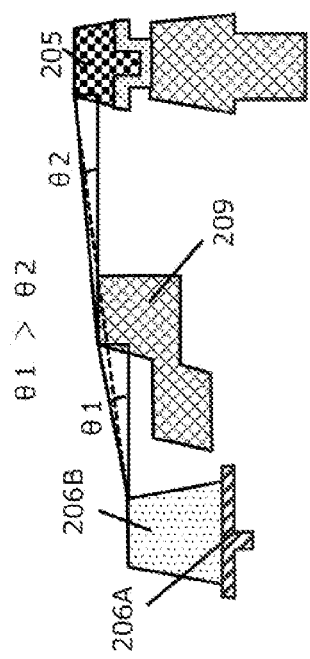
FIG. 1J is a diagram illustrating a mechanism of the semiconductor device for power amplification according to Embodiment 2.
Figure 1K:
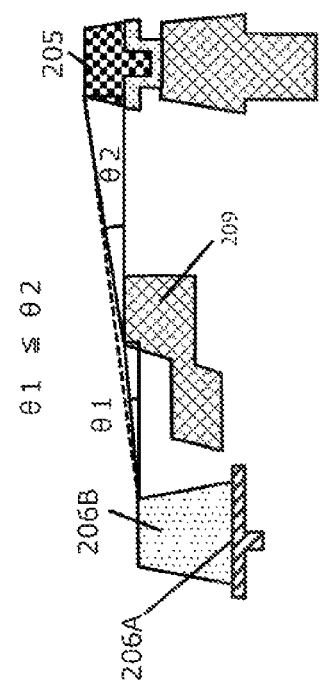
FIG. 1K is a diagram illustrating a mechanism of the semiconductor device for power amplification according to Embodiment 2.
Figure 1L:
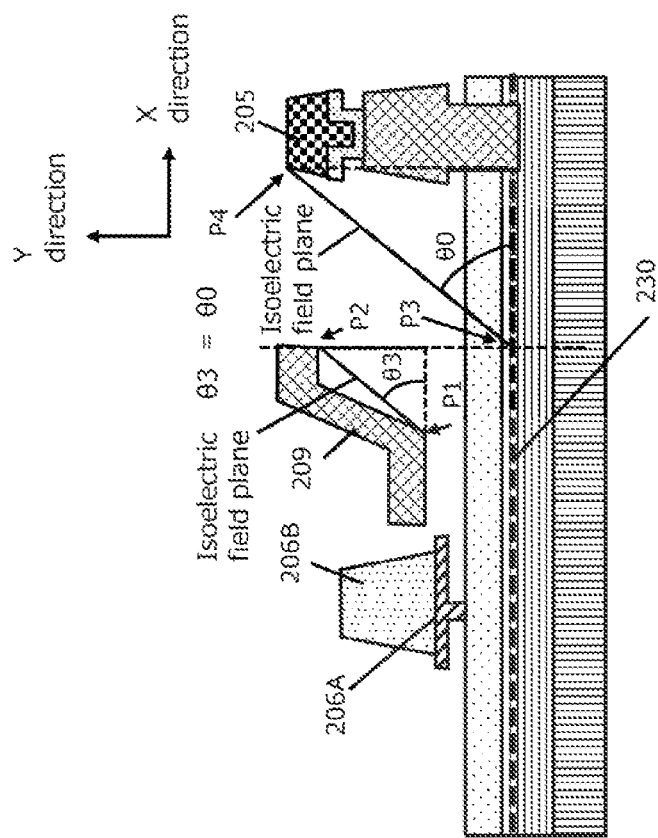
FIG. 1L is a diagram illustrating a mechanism of the semiconductor device for power amplification according to Embodiment 2.
Figure 1M:
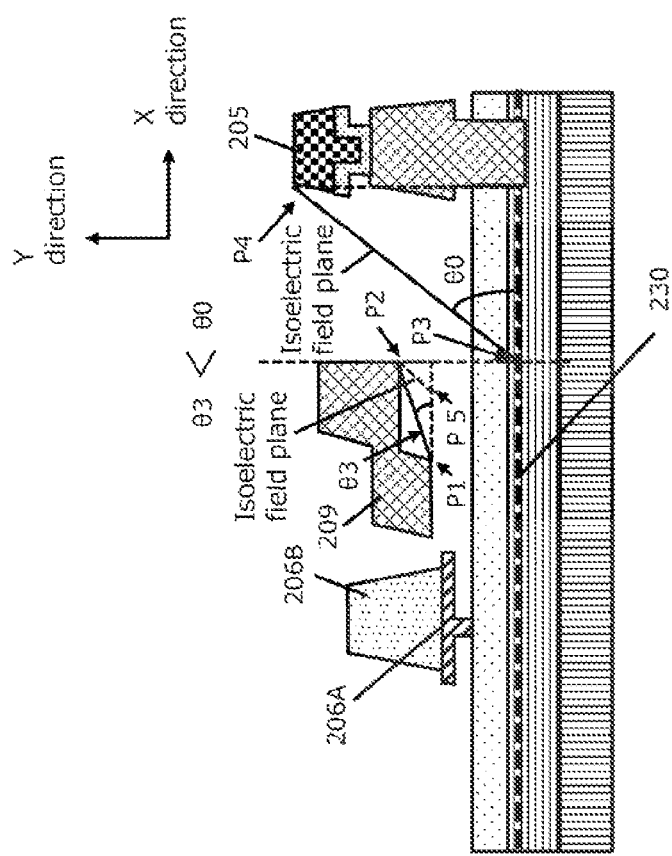
FIG. 1M is a diagram illustrating a mechanism of the semiconductor device for power amplification according to Embodiment 2.
Figure 1N:
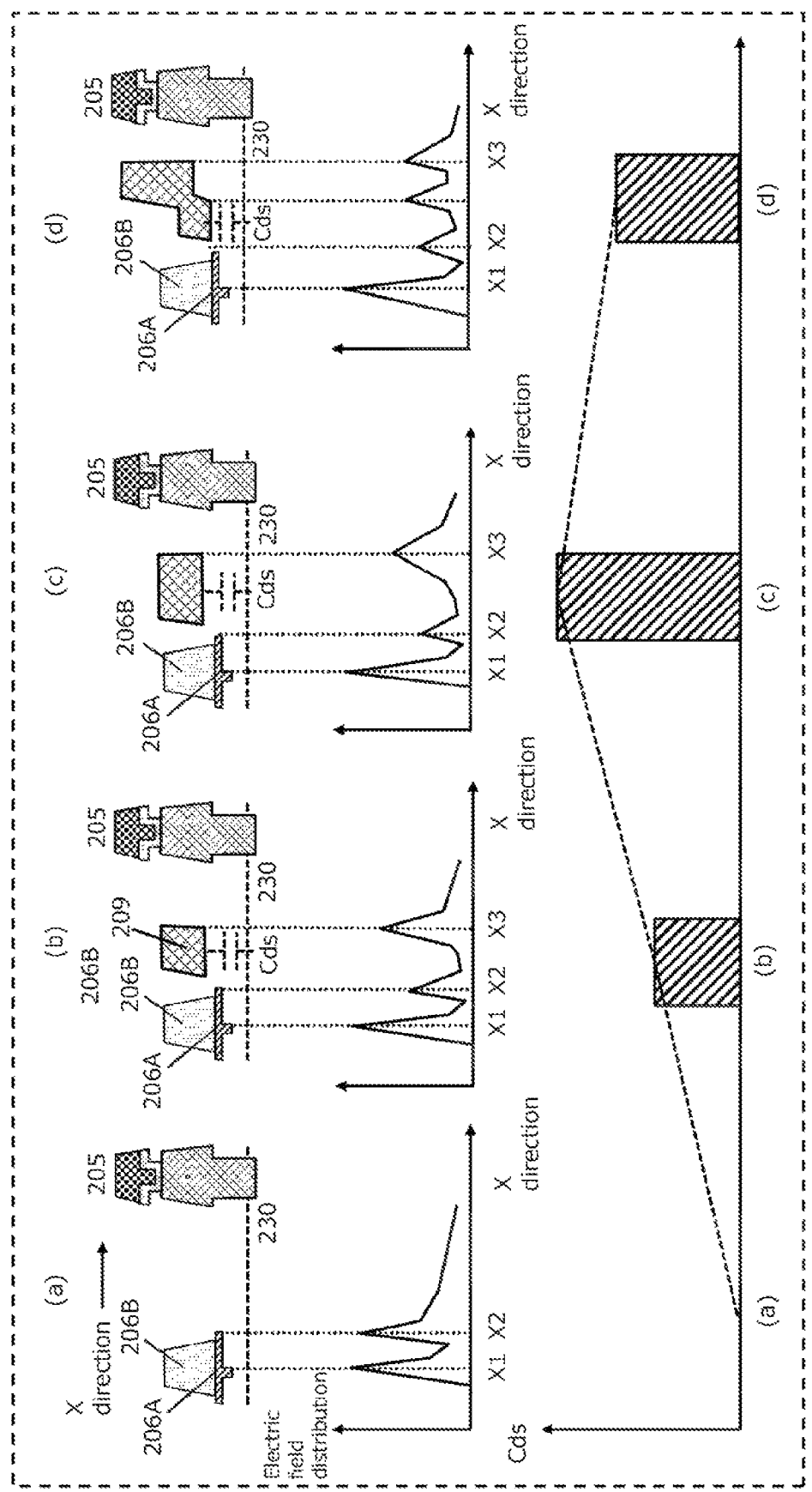
FIG. 1N is a diagram illustrating a mechanism of the semiconductor device for power amplification according to Embodiment 2.

FIG. 1N illustrates the comparison between the electric field distribution in the X direction and parasitic capacitance Cds generated between source field plate 209 and 2DEG surface 230 of semiconductor stack structure 220.

In FIG. 1N, (a) shows the case where there is no source field plate 209, (b) shows the case where source field plate 209 is disposed, (c) shows the case where source field plate 209 is extended in the X direction compared to (b) in FIG. 1N, and (d) shows the case where source field plate 209 has a staircase shape.

It is common to provide source field plate 209 as illustrated in (b) of FIG. 1N in order to relax the electric field at the drain-side edge portion (X2) of lower layer 206A. However, the electric field distributed from the drain-side edge portion of lower layer 206A now becomes a spread distribution with a peak on the drain-side (X3) of source field plate 209.

Therefore, the electric field relaxation effect at the drain-side edge portion (X2) of lower layer 206A is stronger as the length of source field plate 209 in the X direction increases as much as possible, as illustrated in (c) of FIG. 1N.

However, parasitic capacitance Cds increases due to the increased length of source field plate 209.

However, when source field plate 209 has a staircase shape as illustrated in (d) of FIG. 1N, the electric field peak at the drain-side edge portion on the lower surface of the source field plate is distributed to the drain-side edge portion (X3) of the lower surface of the second source field plate. At this time, the distance between 2DEG surface 230 and the lower surface of the second source field plate increases, and thus parasitic capacitance Cds is reduced compared to (c) in FIG. 1N.

In other words, the configuration according to the present embodiment achieves both the relaxation of the electric field and the reduction in parasitic capacitance Cds.

Next, the desired dimensions of source field plate 209 will be described with reference to FIG. 1B. More specifically, the conditions related to the X direction and the Y direction deduced from the mechanism of the effect of making the source field plate in a staircase shape will be described.

First, the length of source field plate 209 in the X direction will be explained.

This is about the relationship between LF1 and LF2, where LF1 is the length of the lower surface of the first source field plate and LF2 is the length of the lower surface of the second source field plate.

As previously described, in order to reduce parasitic capacitance Cds, LF1 that is in proximity to 2DEG surface 230 may be shortened. On the other hand, LF2 may be longer for the electric field relaxation at the end of the first source field plate drain. In other words, LF1<LF2 is desirable.

Next, the height of source field plate 209 in the Y direction will be described.

In FIG. 1B, the height of the uppermost surface of gate electrode 206 is denoted as HG, the height of the upper-edge position of the side surface of source field plate 209 that is in closest proximity to the gate side of the first source field plate is denoted as HS1, and the height of the upper-edge position of the side surface of source field plate 209 that is in closest proximity to the gate side of the second source field plate is denoted as HS2.

As described in Embodiment 1, HG>HS1 is satisfied.

In addition, when the gate-side edge position of the uppermost surface of drain electrode 205 is viewed from the drain-side edge position of the uppermost surface of gate electrode 206, it is shielded by source field plate 209. In other words, when shielded by source field plate 209, it is effective in reducing parasitic capacitance Cgd between the gate and drain electrodes. In other words, HS2>HG is desirable.

Next, the advantageous effect of shielding by the second source field plate will be described using an elevation angle.

Reference should be made to FIG. 1J and FIG. 1K. For the purpose of clarity, these diagrams illustrate the elevation angles when the gate-side edge position of the uppermost surface of drain electrode 205 is viewed from the drain-side edge position of the uppermost surface of gate electrode 206.

FIG. 1J illustrates the case where the second source field plate is relatively high and FIG. 1K illustrates the case where the second source field plate is relatively low.

In FIG. 1J, elevation angle $\theta 1$ which is the angle when the gate-side edge position of the uppermost surface of the second source field plate is viewed from the drain-side edge position of the uppermost surface of gate electrode 206 is greater than elevation angle $\theta 2$ which is the angle when the gate-side edge position of the uppermost surface of drain electrode 205 is viewed from the gate-side edge position of the uppermost surface of the second source field plate. In other words, when the above is expressed by using the elevation angles, $\theta 1 > \theta 2$ is satisfied. With this relationship, it is possible to strengthen the shielding effect.

On the other hand, FIG. 1K shows that, when a straight line connecting the drain-side edge position of the uppermost surface of gate electrode 206 to the gate-side edge position of the uppermost surface of the drain electrode is assumed to exist, the uppermost surface of the second source field plate does not block the line. In other words, when the above is expressed by using the elevation angles, θ1>θ2 is satisfied. This means that the shielding effect is weak. Therefore, θ1>θ2 is desirable.

Next, the conditions related to the height of the first source field plate and the second source field plate will be described with reference to FIG. 1L and FIG. 1M.

FIG. 1L is the case where the difference between the height of the first source field plate and the height of the second source field plate is large, and FIG. 1M is the case where the difference between the height of the first source field plate and the height of the second source field plate is small.

In the case where the desirable condition is expressed using the elevation angle, elevation angle θ3 that is the angle when the drain-side edge position of the lower surface of the second source field plate is viewed from the drain-side edge position of the lower surface of the first source field plate is smaller than elevation angle θ0 that is the angle when the gate-side edge position of the uppermost surface of the drain electrode is viewed from the interface position between the first nitride semiconductor layer and the second nitride semiconductor layer that is in closest proximity to the drain-side edge position of the lower surface of the second source field plate. In other words, θ3<θ0 is satisfied.

The reason for this will be described below.

In particular, in the high voltage region of the drain electrode, in 2DEG surface 230, the portion that is not depleted by source field plate 209 is the portion on the drain electrode 205 side from point P3 in FIG. 1L.

Point P3 is the intersection between 2DEG surface 230 and the line extending from the edge portion of source field plate 209 on the drain electrode side down to 2DEG surface 230.

The portion on the line (elevation angle θ0) that connects point P3 and point P4 on a gate-side edge position of an uppermost surface of the drain electrode was found to be an isoelectric field as a result of the calculation.

Using this isoelectric field line as a reference line, the portion on the line that connects points P1 and P2 of source field plate 209 that is parallel to the isoelectric field line is also an isoelectric field. Point P1 indicates the drain-side edge portion of the lower section of source field plate 209, and point P2 indicates the drain-side edge portion of the upper section of source field plate 209.

In other words, point P1 at which the field effect peak is desired to be lowered is in the same electric field as point P2, which means that the electric field relaxation at point P1 is insufficient.

On the other hand, in FIG. 1M, the line including point P2 that is parallel to the reference line connecting point P3 and point P4 is the line connecting point P2 and point P5 in the diagram, and the portion on the line is an isoelectric field.

Point P1 at which the electric field relaxation is desired appears to be further back (farther away) than the line connecting the above-described point P2 and point P5, when viewed from the above-described reference line, i.e., point P1 has a lower electric field than point P2. Point P2 is in a state of electric field relaxation of point P1. This is the preferred shape condition in terms of electric field relaxation for source field plate 209. When this condition is expressed in terms of elevation angle, θ3<θ0 is satisfied.

It should be noted that source field plate 209 may have a configuration in which the first source field plate (209A) and the second source field plate (209B) are separated, as illustrated in FIG. 1C Embodiment 3

FIG. 1D is a cross-sectional view of semiconductor device for power amplification 11B illustrating a configuration of a semiconductor device for power amplification according to Embodiment 3.

As illustrated in FIG. 1D, semiconductor device for power amplification 11B includes: substrate 200; semiconductor stack structure 220; source electrode 204; drain electrode 205; gate electrode 206; source field plate 209 including lower layer metal 209C and upper layer metal 209D; insulating film 203A; insulating film 203B; and insulating film 208B.

In the method of forming source field plate 209 that has been described in Embodiment 1 and Embodiment 2, the first source field plate and the second source field plate of source field plate 209 have the same metal film thickness in terms of the manufacturing method. This configuration can be easily formed by adding one more process to deposit a metal only on the second source field plate.

For example, a metal in which three layers of TiN, AL, and TiN are deposited is used as lower layer metal 209C, and low-resistance metal AL is used as upper layer metal 209D.

Since lower layer metal 209C also need to have low resistance in its role as a source field plate, it is desirable that AL of lower layer metal 209C has a thickness greater than or equal to 300 nm.

Features and Advantageous Effect

The above-described FIG. 1D shows a feature of the configuration that a metal layer having electrical resistivity lower than the electrical resistivity of the second source field plate is provided only above the second source field plate.

With the configuration of a low metal height of the first source field plate, parasitic capacitance Cgs between the side surface of upper layer 206B of the gate metal and source field plate 209 is reduced.

On the other hand, the increased thickness of the metal of the second source field plate provides source field plate 209 having a low resistance.

As the resistance of source field plate 209 is lowered, the ground to source electrode 204 becomes stronger, and thus a high gain feature and a high efficiency feature are obtained.

As can be seen from FIG. 1D, lower layer metal 209C is deposited above the step created by insulating film 203A and insulating film 203B.

In general, the metal deposited on a flat portion of the step is of better quality as being denser and having lower electrical resistance, than the metal deposited on a sidewall portion of the step.

For this reason, when the thickness of lower layer metal 209C is increased in order to lower the resistance of source field plate 209, thickening the metal film thickness in the sidewalls portion is less effective, and it is better to increase the thickness of only flat portion that has a good quality. For this reason, upper layer metal 209D that is a thick-film low-resistance metal is additionally deposited only on the upper section of the second source field plate.

It should be noted that lower layer metal 209C and upper layer metal 209D need not necessarily be dissimilar metals as described above, but may be the same metal.

For example, after first depositing a metal that comprises AL on lower layer metal 209C, AL may be deposited again as upper layer metal 209D.

Embodiment 4

FIG. 1B is a cross-sectional view of semiconductor device for power amplification 11 illustrating a configuration of a semiconductor device for power amplification according to Embodiment 4.

As illustrated in FIG. 1B, semiconductor device for power amplification 11 includes: substrate 200; semiconductor stack structure 220; source electrode 204; drain electrode 205; gate electrode 206; source field plate 209; insulating film 203A; insulating film 203B; and insulating film 208B.

Table 1 shows the combination of insulating films 203B and 208B for semiconductor device for power amplification 11.

TABLE 1

| Combination | A | B | C |
|---|---|---|---|
| Insulating film 208B | $Si_3N_4$ | $Si_3N_4$ | $SiO_2$ |
| Insulating film 203B | $Si_3N_4$ | $SiO_2$ | $Si_3N_4$ |

Insulating films 203B and 208B that have been described regarding the configurations of the semiconductor device for power amplification according to Embodiments 2 and 3 are the case of combination A of insulating films indicated in Table 1 in which insulating film 203B of the lower layer comprises $Si_3N_4$ and insulating film 208B of the upper layer comprises $Si_3N_4$.

However, the insulating film need not necessarily comprises $Si_3N_4$. The insulating film may comprise $SiO_2$ that has a lower dielectric constant. In general, the relative dielectric constant of $Si_3N_4$ is approximately 7 and the relative dielectric constant of $SiO_2$ is approximately 4, and thus the insulating film that comprises $SiO_2$ is an insulating film that has a lower dielectric constant. Another low-dielectric insulating film is the insulating film that comprises SiON which is a mixture of O and N, and is also a candidate for a low-dielectric constant film. In this Description, $SiO_2$ is used as an example.

Embodiment 4 describes the case of insulating film combination B indicated in Table 1, where only the above-described lower layer insulating film 203B is changed to comprise $SiO_2$. The manufacturing method is the same as the method of Embodiment 2 described with reference to FIG. 3A to FIG. 3R, and the description will be omitted. Deposition temperature conditions and etching time conditions occur according to a change in the film quality, but it is sufficient if general deposition and etching conditions for $Si_3N_4$ and $SiO_2$ are used.

Features and Advantageous Effect

This configuration (FIG. 1B and combination B indicated in Table 1) yields advantageous effect of allowing further reduction in parasitic capacitance Cds between the second source field plate and 2DEG surface 230.

It should be noted that the same advantageous effect as the above-described advantageous effect can be obtained even when insulating film 203B comprises $Si_3N_4$ and insulating film 208B comprises $SiO_2$, as in insulating film combination C indicated in Table 1 of FIG. 1B.

Embodiment 5

FIG. 1E is a cross-sectional view of semiconductor device for power amplification 11C illustrating a configuration of a semiconductor device for power amplification according to Embodiment 5.

As illustrated in FIG. 1E, semiconductor device for power amplification 11C includes: substrate 200; semiconductor stack structure 220; source electrode 204; drain electrode 205; gate electrode 206; source field plate 209; insulating film 203A; insulating film 203B; insulating film 203C; and insulating film 208B.

In Embodiment 5, another manufacturing method that is different from the manufacturing method for the configuration of the source field plate having a staircase shape illustrated in Embodiment 2 will be first described.

This manufacturing method is known as a sidewall process. This manufacturing method is often employed in the case of forming fine gate dimensions as small as 0.25 μm or less without the use of an electron beam (EB) lithography method which has poor manufacturing throughput and is expensive.

Figure 4A:
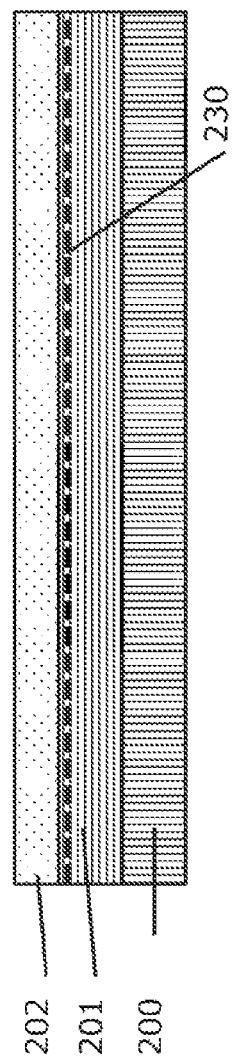
FIG. 4A is a cross-sectional view illustrating a configuration of a semiconductor device for power amplification according to Embodiment 5 in the process of manufacturing.
Figure 4B:
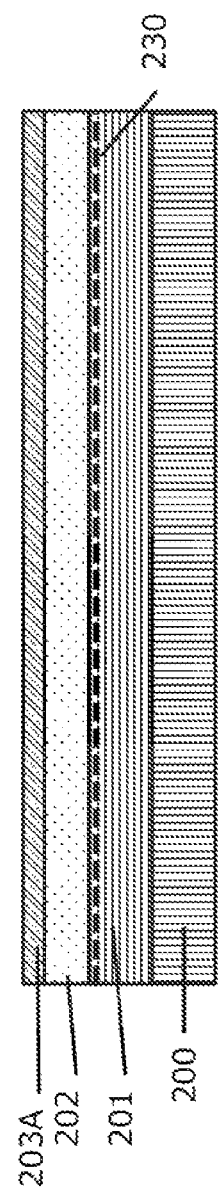
FIG. 4B is a cross-sectional view illustrating a configuration of the semiconductor device for power amplification according to Embodiment 5 in the process of manufacturing.
Figure 4C:
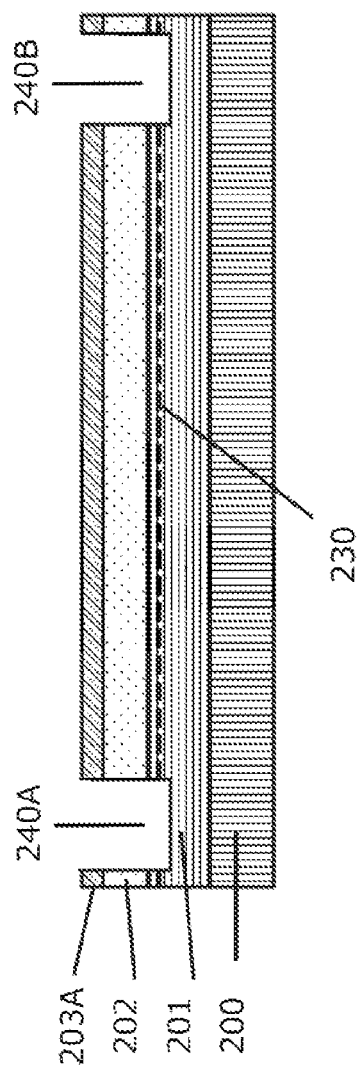
FIG. 4C is a cross-sectional view illustrating a configuration of the semiconductor device for power amplification according to Embodiment 5 in the process of manufacturing.
Figure 4D:
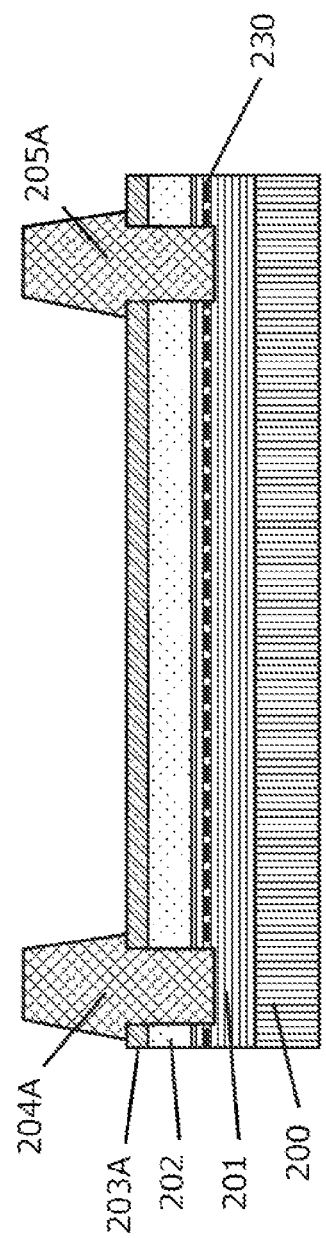
FIG. 4D is a cross-sectional view illustrating a configuration of the semiconductor device for power amplification according to Embodiment 5 in the process of manufacturing.
Figure 4F:
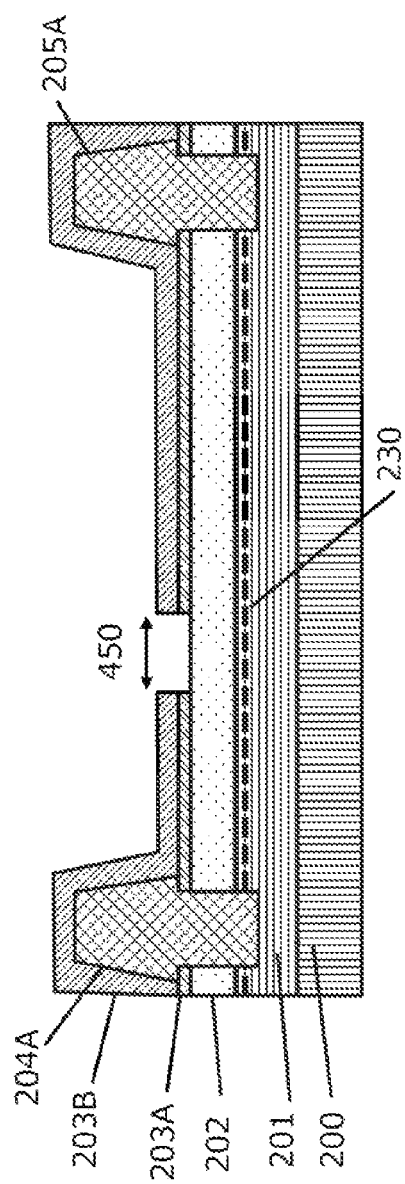
FIG. 4F is a cross-sectional view illustrating a configuration of the semiconductor device for power amplification according to Embodiment 5 in the process of manufacturing.
Figure 4G:
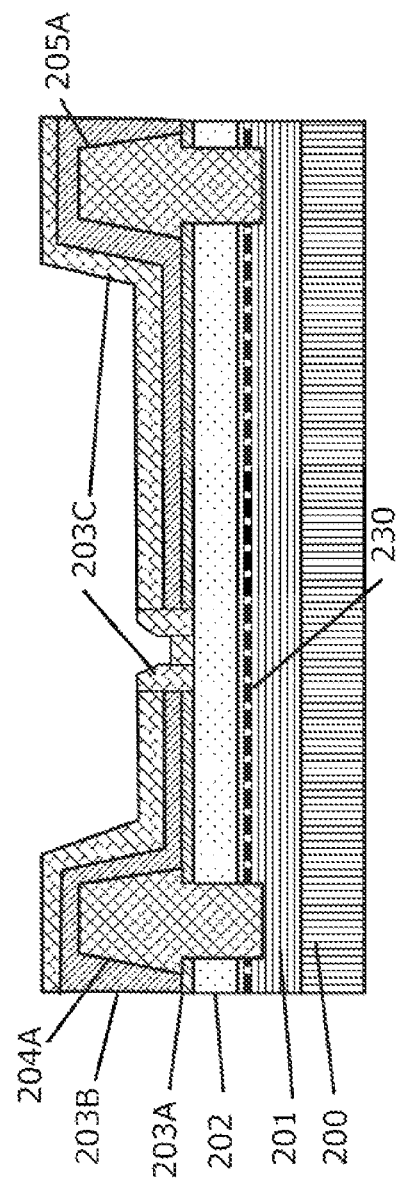
FIG. 4G is a cross-sectional view illustrating a configuration of the semiconductor device for power amplification according to Embodiment 5 in the process of manufacturing.
Figure 4H:
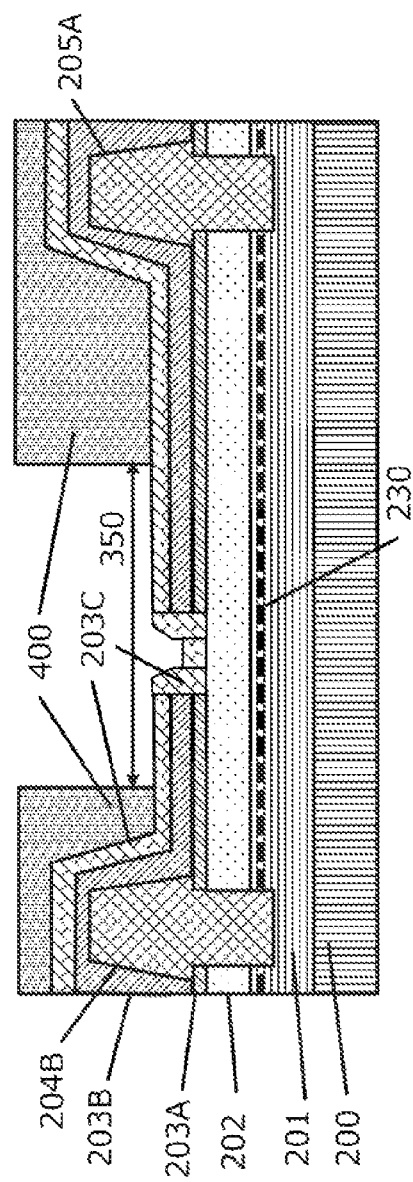
FIG. 4H is a cross-sectional view illustrating a configuration of the semiconductor device for power amplification according to Embodiment 5 in the process of manufacturing.
Figure 4J:
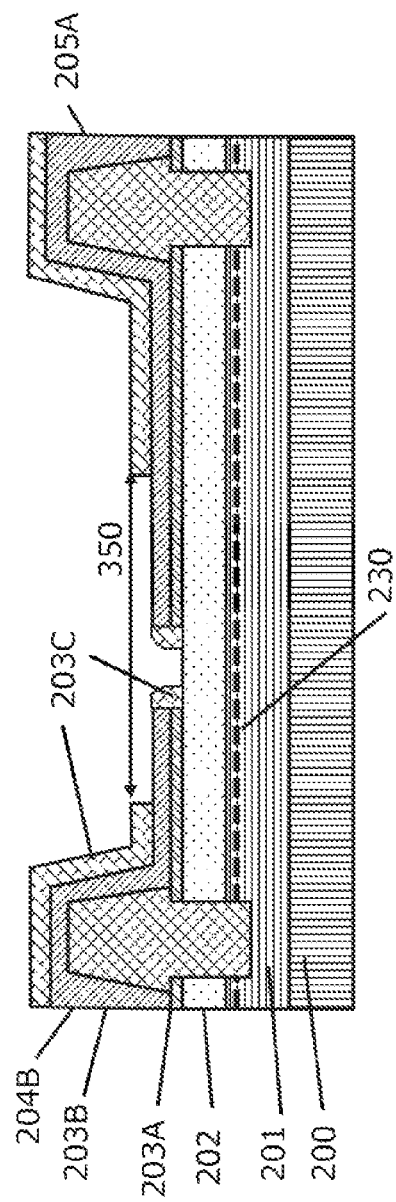
FIG. 4J is a cross-sectional view illustrating a configuration of the semiconductor device for power amplification according to Embodiment 5 in the process of manufacturing.
Figure 4K:
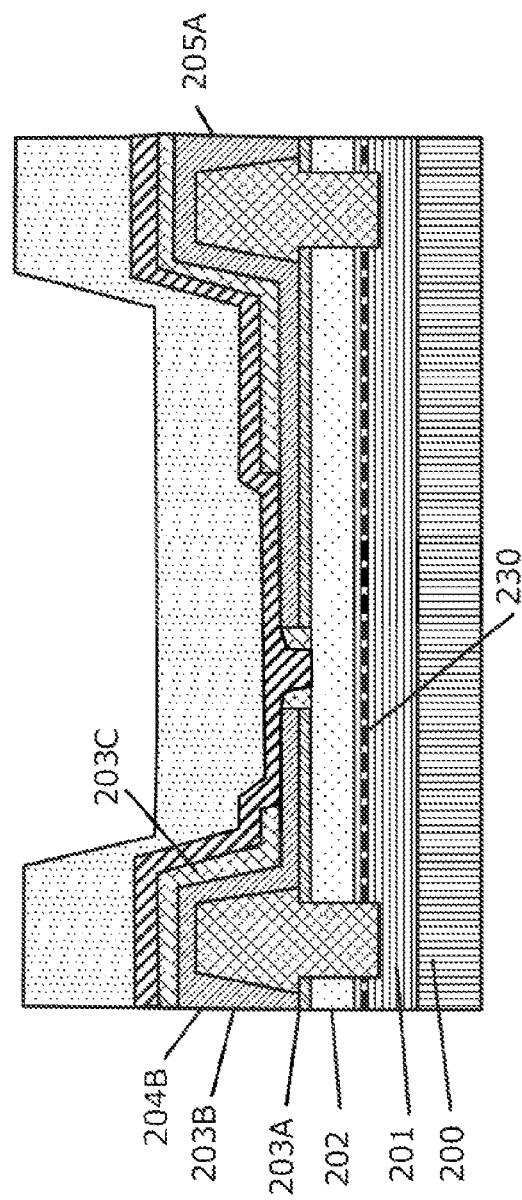
FIG. 4K is a cross-sectional view illustrating a configuration of the semiconductor device for power amplification according to Embodiment 5 in the process of manufacturing.
Figure 4L:
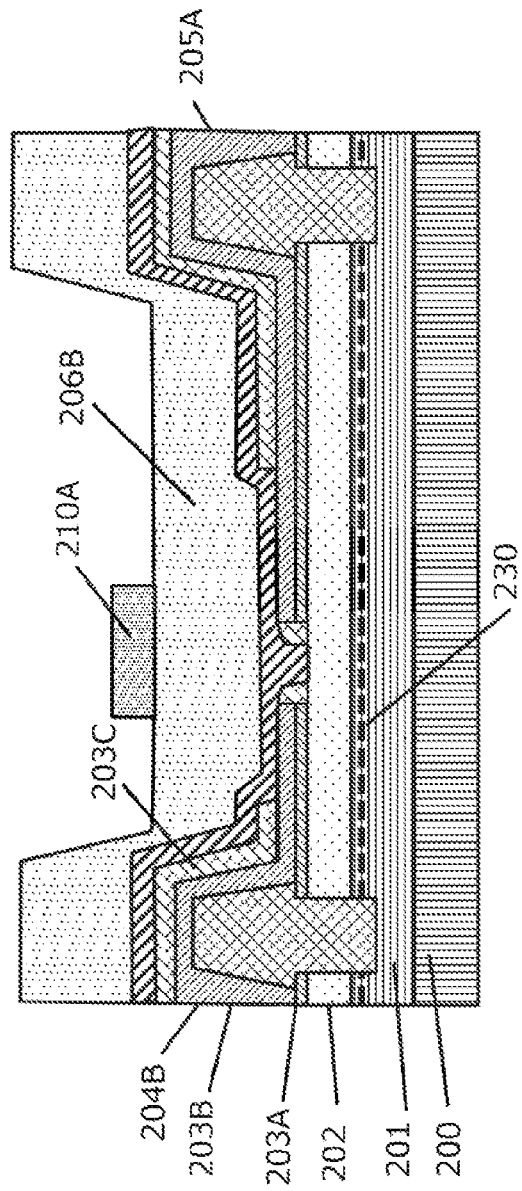
FIG. 4L is a cross-sectional view illustrating a configuration of the semiconductor device for power amplification according to Embodiment 5 in the process of manufacturing.
Figure 4N:
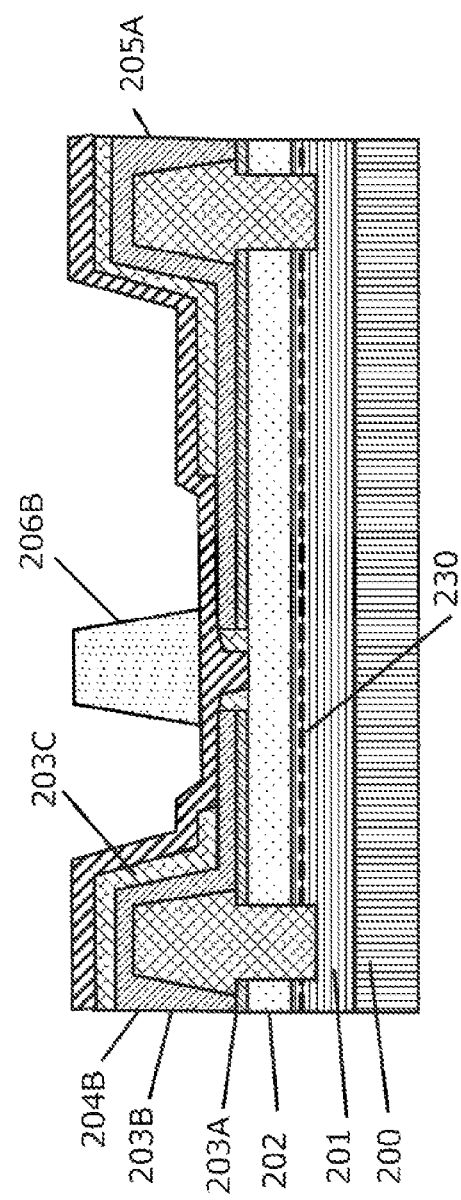
FIG. 4N is a cross-sectional view illustrating a configuration of the semiconductor device for power amplification according to Embodiment 5 in the process of manufacturing.
Figure 40:
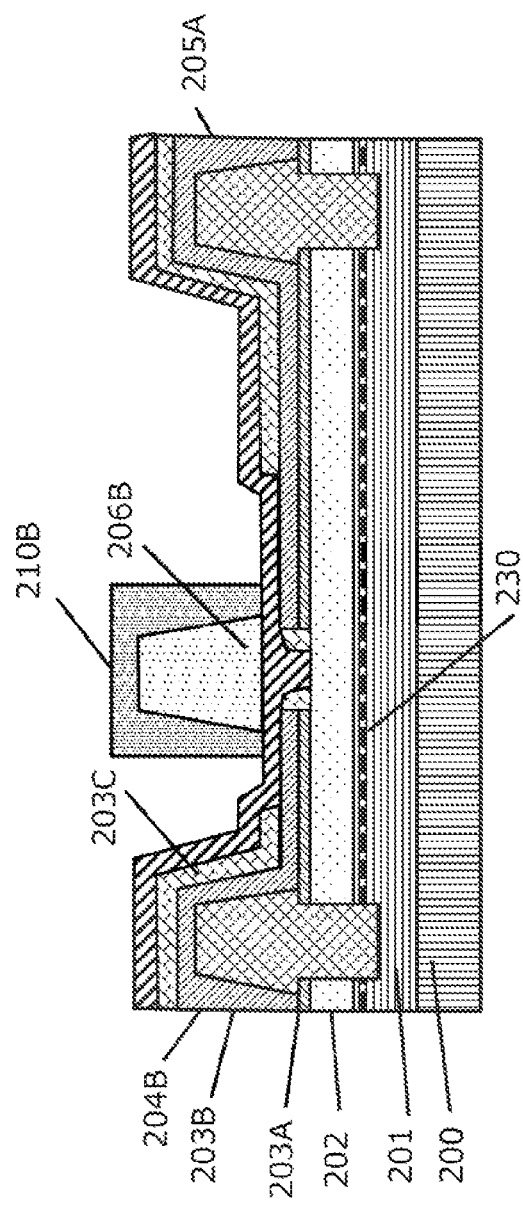
Figure 4P:
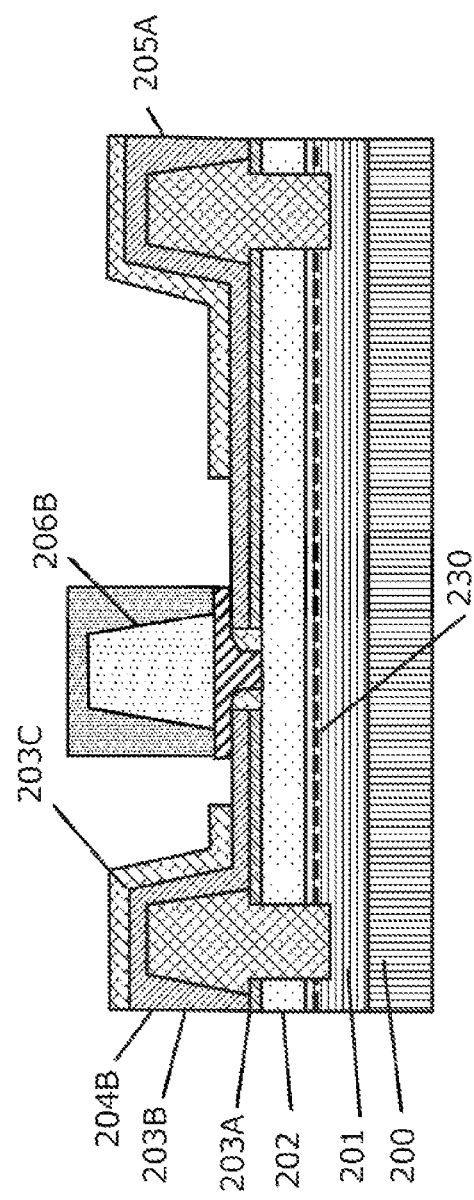
FIG. 4P is a cross-sectional view illustrating a configuration of the semiconductor device for power amplification according to Embodiment 5 in the process of manufacturing.
Figure 4Q:
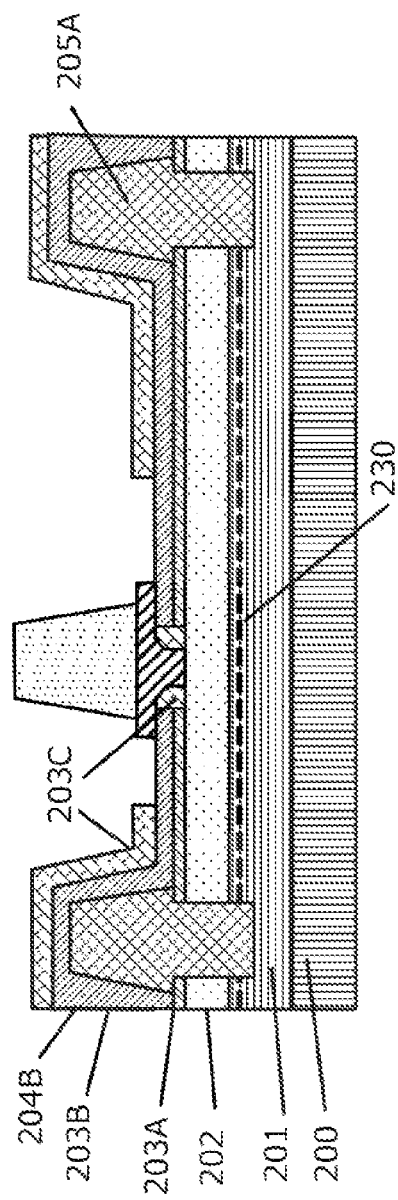
FIG. 4Q is a cross-sectional view illustrating a configuration of the semiconductor device for power amplification according to Embodiment 5 in the process of manufacturing.
Figure 4R:
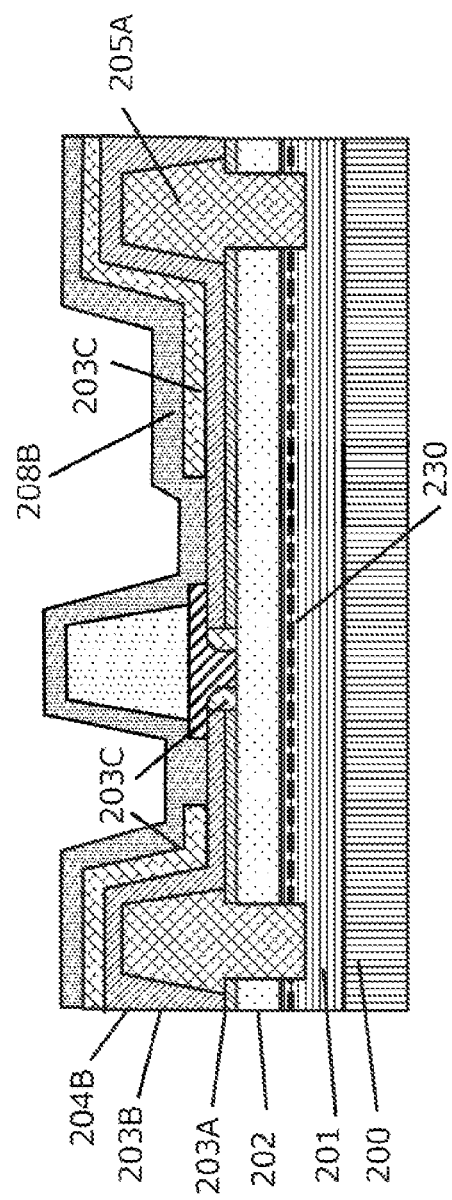
FIG. 4R is a cross-sectional view illustrating a configuration of the semiconductor device for power amplification according to Embodiment 5 in the process of manufacturing.
Figure 4S:
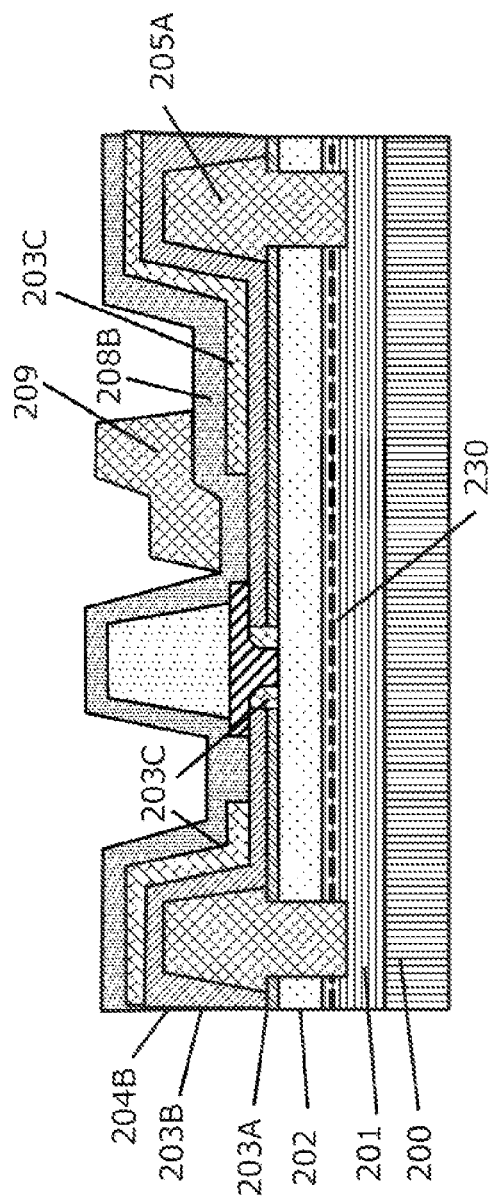
FIG. 4S is a cross-sectional view illustrating a configuration of the semiconductor device for power amplification according to Embodiment 5 in the process of manufacturing.
Figure 4T:
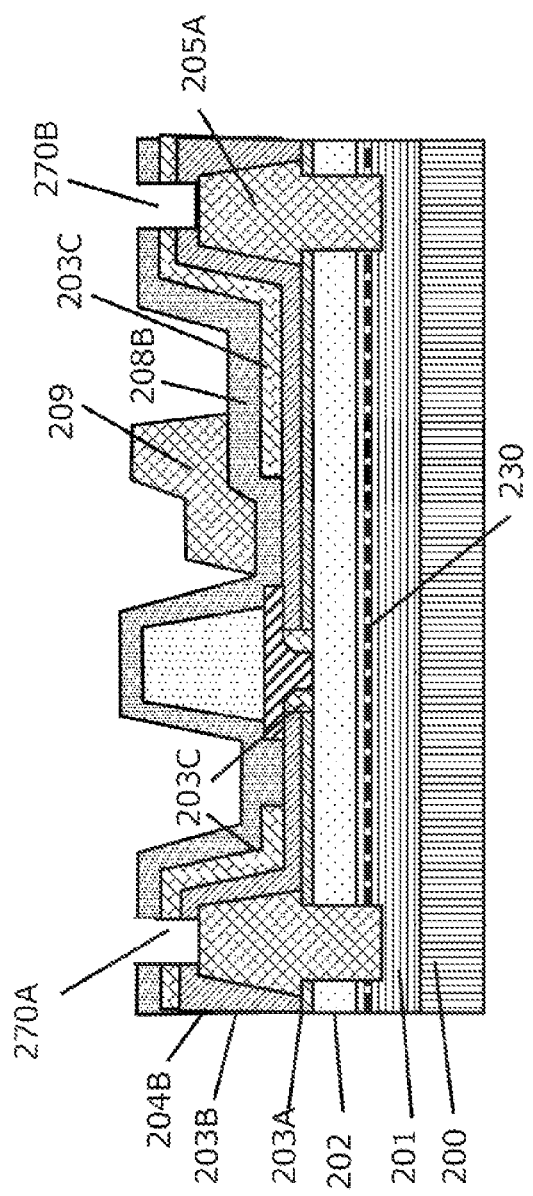
FIG. 4T is a cross-sectional view illustrating a configuration of the semiconductor device for power amplification according to Embodiment 5 in the process of manufacturing.
Figure 4U:
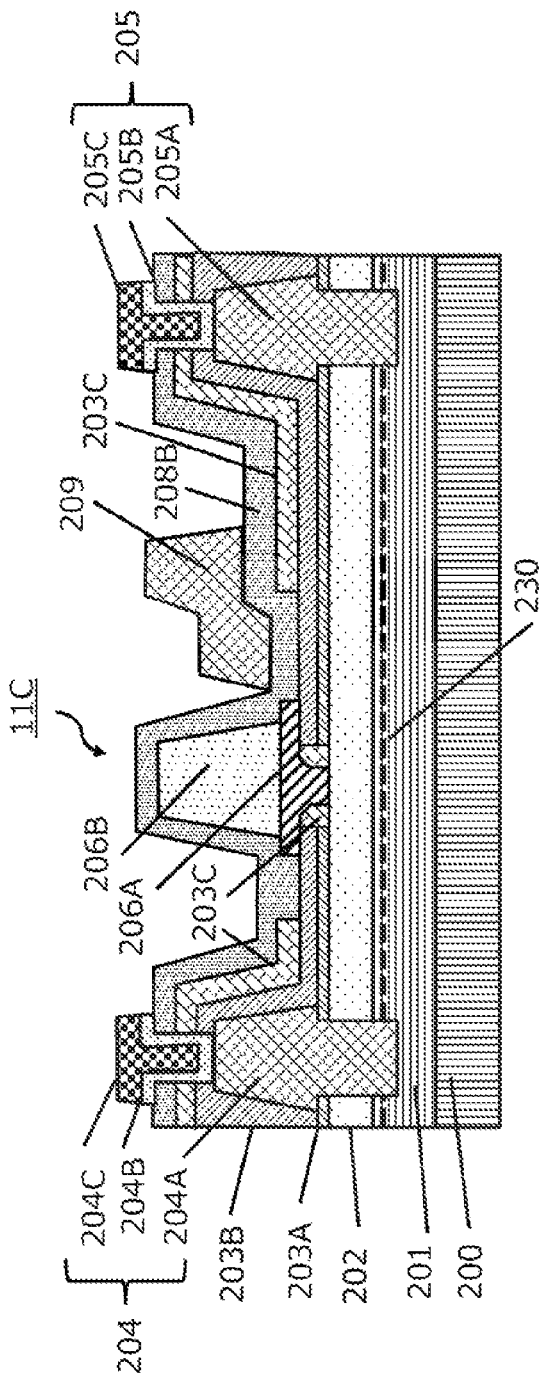
FIG. 4U is a cross-sectional view illustrating a configuration of the semiconductor device for power amplification according to Embodiment 5 in the process of manufacturing.

The following provides the description with reference to FIG. 4A to FIG. 4U.

FIG. 4A to FIG. 4U are each a cross-sectional view illustrating the configuration of semiconductor device for power amplification 11C in the process of manufacturing.

The processes illustrated up to FIG. 4E are the same as the processes of the manufacturing method from FIG. 2A to FIG. 2E that have already been described, and thus the description will be omitted.

As illustrated in FIG. 4F, opening 450 is formed in the region in which gate electrode 206 is to be formed, by performing patterning with photoresist, and successively etching insulating film 203B and insulating film 203A. At this time, this process is performed until the outermost surface of semiconductor stack structure 220 is exposed.

Next, insulating film 203C is deposited over the entire surface as illustrated in FIG. 4G. A wall portion (wall) of insulating film 203C is formed on the side surface (side) of opening 450.

Next, as illustrated in FIG. 4H, resist mask 400 is formed such that the region in which gate electrode 206 is to be formed is opened.

Next, as illustrated in FIG. 4I, resist mask 400 is used to etch insulating film 203C until the surface of insulating film 203B is exposed. At this time, as illustrated in FIG. 4I, only the wall portion (wall) of insulating film 203C on the side surfaces (sides) of insulating film 203B and insulating film 203A in opening 450 remain. The dimension between the side walls is smaller by the wall than the original dimensions of opening 450.

As described above, the sidewall process is a manufacturing method that achieves the miniaturized dimensions.

The shape as that illustrated in FIG. 4J is formed by removing resist mask 400 with an organic solvent.

Next, as illustrated in FIG. 4K to FIG. 4Q, gate electrode 206 is formed by the same manufacturing method as the manufacturing method that has been already described with reference to FIG. 2H to FIG. 2N.

Next, as illustrated in FIG. 4R, insulating film 208B is deposited over the entire surface.

Next, as illustrated in FIG. 4S, source field plate 209 is deposited using the method that has been already described.

Then, as illustrated in FIG. 4T to FIG. 4U, source electrode 204 and drain electrode 205 are formed by the same manufacturing method as the manufacturing method described with reference to FIG. 2Q to FIG. 2R of Embodiment 1, and this completes semiconductor device for power amplification 11C.

Features and Advantageous Effect

Table 2 illustrates an example of the combinations of insulating film 208B and insulating film 203C.

TABLE 2

| Combination | D | E |
|---|---|---|
| Insulating film 208B | $Si_3N_4$ | $Si_3N_4$ |
| Insulating film 203C | $Si_3N_4$ | $SiO_2$ |

The case where insulating film 203C that is the lower layer comprises $Si_3N_4$ and insulating film 208B that is the upper comprises $Si_3N_4$ as in insulating film combination D indicated in Table 2 provides, as a result, a second manufacturing method that forms a configuration that is not different from but is the same as that of combination A indicated in Table 1 of FIG. 1B that has been already described in Embodiment 2.

On the other hand, in the case where insulating film 203C that is the lower layer comprises $SiO_2$ and insulating film 208B that is the upper comprises $Si_3N_4$ as in insulating film combination E indicated in Table 2, the side surface (sidewall portion) of gate electrode 206 comprises the same material as that of insulating film 203C in terms of the manufacturing method, and thus $SiO_2$ is formed on the side surface of gate electrode 206.

With this configuration, parasitic capacitances Cgs and Cgd related to the gate electrode are reduced, and thus it is possible to obtain high gain.

Embodiment 6

FIG. 1F is a cross-sectional view of semiconductor device for power amplification 11D illustrating a configuration of a semiconductor device for power amplification according to Embodiment 6.

As illustrated in FIG. 1F, semiconductor device for power amplification 11D includes: substrate 200; semiconductor stack structure 220; source electrode 204; drain electrode 205; gate electrode 206; source field plate 209; insulating film 203A; insulating film 203B; and insulating film 208C. Insulating film 203A corresponds to the first insulating layer, and insulating film 208C corresponds to the second insulating layer.

Next, the manufacturing method of semiconductor device for power amplification 11D will be described with reference to FIG. 5A to FIG. 5U.

Figure 5A:
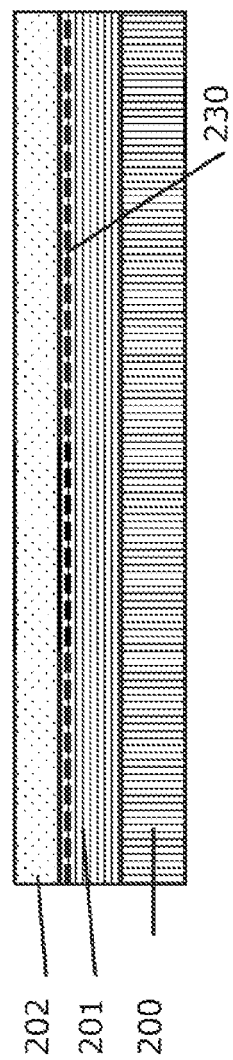
FIG. 5A is a cross-sectional view illustrating a configuration of the semiconductor device for power amplification according to Embodiment 6 in the process of manufacturing.
Figure 5B:
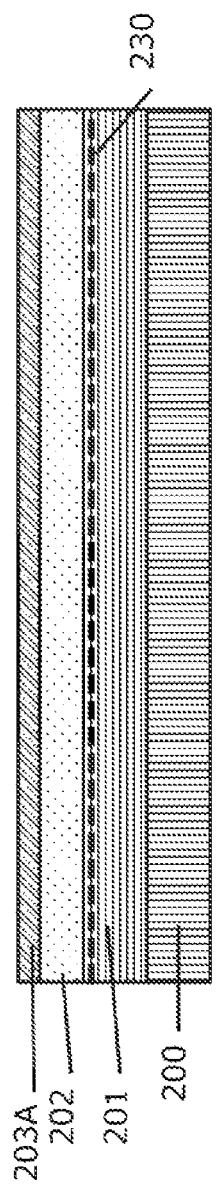
FIG. 5B is a cross-sectional view illustrating a configuration of the semiconductor device for power amplification according to Embodiment 6 in the process of manufacturing.
Figure 5C:
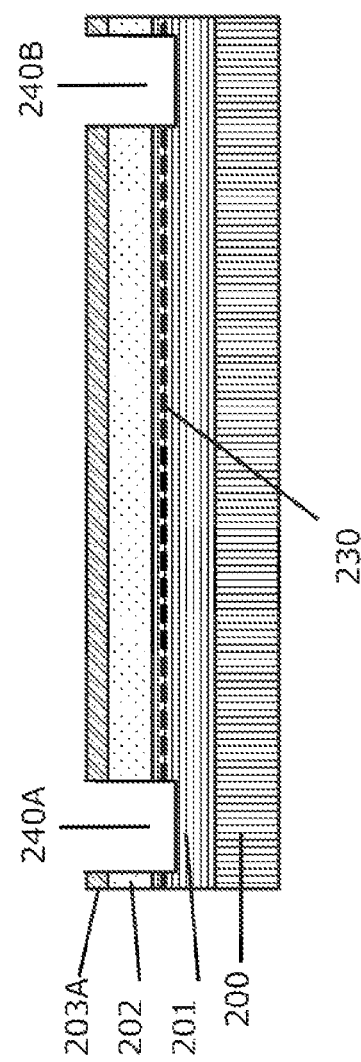
FIG. 5C is a cross-sectional view illustrating a configuration of the semiconductor device for power amplification according to Embodiment 6 in the process of manufacturing.
Figure 5D:
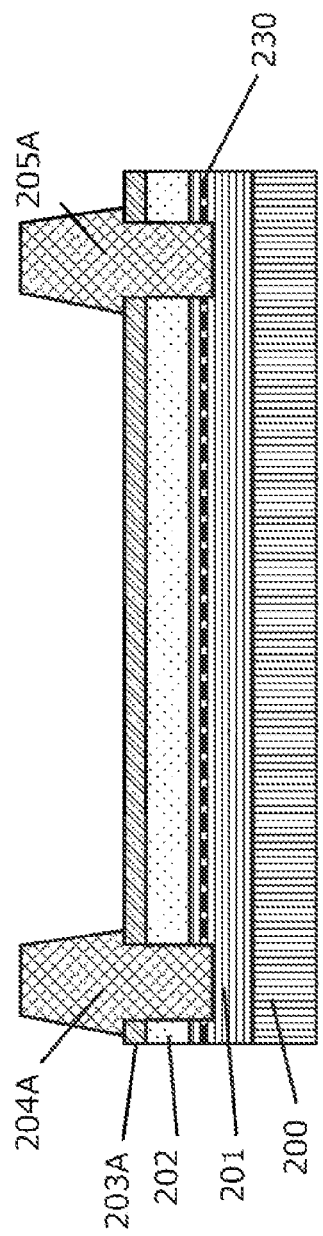
FIG. 5D is a cross-sectional view illustrating a configuration of the semiconductor device for power amplification according to Embodiment 6 in the process of manufacturing.
Figure 5E:
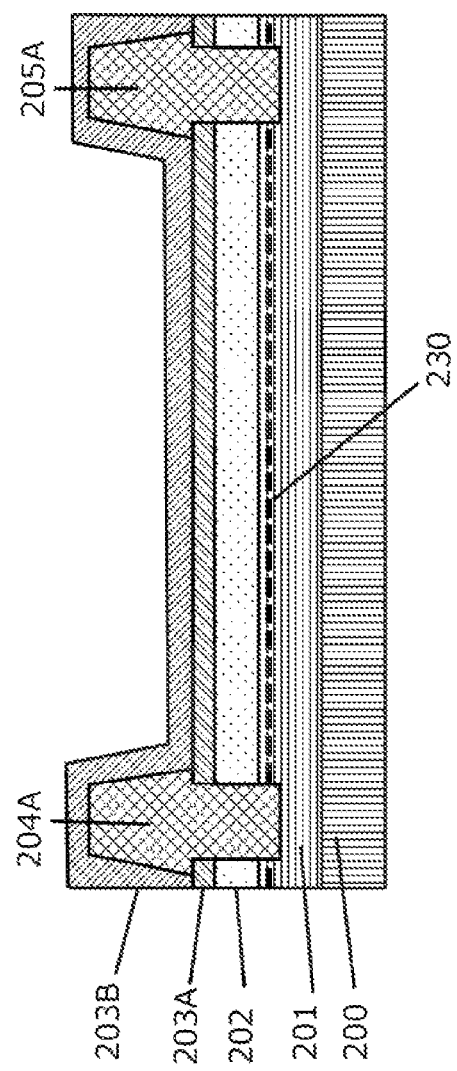
FIG. 5E is a cross-sectional view illustrating a configuration of the semiconductor device for power amplification according to Embodiment 6 in the process of manufacturing.
Figure 5F:
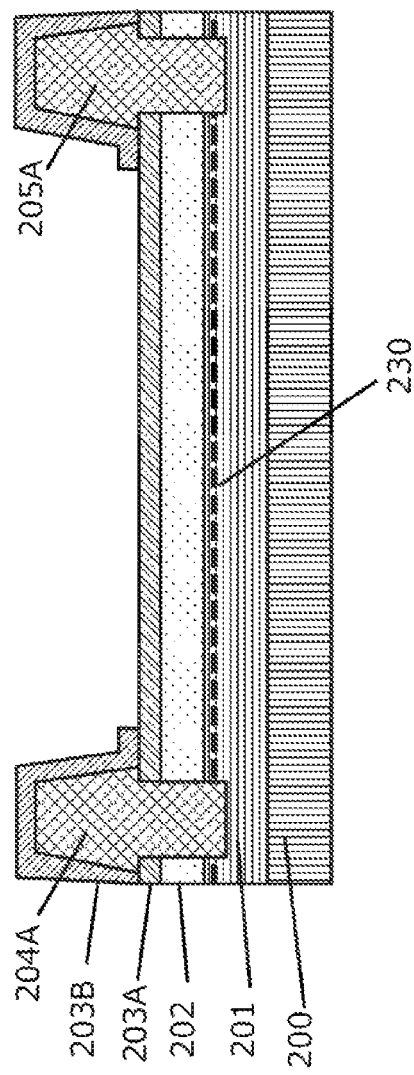
FIG. 5F is a cross-sectional view illustrating a configuration of the semiconductor device for power amplification according to Embodiment 6 in the process of manufacturing.
Figure 5G:
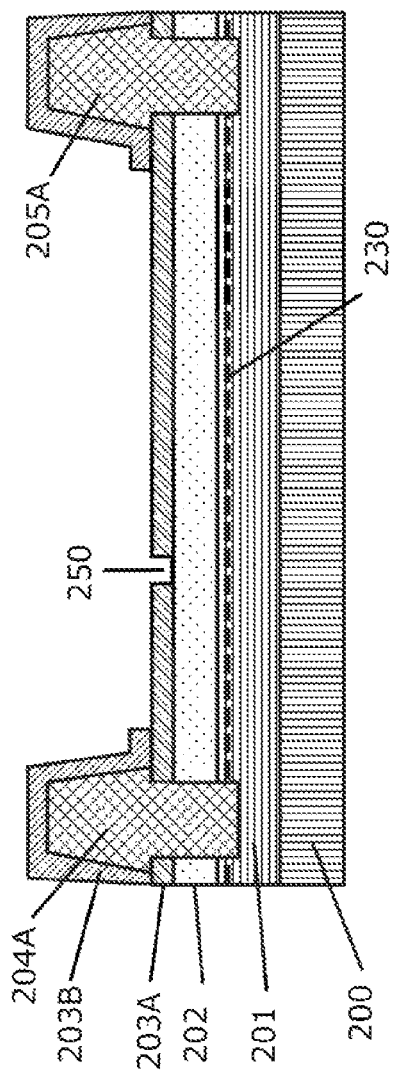
FIG. 5G is a cross-sectional view illustrating a configuration of the semiconductor device for power amplification according to Embodiment 6 in the process of manufacturing.
Figure 5H:
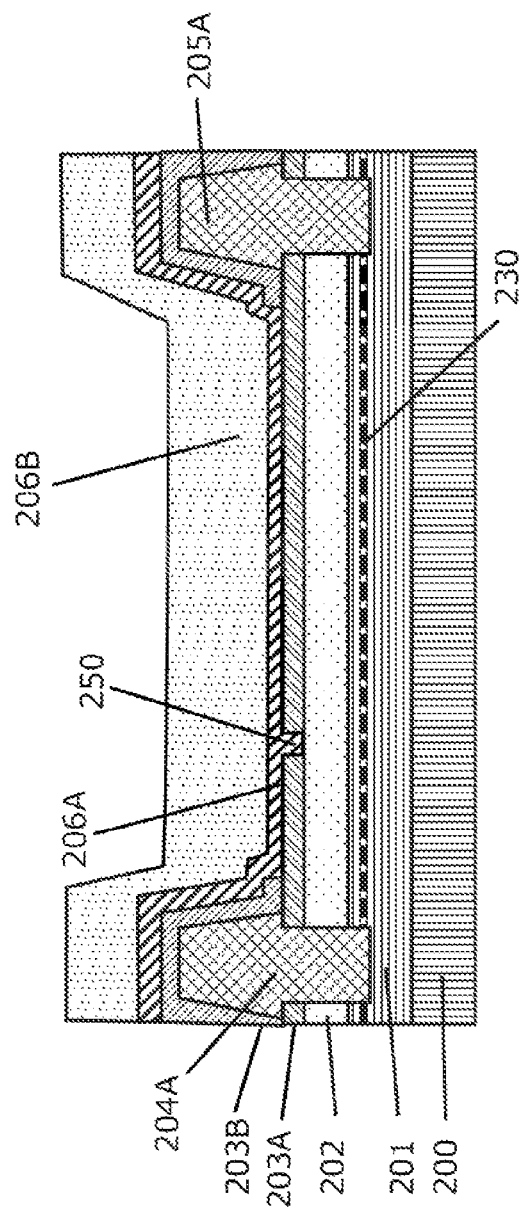
FIG. 5H is a cross-sectional view illustrating a configuration of the semiconductor device for power amplification according to Embodiment 6 in the process of manufacturing.
Figure 5I:
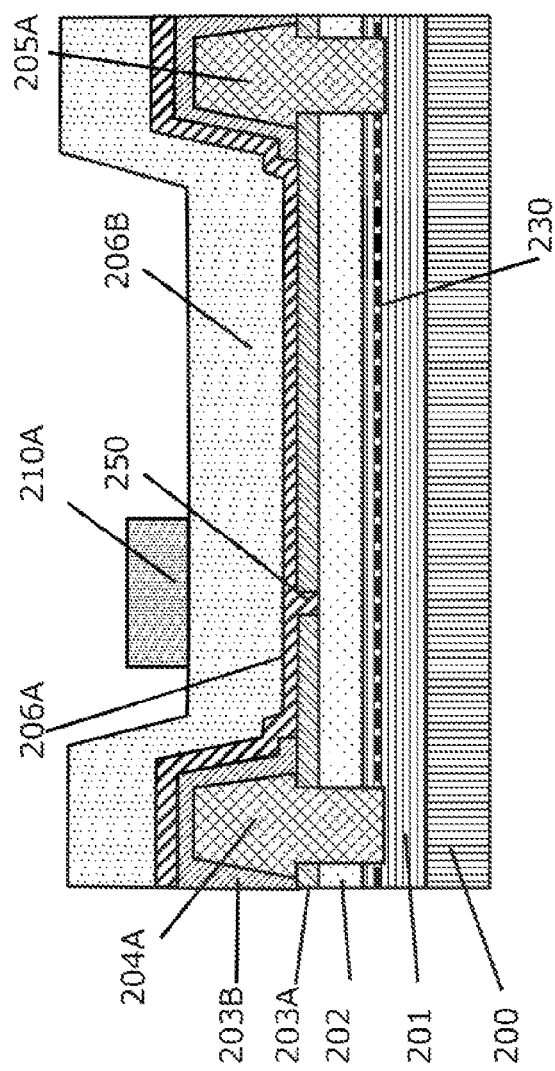
FIG. 5I is a cross-sectional view illustrating a configuration of the semiconductor device for power amplification according to Embodiment 6 in the process of manufacturing.
Figure 5J:
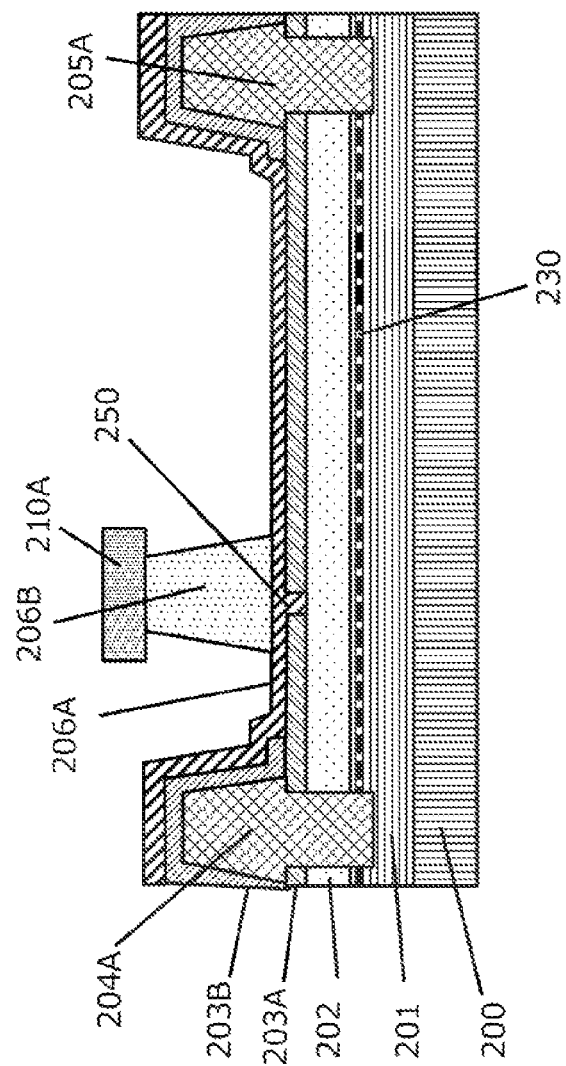
FIG. 5J is a cross-sectional view illustrating a configuration of the semiconductor device for power amplification according to Embodiment 6 in the process of manufacturing.
Figure 5K:
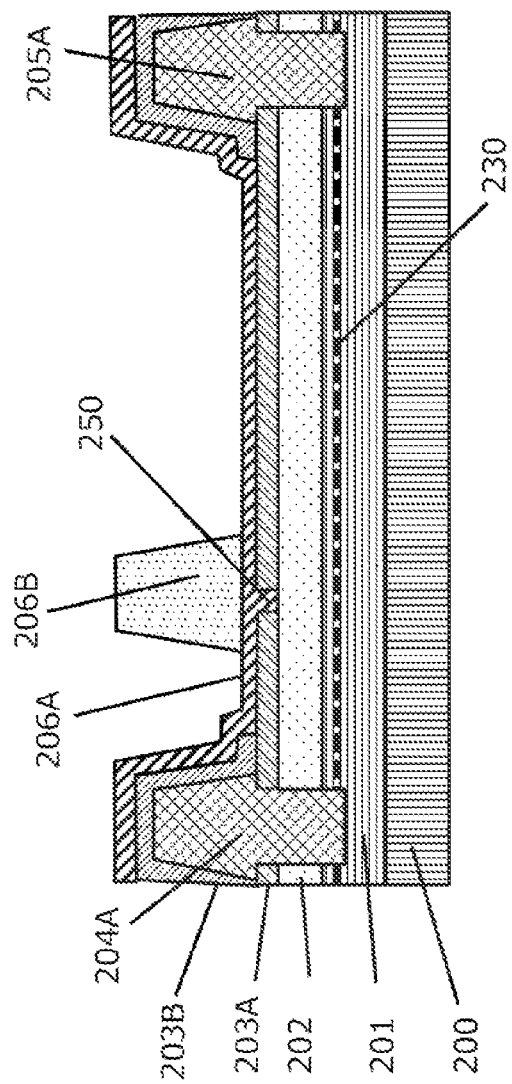
FIG. 5K is a cross-sectional view illustrating a configuration of the semiconductor device for power amplification according to Embodiment 6 in the process of manufacturing.
Figure 5L:
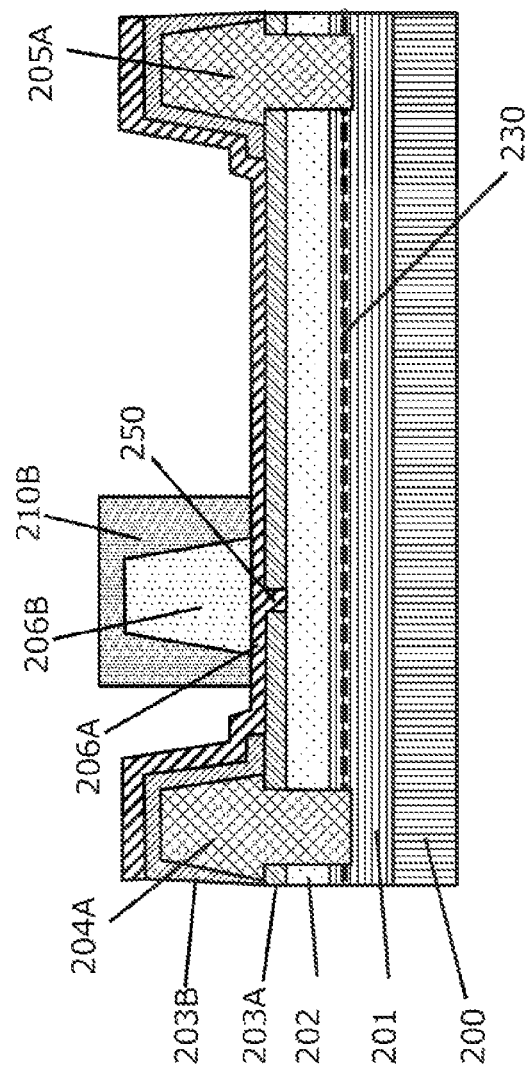
FIG. 5L is a cross-sectional view illustrating a configuration of the semiconductor device for power amplification according to Embodiment 6 in the process of manufacturing.
Figure 5M:
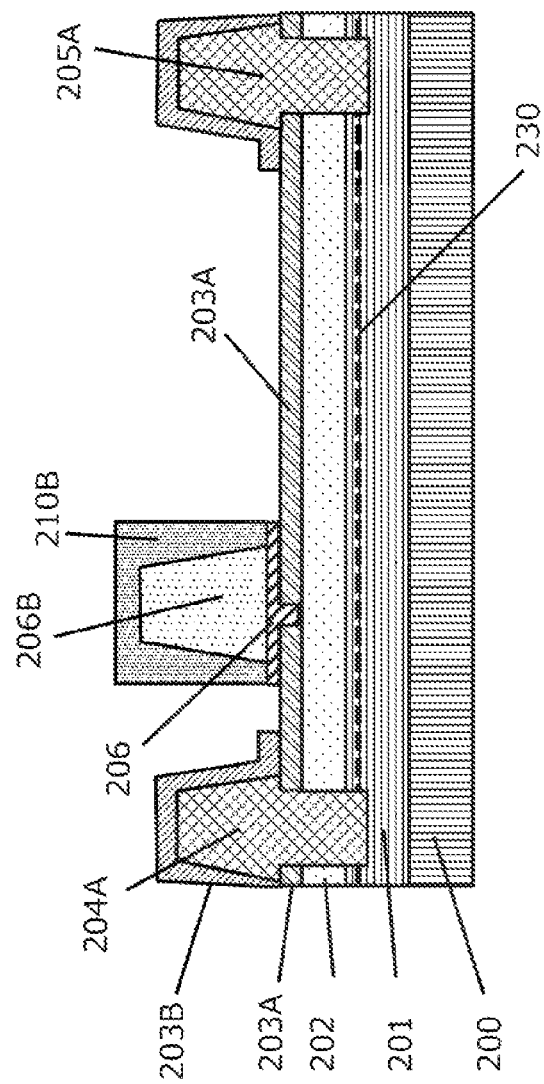
FIG. 5M is a cross-sectional view illustrating a configuration of the semiconductor device for power amplification according to Embodiment 6 in the process of manufacturing.
Figure 5N:
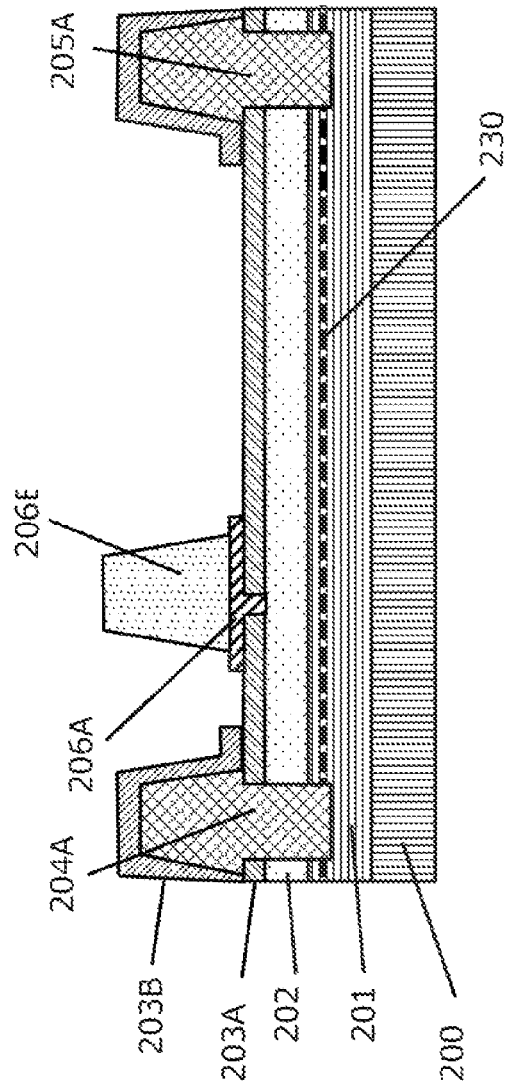
FIG. 5N is a cross-sectional view illustrating a configuration of the semiconductor device for power amplification according to Embodiment 6 in the process of manufacturing.
Figure 50:
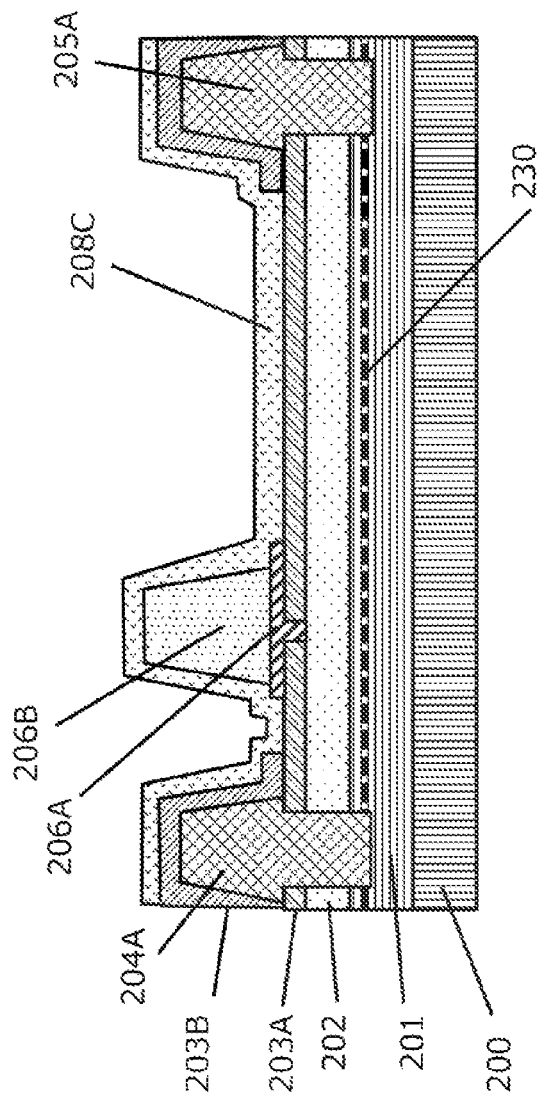
Figure 5P:
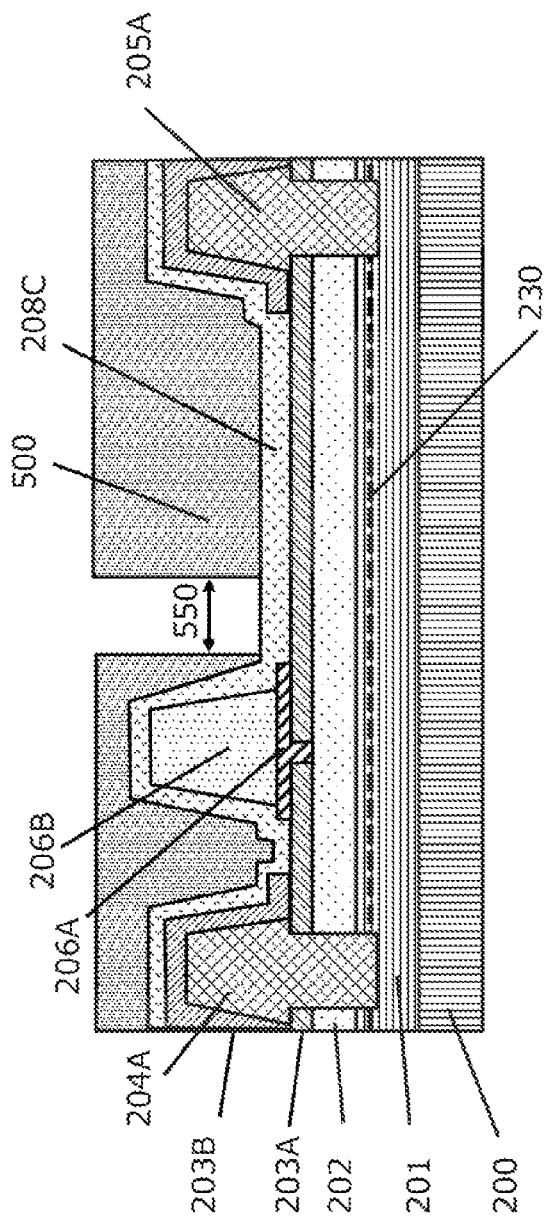
FIG. 5P is a cross-sectional view illustrating a configuration of the semiconductor device for power amplification according to Embodiment 6 in the process of manufacturing.
Figure 5Q:
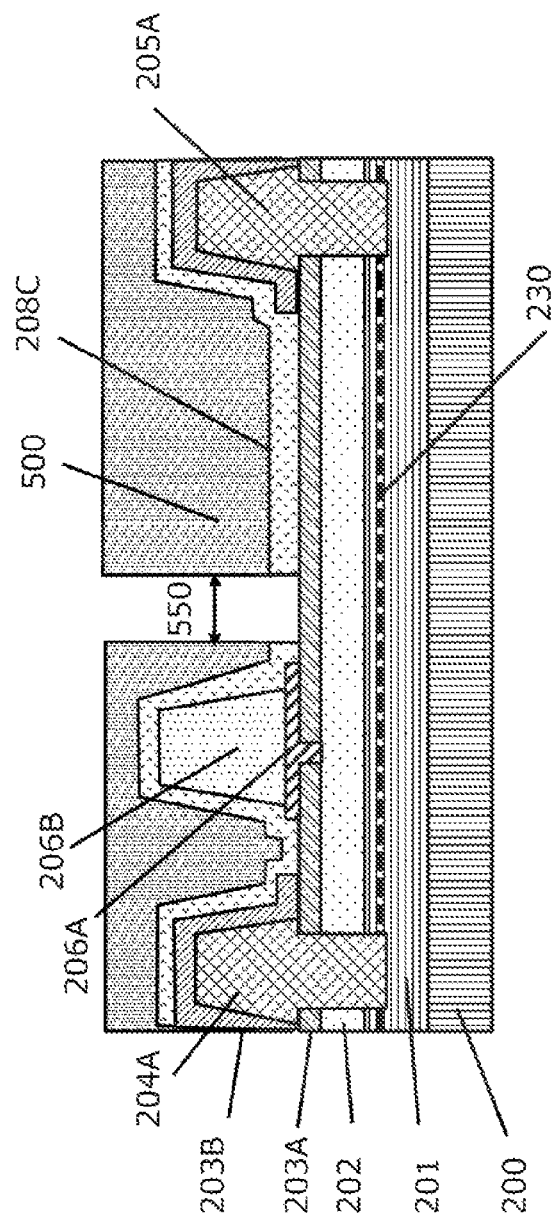
FIG. 5Q is a cross-sectional view illustrating a configuration of the semiconductor device for power amplification according to Embodiment 6 in the process of manufacturing.
Figure 5R:
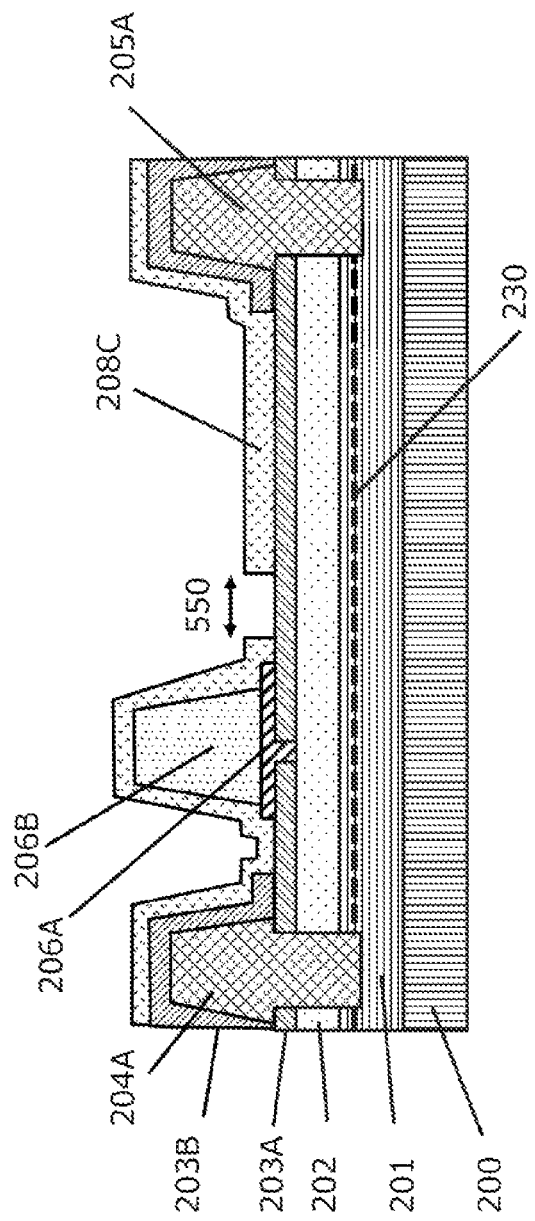
FIG. 5R is a cross-sectional view illustrating a configuration of the semiconductor device for power amplification according to Embodiment 6 in the process of manufacturing.
Figure 5S:
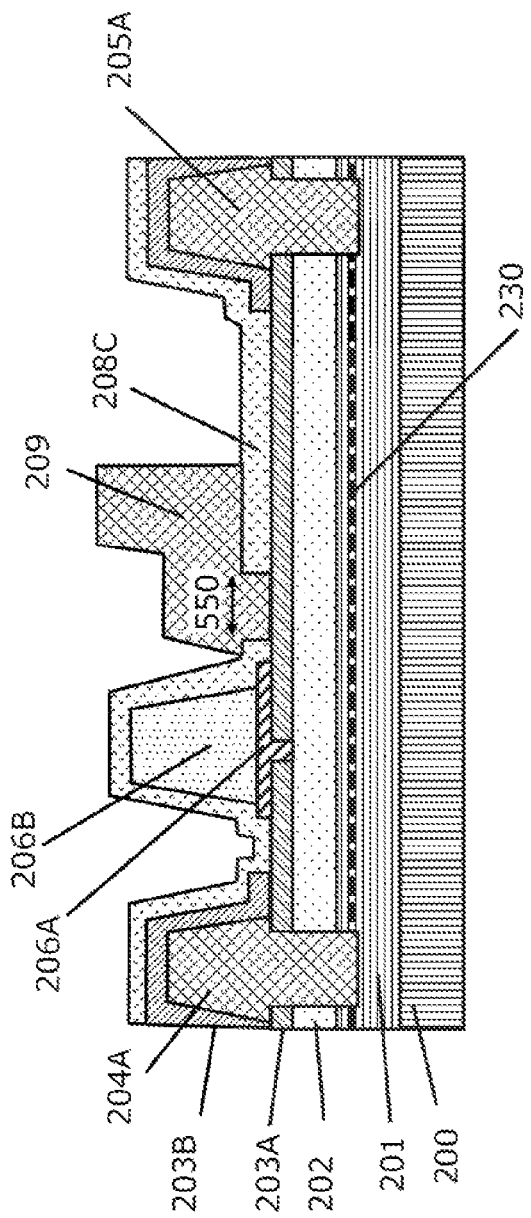
FIG. 5S is a cross-sectional view illustrating a configuration of the semiconductor device for power amplification according to Embodiment 6 in the process of manufacturing.
Figure 5T:
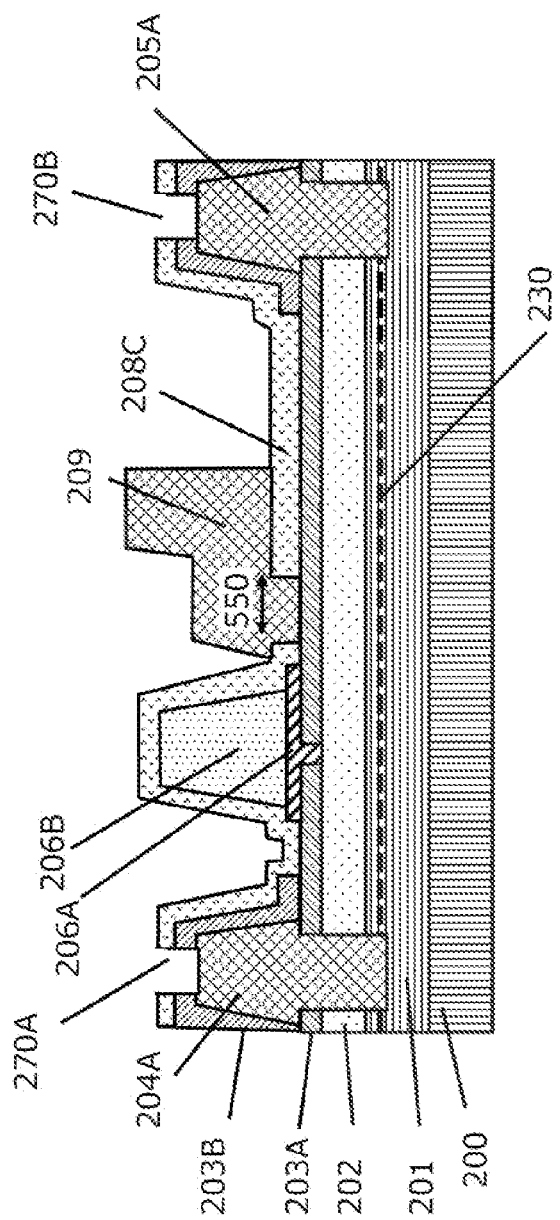
FIG. 5T is a cross-sectional view illustrating a configuration of the semiconductor device for power amplification according to Embodiment 6 in the process of manufacturing.
Figure 5U:
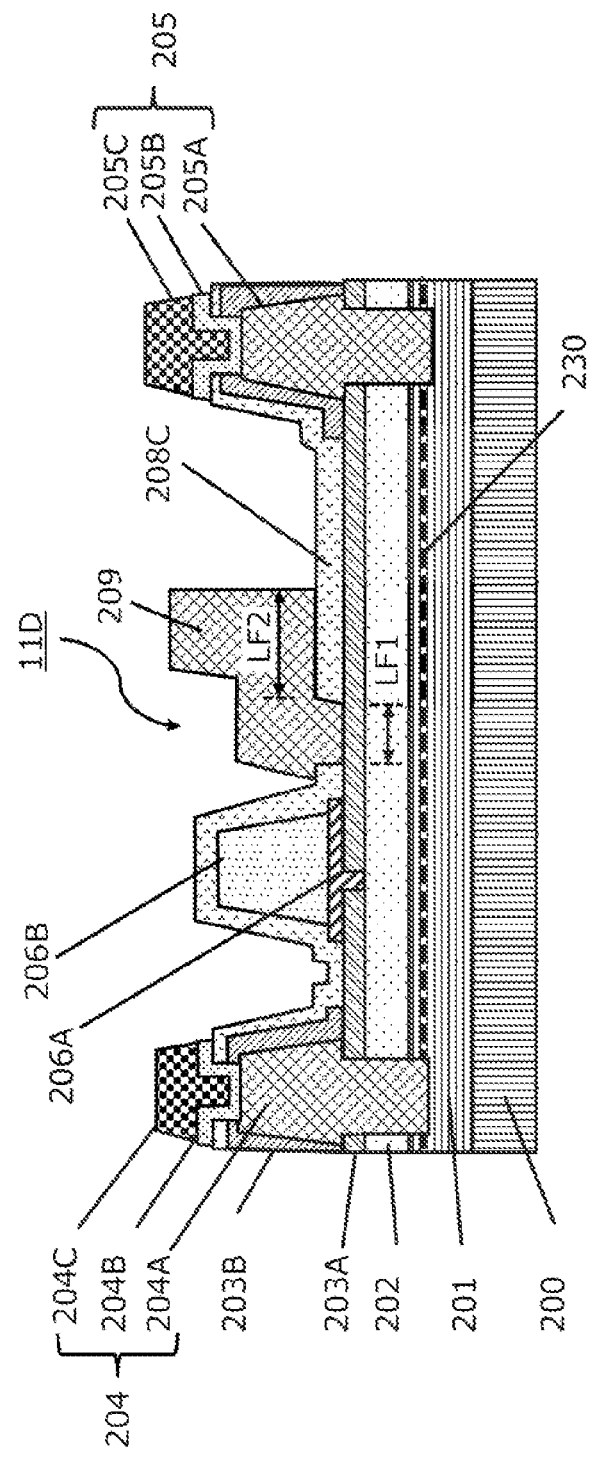
FIG. 5U is a cross-sectional view illustrating a configuration of the semiconductor device for power amplification according to Embodiment 6 in the process of manufacturing.

FIG. 5A to FIG. 5U are each a cross-sectional view illustrating the configuration of semiconductor device for power amplification 11D in the process of manufacturing.

The processes of manufacturing method up to the formation of gate electrode 206 are the same as the processes of the manufacturing method from FIG. 2A to FIG. 2N that have already been described, and thus the description will be omitted.

FIG. 5O illustrates the state in which insulating film 208C that comprises $SiO_2$ is deposited over the entire surface after the formation of gate electrode 206.

FIG. 5P is a diagram illustrating resist mask 500 for photoresist that has been subjected to patterning such that first source field plate opening 550 is opened.

Next, FIG. 5Q illustrates the state in which insulating film 208C is etched using resist mask 500 for photoresist as a mask. For example, since insulating film 208C contains $SiO_2$, when insulating film 208C is etched with buffered hydrofluoric acid, it is possible to selectively perform etching processing with excellent controllability because insulating film 203A located below comprises $Si_3N_4$ with a slow etching rate relative to hydrofluoric acid. FIG. 5R illustrates the state in which insulating film 208C has been subjected to etching and the photoresist has been removed.

Next, FIG. 5S illustrates source field plate 209 formed according to the same method that has been described. In FIG. 5S, a portion of source field plate 209 on the gate side covers insulating film 208C, and this is because the mask for patterning source field plate 209 is larger in size than the contact window illustrated in FIG. 5R.

As already described above, opening the contact in the source-drain portion and performing the interconnection complete semiconductor device for power amplification 11D as illustrated in FIG. 5U Features and Advantageous Effect Insulating film 208C includes opening 550 below the first source field plate, and the first source field plate is in contact with insulating film 203A through opening 550. At this time, the position of the lowermost surface of the first source field plate is at the same height as the position of the lower surface of lower layer 206A that is in contact with insulating film 203A. Therefore, the electric field relaxation effect at the drain-side edge position of lower layer 206A becomes stronger. In addition, the Cgd reduction effect caused by source field plate 209 is also large, and thus it is possible to achieve high gain with low Cgd.

However, as a trade-off, the above-described position of the lowermost surface is in close proximity to 2DEG surface 230, and thus it is likely to increase parasitic capacitance Cds. In view of the above, in such a case, it is sufficient if length LF1 of the lowermost surface of source field plate 209 is reduced, and the weakening field relaxation effect is corrected by increasing length LF2 of the second source field plate that is the upper section of the staircase shape, as described in Embodiment 2.

Even when LF2 is lengthened, the increase in parasitic capacitance Cds with the semiconductor surface is moderate because insulating film 208C is a film having a low dielectric constant, and thus the efficiency feature is not sacrificed.

As described above, the configuration of semiconductor device for power amplification 11D improves the trade-off between Cgd and Cds that has occurred conventionally, and makes it possible to provide a semiconductor device for power amplification with excellent characteristic balance.

Embodiment 7

FIG. 1G is a cross-sectional view of semiconductor device for power amplification 11E illustrating a configuration of a semiconductor device for power amplification according to Embodiment 7.

As illustrated in FIG. 1G, semiconductor device for power amplification 11E includes: substrate 200; semiconductor stack structure 220; source electrode 204; drain electrode 205; gate electrode 206; source field plate 209; insulating film 203A; insulating film 203B; insulating film 208B; and protection film 210. Protection film 210 is an insulating film that protects source field plate 209.

After forming source field plate 209 having a staircase shape by the manufacturing method described in Embodiment 3, it is possible to form semiconductor device for power amplification 11E, by depositing insulating film 210 that comprises $SiO_2$ having low dielectric constant, for example.

Features and Advantageous Effect

The surface of the upper section of source field plate 209 having a staircase shape that is parallel to the Y direction faces the surface of drain electrode 205 that is parallel to the Y direction, and when the drain electrode is in close proximity, parasitic capacitance Cds between the electrodes becomes non-negligible.

Protective film 210 of source field plate 209 is generally comprises $Si_3N_4$. However, since the above-described parasitic capacitance Cds is proportional to the relative dielectric constant, it is more desirable that the dielectric constant of the above-described protective film is lower. In view of the above, Embodiment 7 shows as a feature a configuration in which protective film 210 is replaced with that comprising $SiO_2$ having low dielectric constant from that comprising normal $Si_3N_4$.

In the future, when GaN FETs are applied not only to power amplifiers for base stations at 6 GHz or lower frequencies which is currently the mainstream, but also in the higher frequency millimeter wave band, or in lower voltage applications for mobile terminals, the distance between gate and drain will be reduced and the drain electrode will be in close proximity to source field plate 209.

In the case of the insulating film configuration in which parasitic capacitance Cds does not increase as in Embodiment 7, high efficiency features can be obtained even with the above-described shortened gate-drain distance, and thus it is effective for millimeter wave applications and low-voltage applications for mobile terminals.

Embodiment 8

FIG. 1H is a cross-sectional view of semiconductor device for power amplification 10A illustrating a configuration of a semiconductor device for power amplification according to Embodiment 8.

As illustrated in FIG. 1H, semiconductor device for power amplification 10A includes: substrate 200; semiconductor stack structure 220; source electrode 204; drain electrode 205; gate electrode 206; source field plate 209; insulating film 203A; insulating film 203B; and insulating film 208.

Gate electrode 206 is composed of two layers; that is, lower layer 206A and upper layer 206B that is disposed above the lower layer and has electrical resistivity lower than electrical resistivity of the lower layer. The length of lower layer 206A in the X direction is asymmetrically longer on the drain side. For example, in FIG. 2L that illustrates the manufacturing method according to Embodiment 1, resist mask 210B which is the patterning mask for lower layer 206A illustrated in FIG. 2L can be asymmetrically lengthened on the drain side, by adjusting resist mask 210B so as to be longer on the drain side.

Specific Matters and Advantageous Effect

In this case, gate electrode 206 has a protruding portion that is a portion of lower layer 206A on the drain side. The above-described protruding portion is located below the lowermost surface of source field plate 209. With this shape, the drain-side edge portion of lower layer 206A where the electric field is strongest is completely protected by source field plate 209, and thus the electric field relaxation is effective.

The above-described protruding portion located below source field plate 209 is indicated by length LE from the gate-side edge position of source field plate 209 to the drain edge of lower layer 206A, as illustrated in FIG. 1H. This length LE should not exceed length LF1 that is the length of the lowermost surface of source field plate 209. If length LE exceeds length LF1, the source field plate is effectively shielded when viewed from semiconductor stack structure 220, and becomes ineffective. For example, the above-described length LE that indicates the protruding portion located below source field plate 209 is less than or equal to half of length LF1 of the lowermost surface of source field plate 209.

It should be noted that, as indicated by semiconductor device for power amplification 11F illustrated in FIG. 1I, a protrusion of the above-described lower layer 206A may be provided to semiconductor device for power amplification 11 according to Embodiment 2 illustrated in FIG. 1B, and thereby the same advantageous effect can be yielded.

Supplement

The semiconductor device for power amplification according to one aspect of the present disclosure has been described above based on Embodiment 1 to Embodiment 8. However, the present disclosure is not limited to these embodiments. Other forms in which various modifications apparent to those skilled in the art are applied to the embodiments, or forms structured by combining structural components of different embodiments may be included within the scope of one or more aspects of the present disclosure, unless such changes and modifications depart from the scope of the present disclosure.

Industrial Applicability

The present disclosure is widely applicable to semiconductor devices for power amplifications.

The invention claimed is:

1. A semiconductor device for power amplification comprising:
    a substrate;
    a first nitride semiconductor layer disposed above the substrate;
    a second nitride semiconductor layer disposed above the first nitride semiconductor layer, the second nitride semiconductor layer having a band gap larger than a band gap of the first nitride semiconductor layer;
    a first insulating layer disposed above the second nitride semiconductor layer;
    a source electrode and a drain electrode each disposed above the second nitride semiconductor layer, the source electrode and the drain electrode being spaced apart from each other;
    a gate electrode that is disposed between the source electrode and the drain electrode, and includes a gate field plate above an uppermost surface of the first insulating layer, the gate electrode forming a Schottky junction with an upper surface of the second nitride semiconductor layer through a first opening provided in the first insulating layer;
    a first source field plate disposed above the second nitride semiconductor layer between the gate electrode and the drain electrode, the first source field plate having a same potential as a potential of the source electrode;
    a second source field plate between the first source field plate and the drain electrode, the second source field plate having a same potential as the potential of the source electrode; and
    a metal layer above the second source field plate, the metal layer having electrical resistivity lower than electrical resistivity of the second source field plate, wherein, in a height-position relationship in a first direction that is a direction perpendicular to an upper surface of the substrate,
the first source field plate includes a gate-electrode-facing side surface which includes at least a portion facing a side surface of the gate electrode close to the drain electrode at an identical height position,
the gate-electrode-facing side surface includes a gate-electrode-closest-facing side surface that is a side surface including a closest point at which a distance from the side surface of the gate electrode close to the drain electrode is smallest in a plan view of the substrate, wherein an uppermost-edge position of the gate-electrode-closest-facing side surface is lower than a position of an uppermost surface of the gate electrode,
a position of a lowermost surface of the first source field plate is above an outermost edge position of a lower surface of the gate filed field plate, the outermost edge portion being closest to the drain electrode, the lower surface of the gate field plate being in direct contact with the uppermost surface of the first insulating layer,
in the first direction, an upper surface of the second source field plate is located above an upper surface of the first source field plate,
in the first direction, a lower surface of the second source field plate is located above the lowermost surface of the first source field plate, and
the metal layer is not provided directly above the first source field plate.

2. The semiconductor device for power amplification according to claim 1, wherein
in the first direction, a position of the upper surface of the second source field plate is above the position of the uppermost surface of the gate electrode.

3. The semiconductor device for power amplification according to claim 2, wherein
an elevation angle when a gate-side edge position of an uppermost surface of the second source field plate is viewed from a drain-side edge position of the uppermost surface of the gate electrode is greater than an elevation angle when a gate-side edge position of an uppermost surface of the drain electrode is viewed from the gate-side edge position of the uppermost surface of the second source field plate.

4. The semiconductor device for power amplification according to claim 1, wherein
an upper portion of the first source field plate and a lower portion of the second source field plate are coupled to each other.

5. The semiconductor device for power amplification according to claim 1, wherein
in a second direction from the gate electrode toward the drain electrode, a length of the lower surface of the second source field plate is greater than a length of the lower surface of the first source field plate.

6. The semiconductor device for power amplification according to claim 1, wherein
an elevation angle when a drain-side edge position of the lower surface of the second source field plate is viewed from a drain-side edge position of the lower surface of the first source field plate is smaller than an elevation angle when a gate-side edge position of an uppermost surface of the drain electrode is viewed from an interface position of an interface that is between the first nitride semiconductor layer and the second nitride semiconductor layer and is in closest proximity to the drain-side edge position of the lower surface of the second source field plate.

7. The semiconductor device for power amplification according to claim 1, further comprising:
a second insulating layer between the second source field plate and the first insulating layer, the second insulating layer having a dielectric constant lower than a dielectric constant of the first insulating layer.

8. The semiconductor device for power amplification according to claim 7, further comprising:
an insertion layer at a peripheral edge of the first opening, the insertion layer comprising a same material as a material of the second insulating layer.

9. The semiconductor device for power amplification according to claim 1, further comprising:
a second insulating layer between the first source field plate and the first insulating layer, the second insulating layer having a dielectric constant lower than a dielectric constant of the first insulating layer.

10. The semiconductor device for power amplification according to claim 1, comprising:
a second insulating layer between the second source field plate and the drain electrode, the second insulating layer having a dielectric constant lower than a dielectric constant of the first insulating layer.

11. The semiconductor device for power amplification according to claim 1, wherein
the gate electrode includes a lower layer and an upper layer disposed above the lower layer, the upper layer having electrical resistivity lower than electrical resistivity of the lower layer.

12. The semiconductor device for power amplification according to claim 11, wherein
the gate electrode includes a protruding portion that protrudes in a second direction from the gate electrode toward the drain electrode, and
in a plan view of the substrate, an edge position of the protruding portion on a drain electrode side is closer to the drain electrode than an edge position of the lower surface of the first source field plate on a gate electrode side is.

13. The semiconductor device for power amplification according to claim 12, wherein
in the plan view, the edge position of the protruding portion on the drain electrode side is closer to the gate electrode than an edge position of the lower surface of the first source field plate on the drain electrode side is.

14. The semiconductor device for power amplification according to claim 13, wherein
in the plan view, a length of overlap between the protruding portion and the lower surface of the first source field plate is less than or equal to half of a length of the lower surface of the first source field plate.

15. The semiconductor device for power amplification according to claim 12, wherein
the protruding portion is a portion of the lower layer.

* * * * *